(12) United States Patent
Kim et al.

(10) Patent No.: US 12,486,421 B2
(45) Date of Patent: Dec. 2, 2025

(54) INK COMPOSITION FOR LIGHT-EMITTING DEVICE AND LIGHT EMITTING DEVICE MANUFACTURED USING SAME

(71) Applicant: Samsung Display Co., Ltd., Yongin-si (KR)

(72) Inventors: Heunggyu Kim, Yongin-si (KR); Taeheon Kang, Yongin-si (KR); Sehun Kim, Yongin-si (KR); Hyeran Mun, Yongin-si (KR); Jaekook Ha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 922 days.

(21) Appl. No.: 17/569,701

(22) Filed: Jan. 6, 2022

(65) Prior Publication Data
US 2023/0042868 A1 Feb. 9, 2023

(30) Foreign Application Priority Data

Jun. 25, 2021 (KR) .................. 10-2021-0083118

(51) Int. Cl.
*C09D 11/00* (2014.01)
*C09D 11/033* (2014.01)
*C09D 11/52* (2014.01)
*H10K 85/60* (2023.01)
*H10K 50/16* (2023.01)
*H10K 71/13* (2023.01)

(52) U.S. Cl.
CPC ............ *C09D 11/52* (2013.01); *C09D 11/033* (2013.01); *H10K 85/624* (2023.02); *H10K 50/16* (2023.02); *H10K 71/13* (2023.02)

(58) Field of Classification Search
CPC .... C09D 11/52; C09D 11/033; H10K 85/624; H10K 71/13; H10K 50/16
USPC ....................................................... 252/521.6
See application file for complete search history.

(56) References Cited

U.S. PATENT DOCUMENTS

| | | | |
|---|---|---|---|
| 2019/0386222 A1 | 12/2019 | Tanaka et al. | |
| 2020/0071549 A1 * | 3/2020 | Béalle | C09D 11/033 |
| 2020/0295263 A1 | 9/2020 | Jung et al. | |
| 2020/0373489 A1 | 11/2020 | Jung et al. | |

FOREIGN PATENT DOCUMENTS

| | | | |
|---|---|---|---|
| CN | 111876022 | 11/2020 | |
| KR | 10-1027582 | 4/2011 | |
| KR | 10-2019-0070265 | 6/2019 | |
| KR | 10-2020-0012470 | 2/2020 | |
| WO | WO-2019117516 A1 * | 6/2019 | ........... C09D 11/101 |
| WO | WO-2020022830 A1 * | 1/2020 | ........... C09D 11/322 |

* cited by examiner

Primary Examiner — James E Mcdonough
(74) Attorney, Agent, or Firm — Lerner David LLP

(57) ABSTRACT

An ink composition for a light-emitting device includes a phosphine oxide-based charge transporting organic material, a first solvent represented by Formula 1, a second solvent represented by Formula 2, and a third solvent that is polar aprotic. A light-emitting device includes a layer prepared with the in composition. An electronic apparatus includes the light-emitting device:

$HOR_1(O)_mR_2OH$     [Formula 1]

$R_{11}OR_{12}$.     [Formula 2]

18 Claims, 2 Drawing Sheets

INK COMPOSITION FOR LIGHT-EMITTING DEVICE AND LIGHT EMITTING DEVICE MANUFACTURED USING SAME

CROSS-REFERENCE TO RELATED APPLICATION(S)

This application claims priority to and benefits of Korean Patent Application No. 10-2021-0083118 under 35 U.S.C. § 119, filed on Jun. 25, 2021 in the Korean Intellectual Property Office, the entire contents of which are incorporated herein by reference.

BACKGROUND

1. Technical Field

Embodiments relate to an ink composition for a light-emitting device and a light-emitting device manufactured using the ink composition.

2. Description of the Related Art

Light-emitting devices may have organic thin films stacked between an anode and a cathode. Polymeric materials and small-molecule materials may be used as materials for such organic thin films. In terms of convenience of the synthesis route and high-purity purification, the development of small-molecule organic light-emitting materials is underway.

Among these small-molecule organic light-emitting materials, excellent materials in terms of efficiency, lifespan, and color purity have been reported and are being put into practice.

When forming a thin film using a small-molecule organic light-emitting material, a vacuum deposition method may be used.

A high-performance organic light-emitting device may be obtained by depositing a small-molecule organic light-emitting material on a substrate with satisfactory thermal stability by a vacuum deposition method. However, there is a problem that a high-vacuum facility or a complicated manufacturing process is required.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments include an ink composition having a low viscosity for a light-emitting device applicable to a solution process and a light-emitting device manufactured using the ink composition.

Additional aspects will be set forth in part in the description which follows and, in part, will be apparent from the description, or may be learned by practice of the embodiments of the disclosure.

According to embodiments, an ink composition for a light-emitting device may include a phosphine oxide-based charge transporting organic material, a first solvent represented by Formula 1, a second solvent represented by Formula 2, and a third solvent that may be polar aprotic:

$$HOR_1(O)_mR_2OH \quad \text{[Formula 1]}$$

In Formula 1, $R_1$ and $R_2$ may each independently be a $C_1$-$C_{60}$ alkylene group or a $C_3$-$C_{10}$ cycloalkylene group, and m may be 0 or 1, $$R_{11}OR_{12} \quad \text{[Formula 2]}$$

In Formula 2, $R_{11}$ and $R_{12}$ may each independently be a $C_1$-$C_{60}$ alkyl group or a $C_3$-$C_{10}$ cycloalkyl group.

In an embodiment, the phosphine oxide-based charge transporting organic material may be an electron transporting organic material.

In an embodiment, the third solvent may be a compound comprising a *—SO—*' moiety, a *—SOO—*' moiety, a *—CH=N—*' moiety, a *—COO—*' moiety, or a *—CN moiety, and * and *' each indicate a binding site to an adjacent atom.

In an embodiment, a dP value of a Hansen parameter of a mixed solvent of the first solvent, the second solvent, and the third solvent may be equal to or greater than about 9, and a dH value of a Hansen parameter of the mixed solvent may be equal to or greater than about 9.

In an embodiment, a dP value of a Hansen parameter of the third solvent may be equal to or greater than about 12.

In an embodiment, a viscosity of a mixed solvent of the first solvent, the second solvent, and the third solvent at room temperature may be equal to or less than about 11 centipoise (cP).

In an embodiment, a surface tension of a mixed solvent of the first solvent, the second solvent, and the third solvent may be in a range of about 31 dyn/cm to about 38 dyn/cm.

In an embodiment, a dP value of a Hansen parameter of the phosphine oxide-based charge transporting organic material may be equal to or greater than about 9.

In an embodiment, a dH value of a Hansen parameter of the phosphine oxide-based charge transporting organic material is equal to or greater than about 5.

In an embodiment, the first solvent represented by Formula 1 may include any one of Compounds 1 to 4, which are explained below.

In an embodiment, the second solvent represented by Formula 2 may include any one of Compounds 21 to 24, which are explained below.

In an embodiment, the third solvent may be represented by Formulae 3-1, 3-2, 3-3, or 3-4, which are explained below.

In an embodiment, the third solvent may include $CH_3CN$, and any one of Compounds 31 to 36, which are explained below.

In an embodiment, the phosphine oxide-based charge transporting organic material may include any one of Compounds 101 to 107, which are explained below.

According to embodiments, a light-emitting device may include a first electrode, a second electrode facing the first electrode, and an interlayer between the first electrode and the second electrode. The interlayer may include an emission layer, and a layer prepared by a preparation method using an ink composition. The ink composition may include a phosphine oxide-based charge transporting organic material, a first solvent represented by Formula 1, a second solvent represented by Formula 2, and a third solvent that may be polar aprotic.

In an embodiment, the layer prepared by a preparation method using an ink composition may be an electron transport layer.

In an embodiment, the preparation method may be an inkjet method.

In an embodiment, the emission layer and the layer may contact each other.

According to embodiments, an electronic apparatus may include the light-emitting device.

BRIEF DESCRIPTION OF THE DRAWINGS

The above and other aspects and features of the disclosure will become more apparent by describing in detail embodiments thereof with reference to the accompanying drawings, in which.

DETAILED DESCRIPTION OF THE EMBODIMENTS

Figure 1:
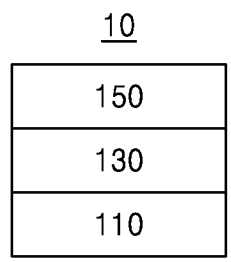
FIG. 1 is a schematic cross-sectional view of a light-emitting device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

In the specification and the claims, the term "at least one of" is intended to include the meaning of "at least one selected from the group of" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, ±10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

When an organic light-emitting device is manufactured by an application method using a small-molecule or polymeric organic light-emitting material, characteristics of the organic light-emitting device may be insufficient, as compared with an organic light-emitting device manufactured by a vacuum deposition method.

Solution-processed organic light-emitting devices developed so far are manufactured by using an application method for a hole injection layer, a hole transport layer, and an emission layer, and by using a vacuum deposition method for an electron transport layer. Thus, research on organic light-emitting devices, to which a true application method is applied, is insufficient.

There is a need for an improvement in inkjet processability by lowering the high viscosity, which is a problem with the existing solvent system, while maintaining the solvent resistance (low solubility) to the emission layer (EML) material of the existing solvent system.

An ink composition for a light-emitting device according to an embodiment may include a phosphine oxide-based charge transport organic material, a first solvent represented by Formula 1, a second solvent represented by Formula 2, and a third solvent that may be polar aprotic:

HOR$_1$(O)$_m$R$_2$OH         [Formula 1]

In Formula 1, R$_1$ and R$_2$ may each independently be a C$_1$-C$_{60}$ alkylene group or a C$_3$-C$_{10}$ cycloalkylene group, and m may be 0 or 1.

R$_{11}$OR$_{12}$         [Formula 2]

In Formula 2, R$_{11}$ and R$_{12}$ may each independently be a C$_1$-C$_{60}$ alkyl group or a C$_3$-C$_{10}$ cycloalkyl group.

The alkyl group and the alkylene group may each independently be linear or branched.

In Formula 1, an OH group may be present at any suitable position of the linear or branched alkyl group or of the linear or branched alkylene group.

The polar aprotic solvent may be a solvent which may be polar and which may not donate H$^+$.

In embodiments, the phosphine oxide-based charge transporting organic material may be an electron transporting organic material.

In an embodiment, in a mixed solvent including the first solvent, the second solvent, and the third solvent, a ratio of the first solvent, the second solvent, and the third solvent may be as follows (based on a total volume of 100):

60≤first solvent≤80
10≤second solvent≤30
10≤third solvent≤20

When a volumetric ratio of each solvent is within these ranges in the total of the mixed solvent including the first solvent, the second solvent, and the third solvent, an ink composition for a light-emitting device may be suitable for a solution process (e.g., application by an inkjet method), and damage of a layer that is under the layer formed by the ink composition for a light-emitting device may be reduced.

In embodiments, a concentration of the ink composition for a light-emitting device may be in a range of about 0.01 percent by weight (wt %) to about 5 wt %, based on a total content of the composition. In embodiments, a concentration of the ink composition for a light-emitting device may be in a range of about 0.1 wt % to about 3 wt %, based on a total content of the composition. When the concentration of the ink composition for a light-emitting device is within any of these ranges, application by an inkjet method may be facilitated, and the layer formed by baking and evaporating the solvent may operate smoothly.

In embodiments, the third solvent may be a compound including a *—SO—*' moiety, a *—SOO—*' moiety, a *—CH=N—*' moiety, a *—COO—*' moiety, or a *—CN moiety, * and *' each indicate a binding site to an adjacent atom.

In embodiments, a dP value of a Hansen parameter of a mixed solvent of the first solvent, the second solvent, and the third solvent may be equal to or greater than about 9, and a dH value of a Hansen parameter of the mixed solvent may be equal to or greater than about 9.

The Hansen parameter refers to a parameter for expecting a degree of formation of a solution by dissolving a material in another material.

Among the Hansen parameters, the dP value is related to the energy from the dipole force between molecules, and the dH value is related to the energy from the hydrogen bonds between molecules.

In embodiments, a dP value of a Hansen parameter of the third solvent may be equal to or greater than about 12.

The third solvent may be polar and may have a dP value of a Hansen parameter equal to or greater than about 12. The third solvent may be aprotic. In case that the third solvent is protic, an unexpected chemical reaction may occur.

In embodiments, a viscosity of a mixed solvent of the first solvent, the second solvent, and the third solvent at room temperature may be equal to or less than about 11 centipoise (cP).

As the viscosity of the solvent of the ink composition for a light-emitting device according to embodiments solvent may be equal to or less than about 11 cp, a probability of occurrence of troubles while jetting during a solution process, e.g., an inkjet process, may be significantly reduced.

In embodiments, a surface tension of a mixed solvent of the first solvent, the second solvent, and the third solvent may be in a range of about 31 dyn/cm to about 38 dyn/cm.

In embodiments, a dP value of a Hansen parameter of the phosphine oxide-based charge transporting organic material may be equal to or greater than about 9.

In embodiments, a dH value of a Hansen parameter of the phosphine oxide-based charge transporting organic material may be equal to or greater than about 5.

When the dP value and the dH value of the Hansen parameter of the mixed solvent of the first solvent, the second solvent, and the third solvent are each within the above ranges, a surface tension of a mixed solvent of the first solvent, the second solvent, and the third solvent is within the above range, and the dP value and the dH value of the Hansen parameter of the phosphine oxide-based charge transporting organic material are each within the above range, the ink composition for a light-emitting device may have a low viscosity suitable for use in a solution process (e.g., application by an inkjet method), and damage of a layer that is under the layer formed by the ink composition for a light-emitting device may be reduced.

In embodiments, the first solvent represented by Formula 1 may include any one of Compounds 1 to 4:

[Compound 1]

[Compound 2]

[Compound 3]

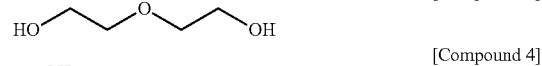

[Compound 4]

In embodiments, the second solvent represented by Formula 2 may include any one of Compounds 21 to 24:

[Compound 21]

[Compound 22]

[Compound 23]

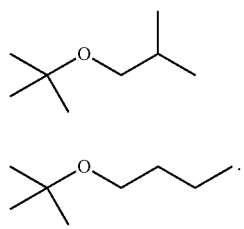

[Compound 24]

In embodiments, the third solvent may be represented by Formulae 3-1, 3-2, 3-3, or 3-4:

[Formula 3-1]

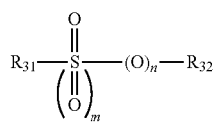

[Formula 3-2]

$R_{33}$—CN

[Formula 3-3]

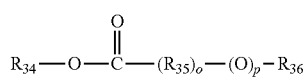

[Formula 3-4]

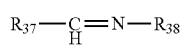

In Formulae 3-1 to 3-4, $R_{31}$ to $R_{38}$ may each independently be a $C_1$-$C_{60}$ alkyl group, a $C_1$-$C_{60}$ alkylene group, a $C_3$-$C_{10}$ cycloalkyl group, or a $C_3$-$C_{10}$ cycloalkylene group, m may be 0 or 1, n, o, and p may each independently be an integer from 0 to 5, and $R_{31}$ and $R_{32}$ may optionally be bound to form a ring, $R_{34}$ and $R_{36}$ may optionally be bound to form a ring, and $R_{37}$ and $R_{38}$ may optionally be bound to form a ring.

In embodiments, the third solvent may include $CH_3CN$, and any one of Compounds 31 to 36:

[Compound 31]

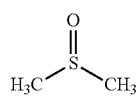

[Compound 32]

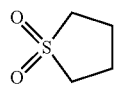

[Compound 33]

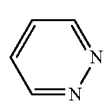

[Compound 34]

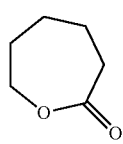

[Compound 35]

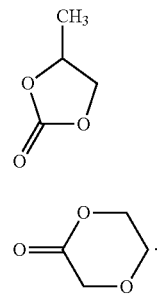

[Compound 36]

In embodiments, a phosphine oxide-based charge transporting organic material refers to an organic material including a P=O group.

In embodiments, the phosphine oxide-based charge transporting organic material may include any one of Compounds 101 to 107:

[Compound 101]

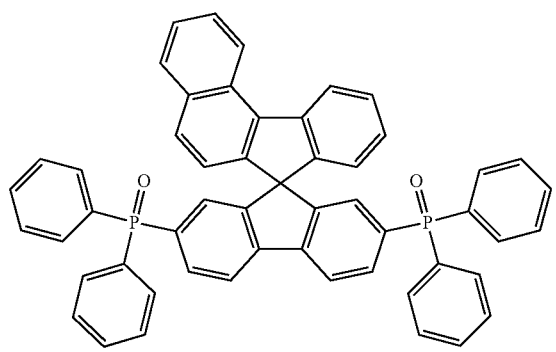

[Compound 102]

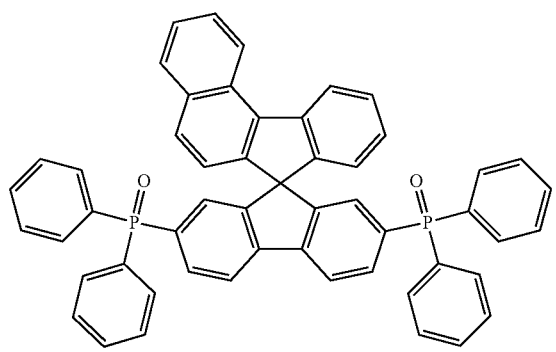

[Compound 103]

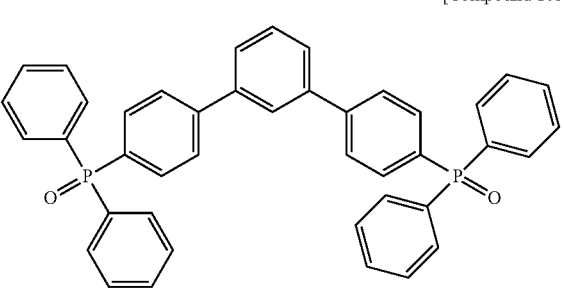

-continued

[Compound 104]

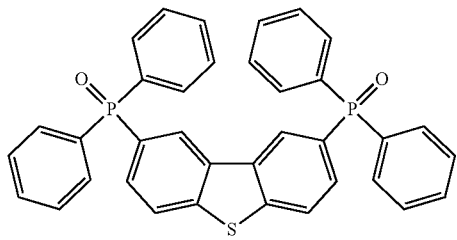

[Compound 105]

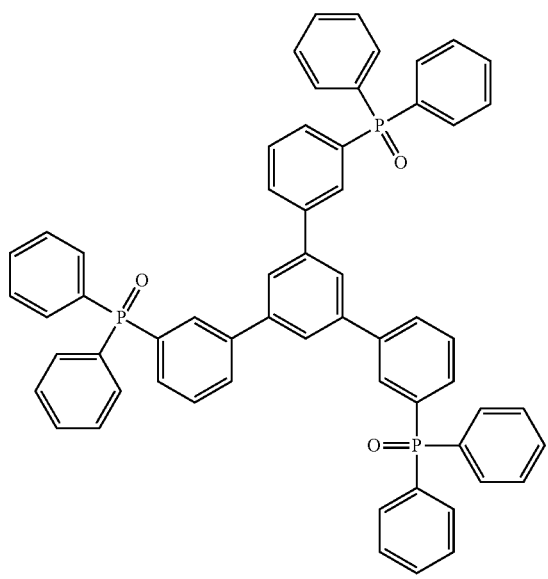

[Compound 106]

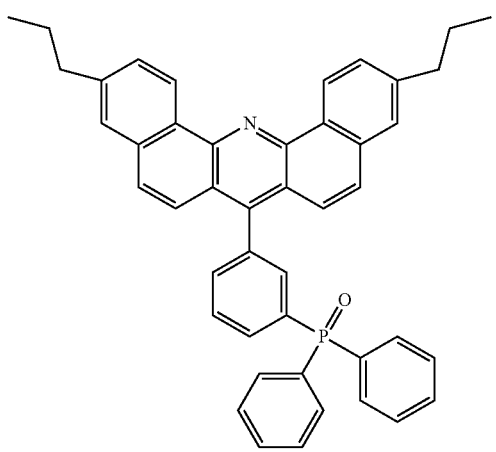

[Compound 107]

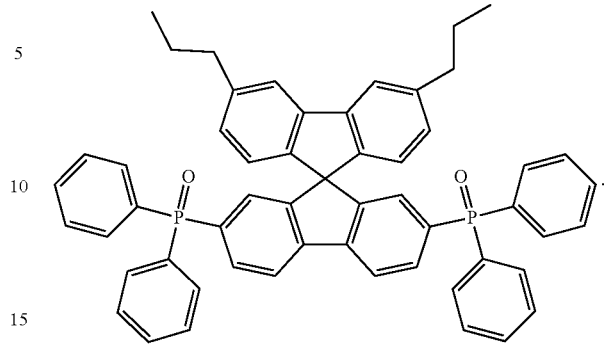

According to an embodiment, a light-emitting device may include a first electrode, a second electrode facing the first electrode, and an interlayer between the first electrode and the second electrode and including an emission layer.

A layer in the interlayer may be prepared by a preparation method using an ink composition for a light-emitting device, wherein the ink composition may include a phosphine oxide-based charge transporting organic material, a first solvent represented by Formula 1, a second solvent represented by Formula 2, and a third solvent that may be polar aprotic.

In an embodiment, the first electrode may be an anode, and the second electrode may be a cathode,
the interlayer may further include a hole transport region between the first electrode and the emission layer, and an electron transport region between the emission layer and the second electrode,
the hole transport region may include a hole injection layer, a hole transport layer, an emission auxiliary layer, an electron blocking layer, or any combination thereof, and
the electron transport region may include a hole blocking layer, an electron transport layer, an electron injection layer, or any combination thereof.

In an embodiment, the layer may be an electron transport layer.

In an embodiment, the preparation method may be an inkjet method.

In an embodiment, the emission layer and the layer may contact each other.

In embodiments, the ink composition for a light-emitting device may further include a metal-containing material. The metal-containing material will be described below.

In embodiments, the interlayer may further include a hole injection layer and a hole transport layer, and the hole injection layer, the hole transport layer, and the emission layer may each be prepared according to a solution process (e.g., spin coating, inkjet printing, or the like). The methods of preparing the hole injection layer, the hole transport layer, and the emission layer according to a solution process is understood in the art, and thus, the detailed descriptions thereof are omitted herein.

According to another embodiment, an electronic apparatus may include the light-emitting device.

In embodiments, the electronic apparatus may further include a thin-film transistor,
wherein the thin-film transistor may include a source electrode and a drain electrode, and the first electrode of the light-emitting device may be electrically connected to at least one of the source electrode and the drain electrode of the thin-film transistor.

In embodiments, the electronic apparatus may further include a color filter, a color-conversion layer, a touchscreen layer, a polarization layer, or any combination thereof.

The term "interlayer" as used herein refers to a single layer and/or all layers located between a first electrode and a second electrode in a light-emitting device.

[Description of FIG. 1]

FIG. 1 is a schematic cross-sectional view of a light-emitting device 10 according to an embodiment. The light-emitting device 10 may include a first electrode 110, an interlayer 130, and a second electrode 150.

Hereinafter, the structure of the light-emitting device 10 according to an embodiment and a method of manufacturing the light-emitting device 10 according to an embodiment will be described in connection with FIG. 1.

[First Electrode 110]

In FIG. 1, a substrate may be further included under the first electrode 110 or above the second electrode 150. The substrate may be a glass substrate or a plastic substrate. The substrate may be a flexible substrate including plastic having excellent heat resistance and durability, for example, polyimide, polyethylene terephthalate (PET), polycarbonate, polyethylene naphthalate, polyarylate (PAR), polyetherimide, or any combination thereof.

The first electrode 110 may be formed by depositing or sputtering, on the substrate, a material for forming the first electrode 110. When the first electrode 110 is an anode, a high work function material that may readily inject holes may be used as a material for a first electrode.

The first electrode 110 may be a reflective electrode, a semi-transmissive electrode, or a transmissive electrode. When the first electrode 110 is a transmissive electrode, a material for forming the first electrode 110 may include indium tin oxide (ITO), indium zinc oxide (IZO), tin oxide ($SnO_2$), zinc oxide (ZnO), or any combination thereof. In embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combination thereof may be used as a material for forming the first electrode 110.

The first electrode 110 may have a structure consisting of a single layer or a structure including two or more layers. In embodiments, the first electrode 110 may have a triple-layered structure of ITO/Ag/ITO.

[Interlayer 130]

The interlayer 130 may be on the first electrode 110. The interlayer 130 may include an emission layer.

The interlayer 130 may further include a hole transport region between the first electrode 110 and the emission layer, and an electron transport region between the emission layer and the second electrode 150.

The interlayer 130 may further include metal-containing compounds such as organometallic compounds, inorganic materials such as quantum dots, and the like, in addition to various organic materials.

The interlayer 130 may include at least two emitting layers sequentially stacked between the first electrode 110 and the second electrode 150, and at least one charge-generation layer between the at least two emitting layers. When the interlayer 130 includes the at least two emitting layers and the at least one charge generation layer, the light-emitting device 10 may be a tandem light-emitting device.

[Hole Transport Region in Interlayer 130]

The hole transport region may have a structure consisting of a layer consisting of a single material, a structure consisting of a layer including different materials, or a multi-layered structure having layers including different materials.

The hole transport region may include a hole injection layer, a hole transport layer, an emission auxiliary layer, an electron blocking layer, or a combination thereof.

For example, the hole transport region may have a multi-layered structure, e.g., a hole injection layer/hole transport layer structure, a hole injection layer/hole transport layer/emission auxiliary layer structure, a hole injection layer/emission auxiliary layer structure, or a hole injection layer/hole transport layer/electron blocking layer structure, wherein layers for each structure may be stacked on the first electrode 110 in its respective stated order. However, the structure of the hole transport region is not limited thereto.

The hole transport region may include a compound represented by Formula 201, a compound represented by Formula 202, or any combination thereof:

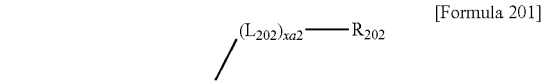

[Formula 201]

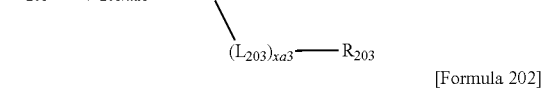

[Formula 202]

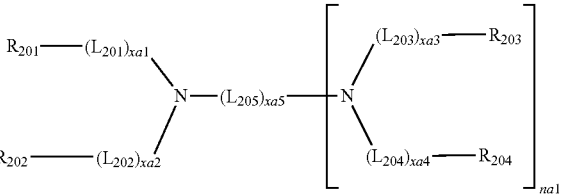

In Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, wherein * and *' each represent a binding site to a neighboring atom, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be bound to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group (e.g., a carbazole group or the like) unsubstituted or substituted with at least one $R_{10a}$ (e.g., Compound HT16 described herein), $R_{203}$ and $R_{204}$ may optionally be bound to each other via a single bond, a $C_1$-$C_5$ alkylene group unsubstituted or substituted with at least one $R_{10a}$ or a $C_2$-$C_5$ alkenylene group unsubstituted or substituted with at least one $R_{10a}$ to form a $C_8$-$C_{60}$ polycyclic group unsubstituted or substituted with at least one $R_{10a}$, and na1 may be an integer from 1 to 4.

In embodiments, Formulae 201 and 202 may each include at least one of groups represented by Formulae CY201 to CY217:

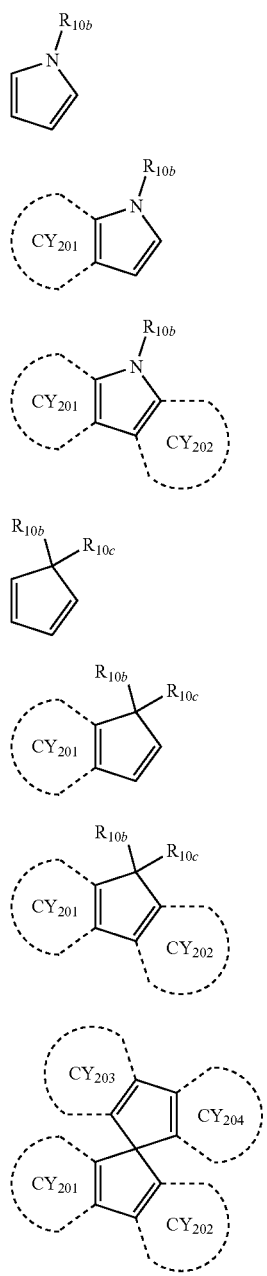
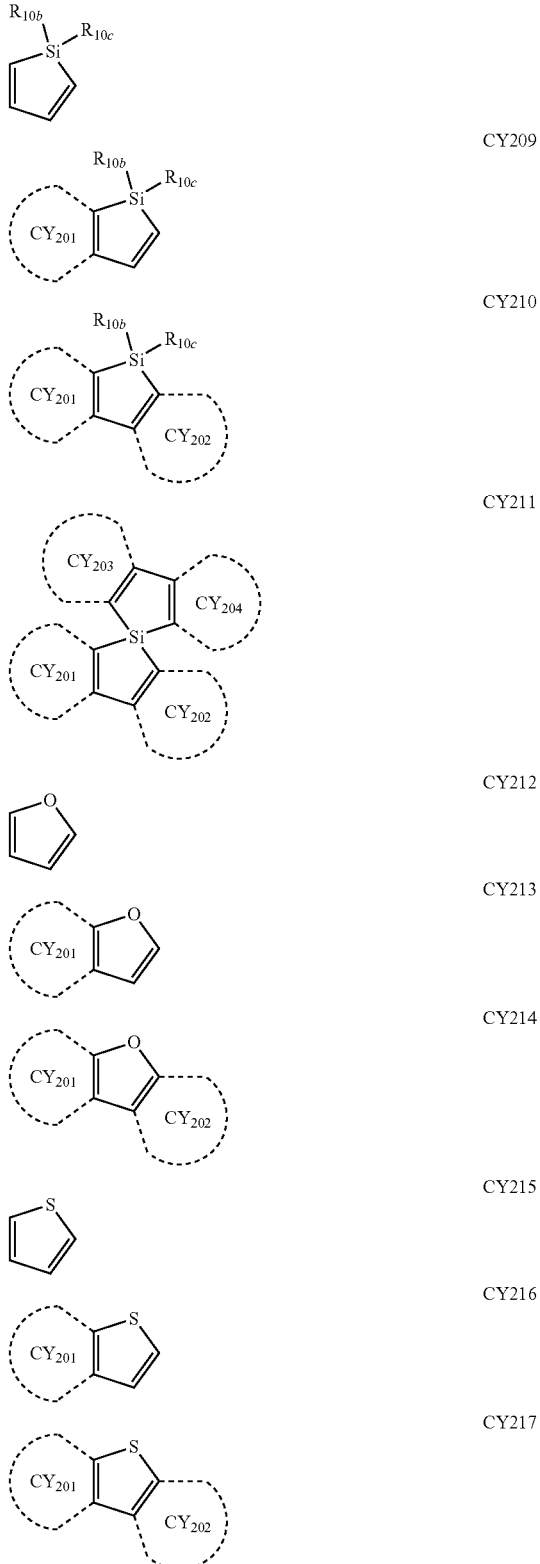

In Formulae CY201 to CY217, $R_{10b}$ and $R_{10c}$ may each independently be the same as described in connection with $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In an embodiment, in Formulae CY201 to CY217, ring $CY_{201}$ to ring $CY_{204}$ may each independently be a benzene group, a naphthalene group, a phenanthrene group, or an anthracene group.

In embodiments, Formulae 201 and 202 may each include at least one of groups represented by Formulae CY201 to CY203.

In embodiments, Formula 201 may include at least one of groups represented by Formulae CY201 to CY203 and at least one of groups represented by Formulae CY204 to CY217.

In embodiments, in Formula 201, xa1 may be 1, $R_{201}$ may be represented by one of Formulae CY201 to CY203, xa2 may be 0, and $R_{202}$ may be represented by one of Formulae CY204 to CY207.

In embodiments, Formulae 201 and 202 may each not include groups represented by Formulae CY201 to CY203.

In embodiments, Formulae 201 and 202 may each not include groups represented by Formulae CY201 to CY203, and may each include at least one of groups represented by Formulae CY204 to CY217.

In embodiments, Formulae 201 and 202 may each not include groups represented by Formulae CY201 to CY217.

In embodiments, the hole transport region may include one of Compounds HT1 to HT46 and m-MTDATA, TDATA, 2-TNATA, NPB (NPD), β-NPB, TPD, spiro-TPD, spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphorsulfonic acid (PANI/CSA), polyaniline/poly(4-styrenesulfonate) (PANI/PSS), or any combination thereof:

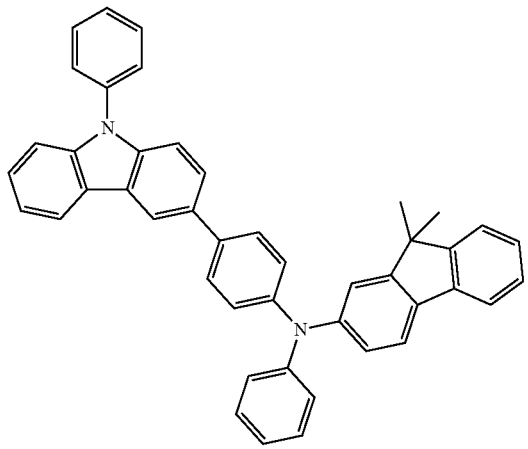

HT1

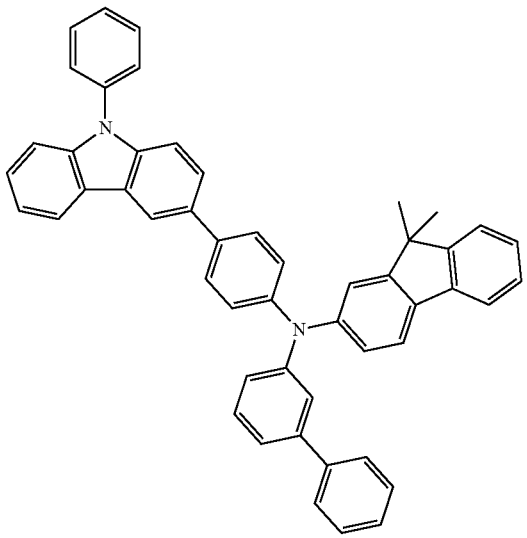

HT2

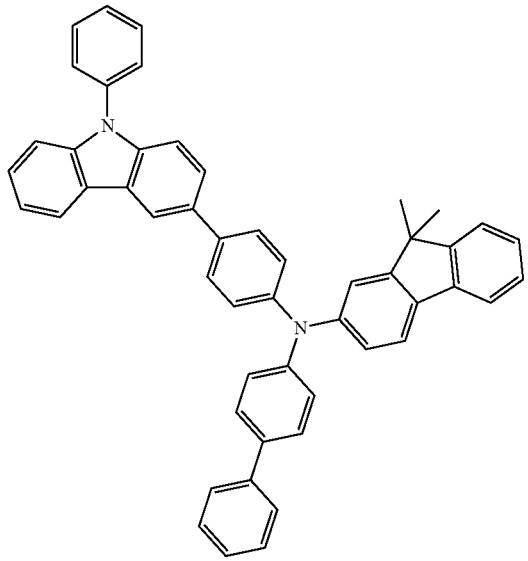

HT3

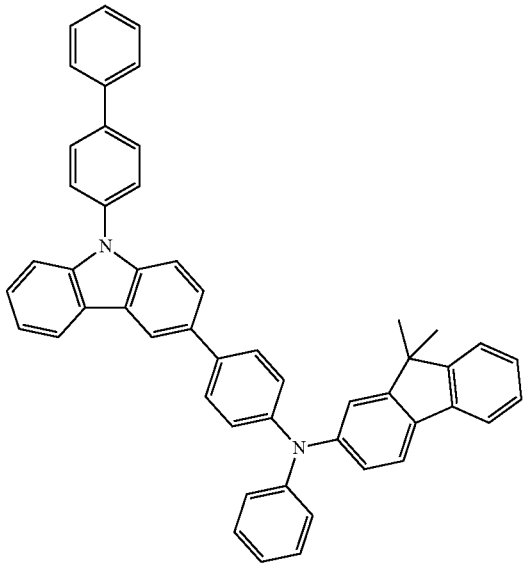

HT4

-continued
HT5
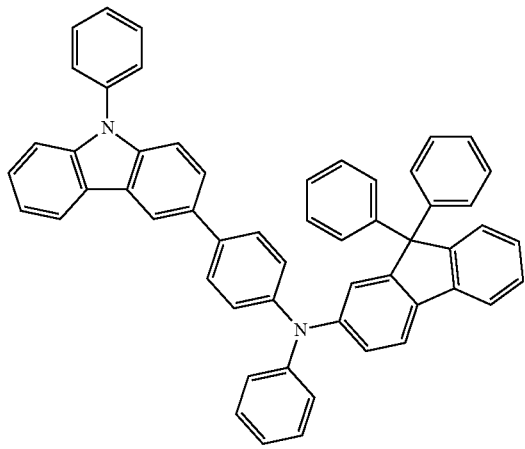
HT6
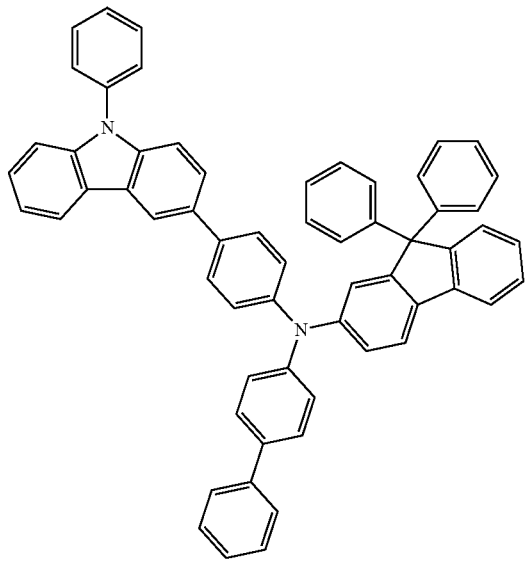
HT7
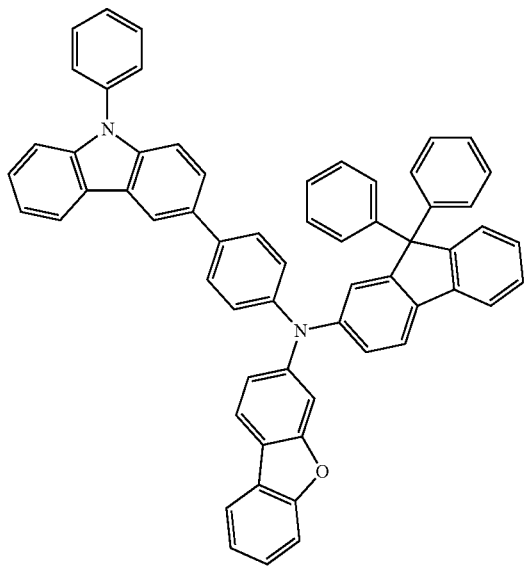
HT8
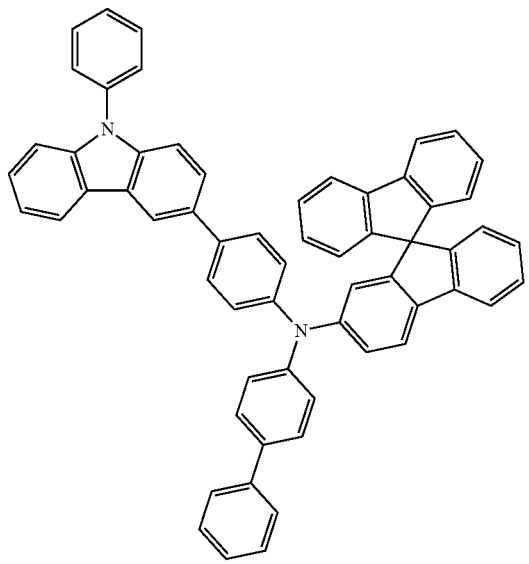

-continued
HT9
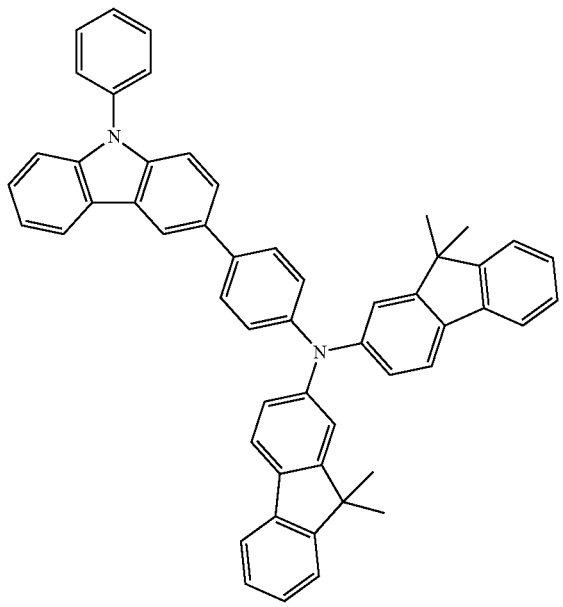
HT10
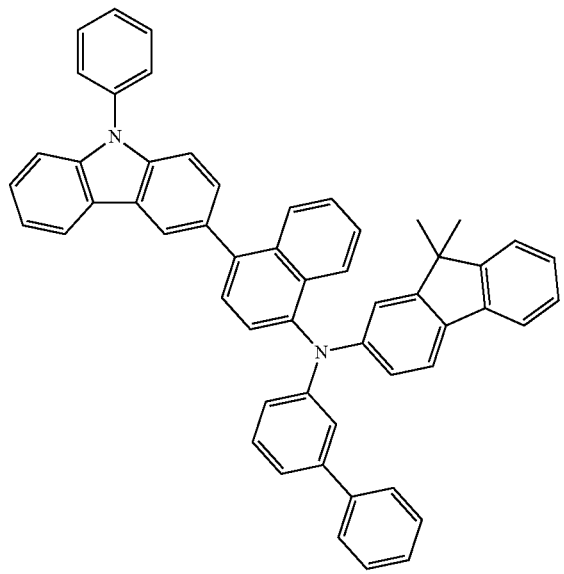
HT11
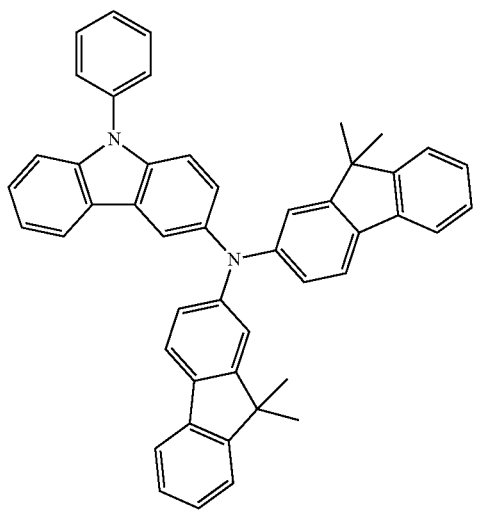
H12
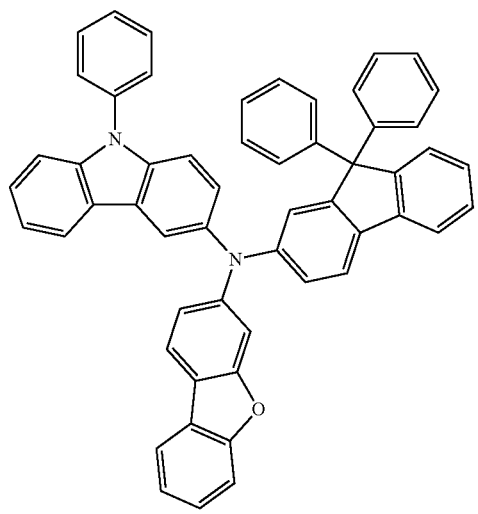

-continued
HT13
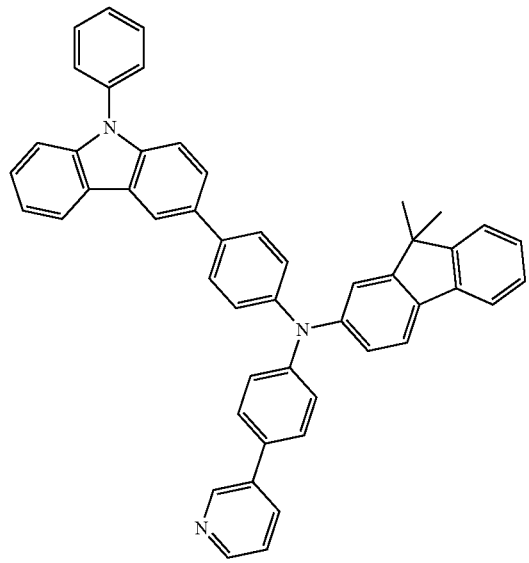
HT14
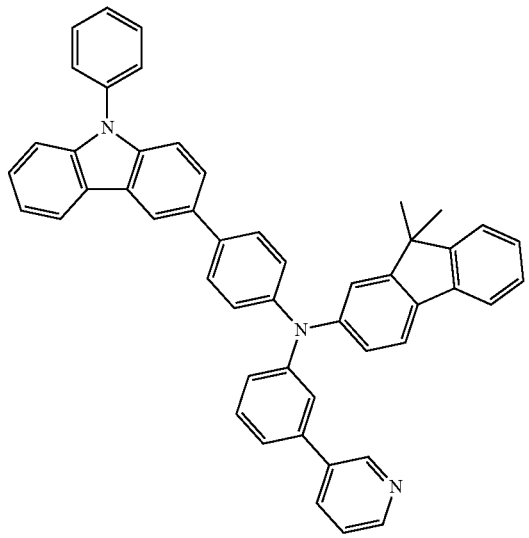
HT15
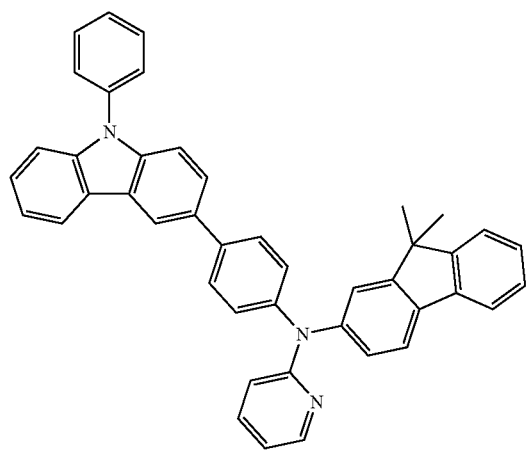
HT16
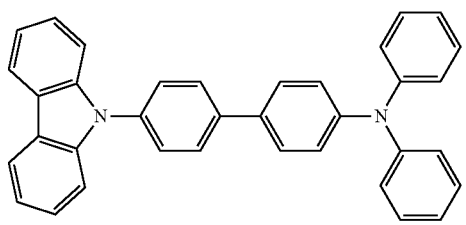
HT17
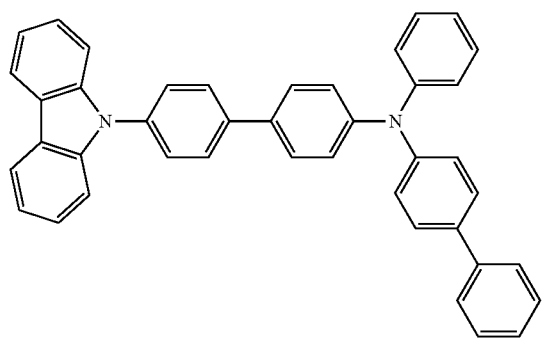
HT18
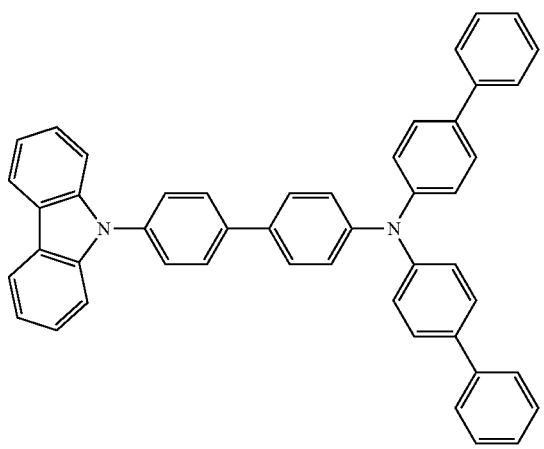

-continued
HT19
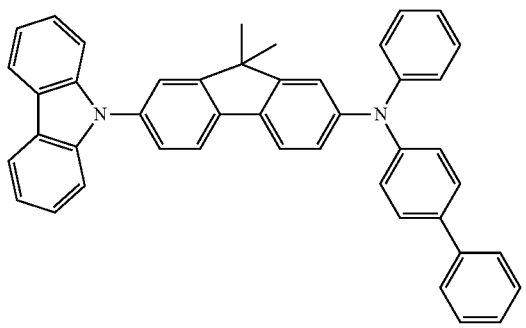
HT20
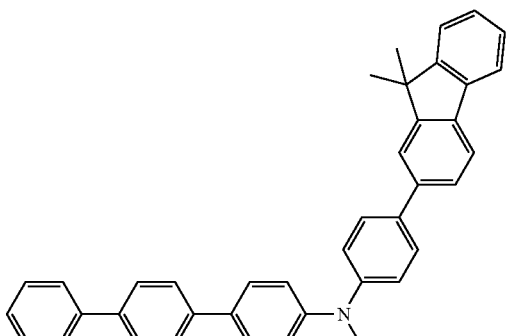
HT21
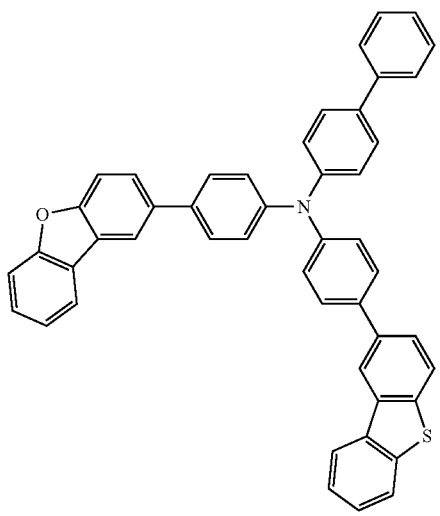
HT22
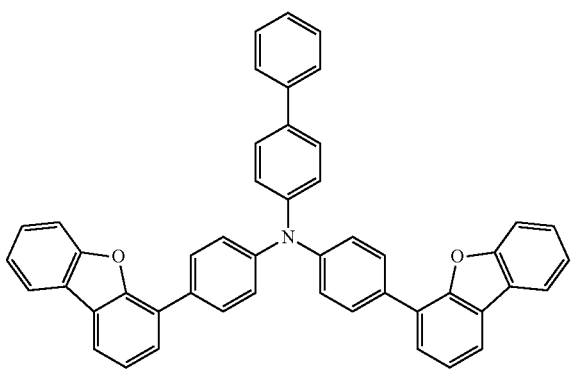
HT23
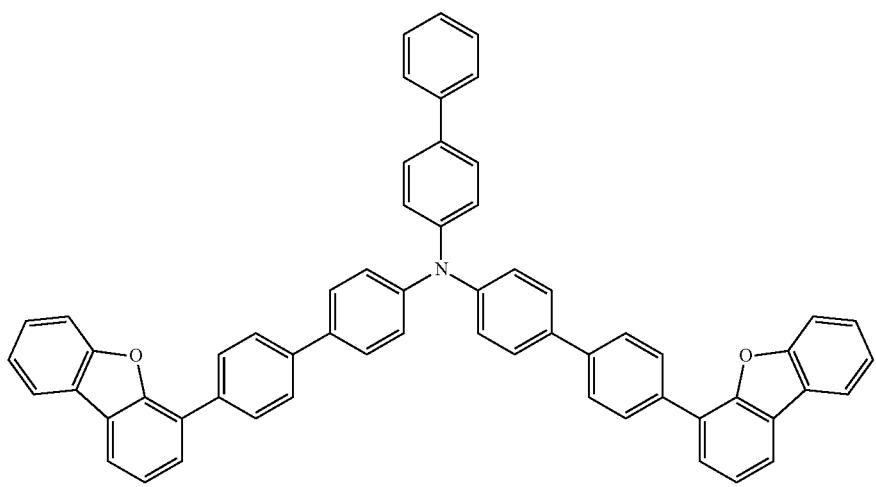

-continued
HT24
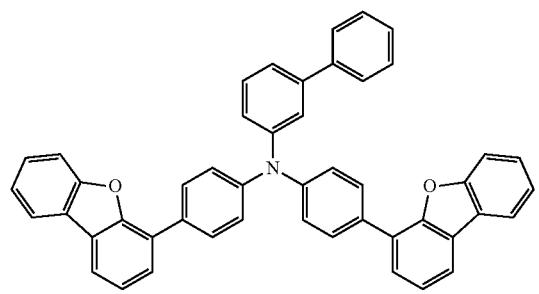
HT25
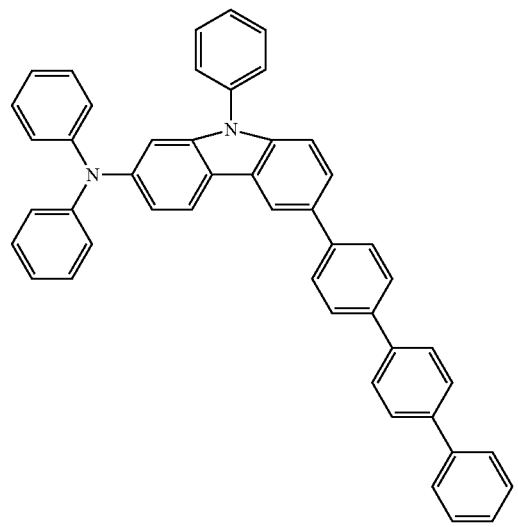
HT26
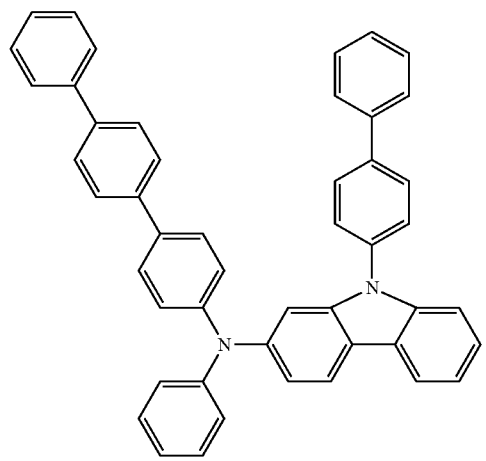
HT27
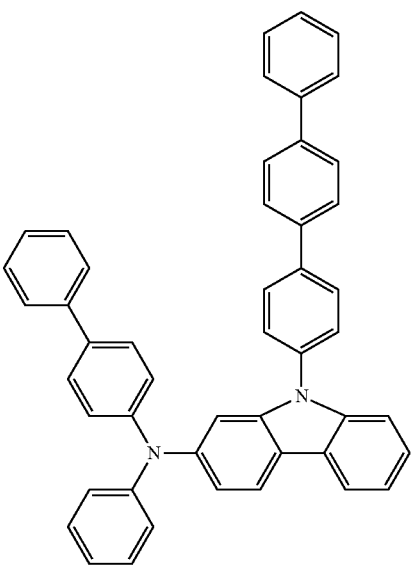
HT28
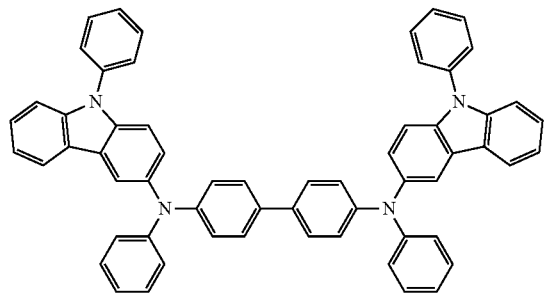
HT29
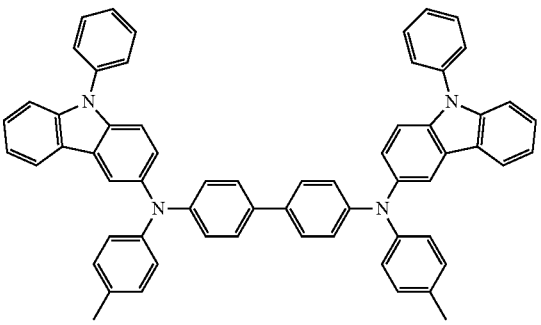

-continued
HT30
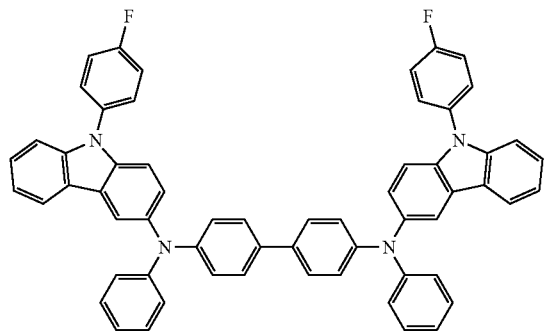
HT31
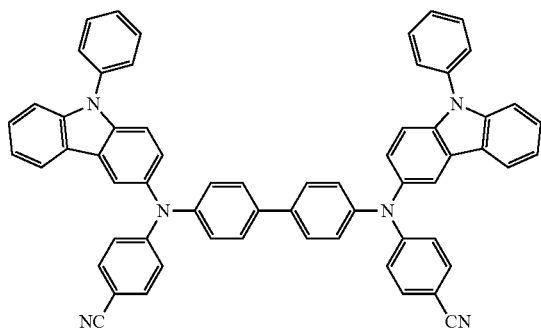
HT32
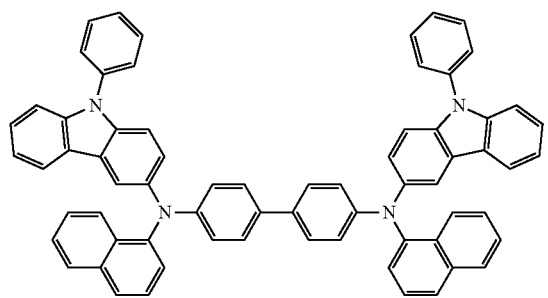
HT33
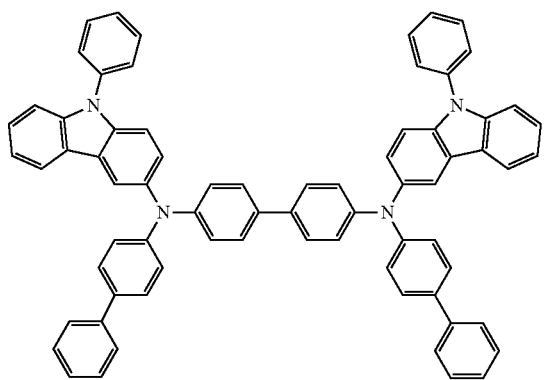
HT34
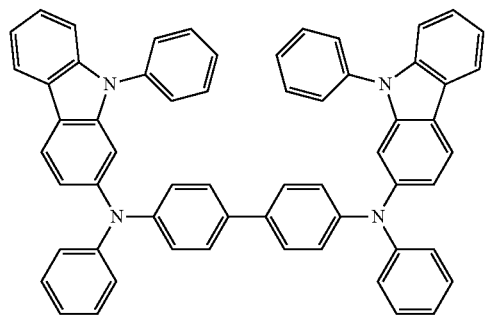
HT35
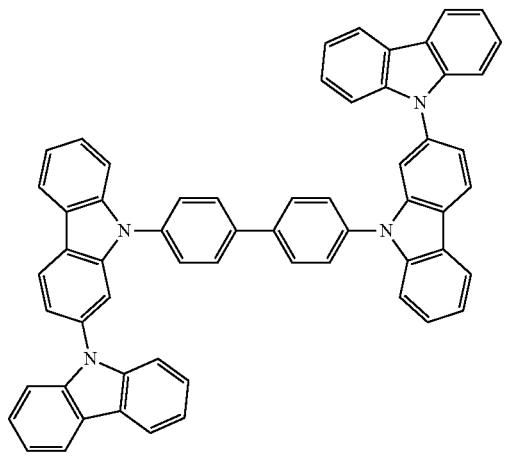
HT36
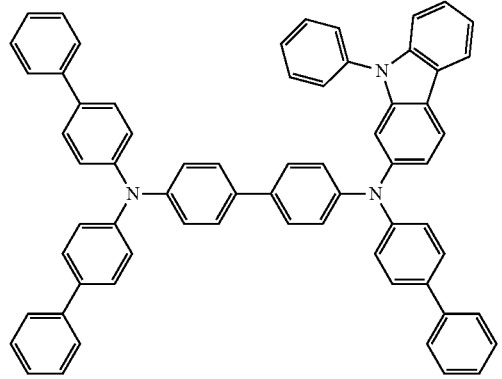
HT37
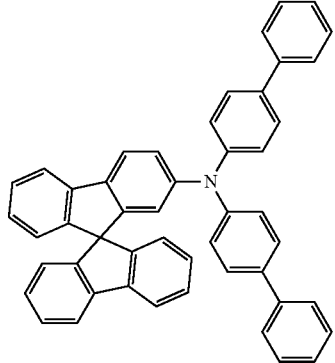

-continued
HT38
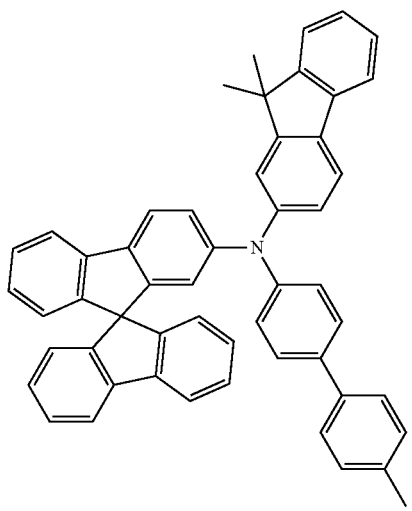
HT39
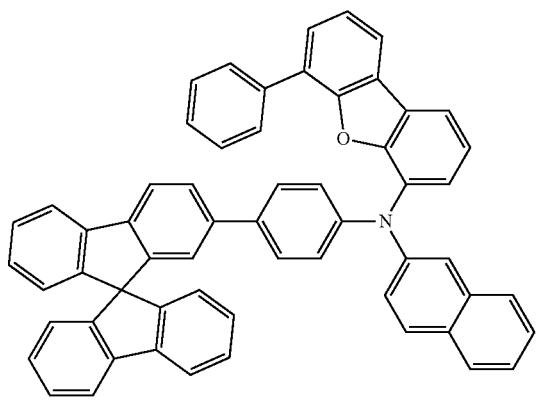
HT40
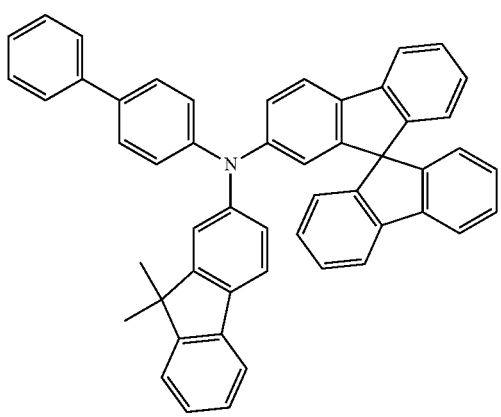
HT41
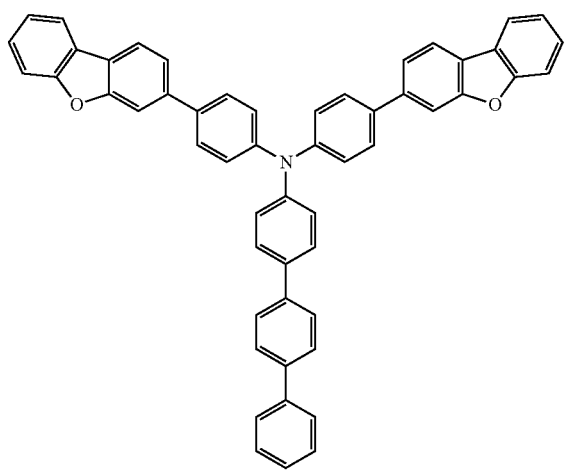
HT42
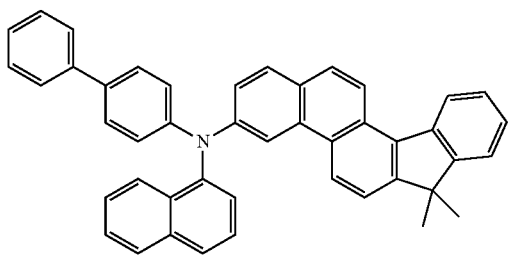
HT43
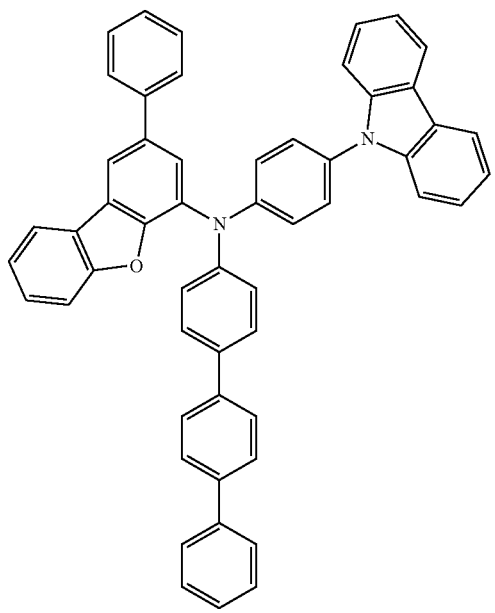

HT44
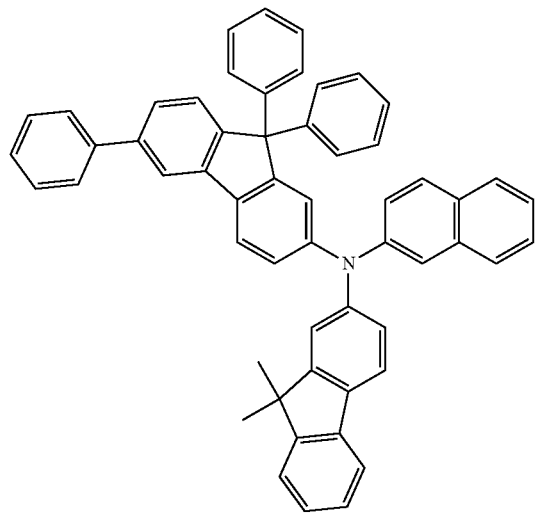
HT45
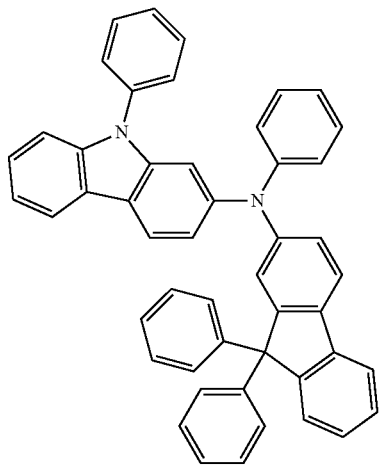
HT46
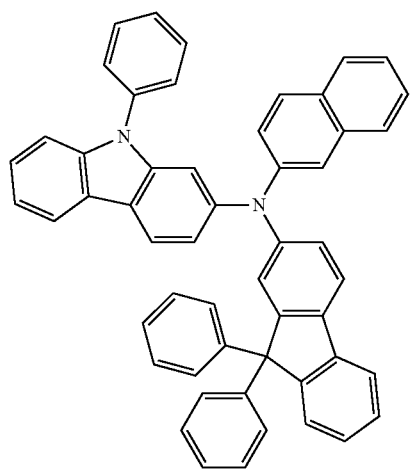
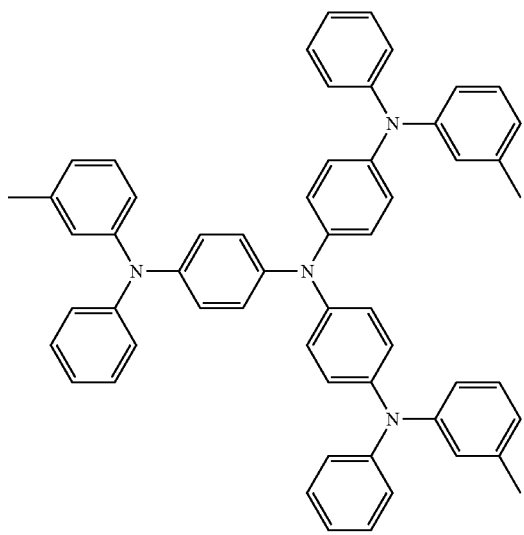
m-MTDATA

-continued
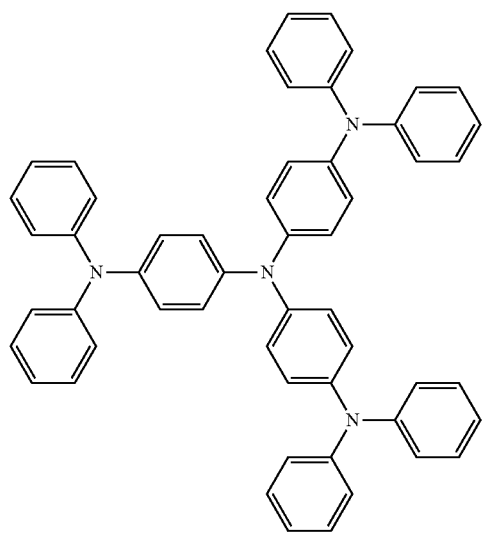
TDATA
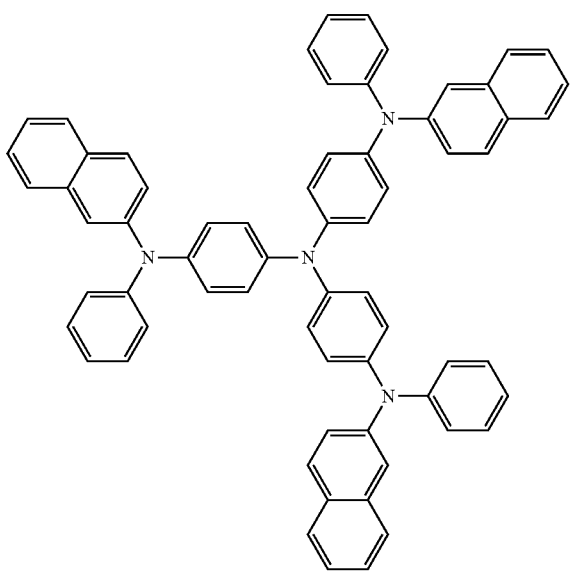
2-TNATA
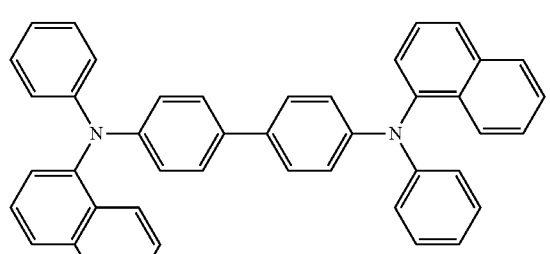
NPB
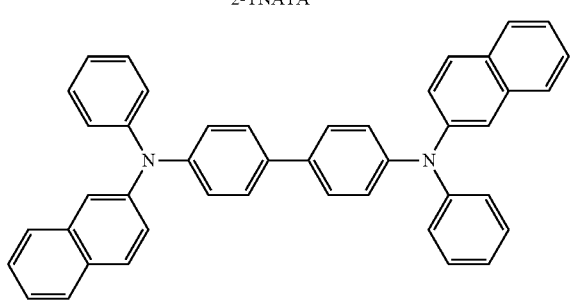
β-NPB
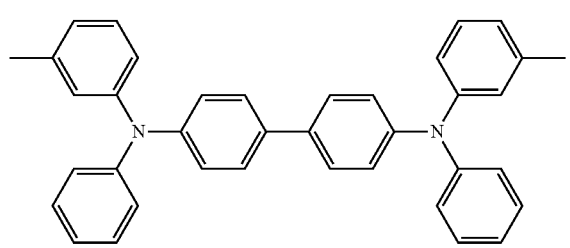
TPD
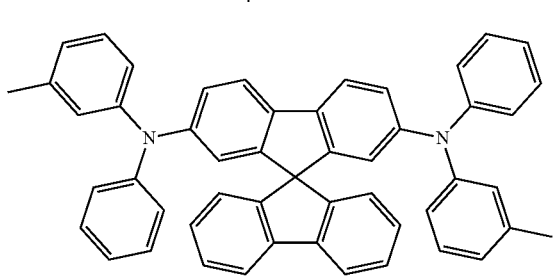
Spiro-TPD
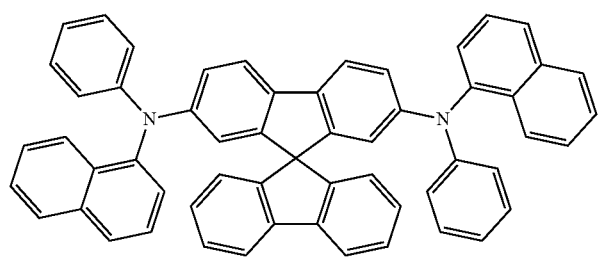
Spiro-TPD
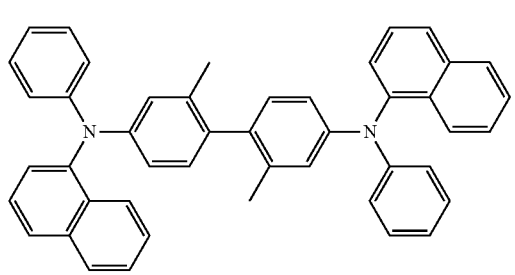
methylated NPB

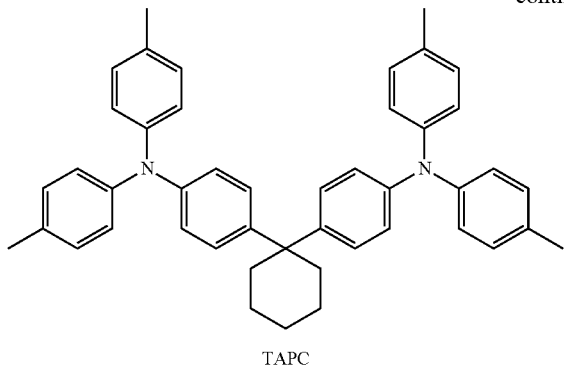

TAPC

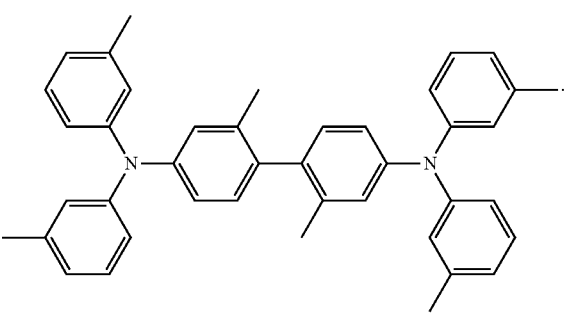

HMTPD

A thickness of the hole transport region may be in a range of about 50 Angstroms (Å) to about 10,000 Å. For example, the thickness of the hole transport region may be in a range of about 100 Å to about 4,000 Å. When the hole transport region includes a hole injection layer, a hole transport layer, or any combination thereof, a thickness of the hole injection layer may be in a range of about 100 Å to about 9,000 Å, and a thickness of the hole transport layer may be in a range of about 50 Å to about 2,000 Å. For example, the thickness of the hole injection layer may be in a range of about 100 Å to about 1,000 Å. For example, the thickness of the hole transport layer may be in a range of about 100 Å to about 1,500 Å. When the thicknesses of the hole transport region, the hole injection layer, and the hole transport layer are within any of these ranges, excellent hole transport characteristics may be obtained without a substantial increase in driving voltage.

The emission auxiliary layer may increase light emission efficiency by compensating for an optical resonance distance according to a wavelength of light emitted by an emission layer. The electron blocking layer may prevent leakage of electrons to a hole transport region from the emission layer. Materials that may be included in the hole transport region may also be included in an emission auxiliary layer and in an electron blocking layer.

[p-Dopant]

The hole transport region may include a charge generating material, as well as the aforementioned materials, to improve conductive properties of the hole transport region. The charge generating material may be substantially homogeneously or non-homogeneously dispersed (for example, as a single layer consisting of charge generating material) in the hole transport region.

The charge generating material may include, for example, a p-dopant.

In embodiments, a lowest unoccupied molecular orbital (LUMO) energy level of the p-dopant may be equal to or less than about −3.5 eV.

In embodiments, the p-dopant may include a quinone derivative, a compound containing a cyano group, a compound containing element EL1 and element EL2, or any combination thereof.

Examples of the quinone derivative may include TCNQ, F4-TCNQ, and the like.

Examples of the compound containing a cyano group include HAT-CN, a compound represented by Formula 221, and the like:

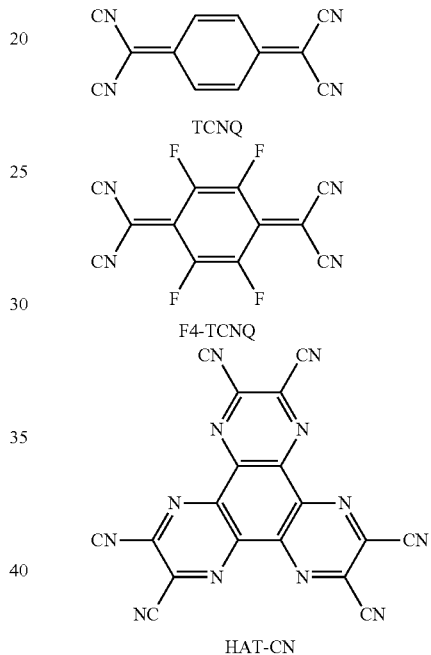

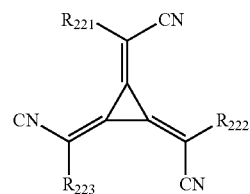

[Formula 221]

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, substituted with a cyano group; —F; —Cl; —Br; —I; a $C_1$-$C_{20}$ alkyl group substituted with a cyano group, —F, —Cl, —Br, —I, or any combination thereof; or any combination thereof.

In the compound containing element EL1 and element EL2, element EL1 may be a metal, a metalloid, or a combination thereof, and element EL2 may be a non-metal, a metalloid, or a combination thereof.

Examples of the metal may include an alkali metal (e.g., lithium (Li), sodium (Na), potassium (K), rubidium (Rb), cesium (Cs), or the like); an alkaline earth metal (e.g., beryllium (Be), magnesium (Mg), calcium (Ca), strontium (Sr), barium (Ba), or the like); a transition metal (e.g., titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), or the like); a post-transition metal (e.g., zinc (Zn), indium (In), tin (Sn), or the like); a lanthanide metal (e.g., lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), or the like); and the like.

Examples of the metalloid may include silicon (Si), antimony (Sb), tellurium (Te), and the like.

Examples of the non-metal may include oxygen (O), a halogen (e.g., F, Cl, Br, I, and the like), and the like.

For example, the compound containing element EL1 and element EL2 may include a metal oxide, a metal halide (e.g., a metal fluoride, a metal chloride, a metal bromide, a metal iodide, and the like), a metalloid halide (e.g., a metalloid fluoride, a metalloid chloride, a metalloid bromide, a metalloid iodide, and the like), a metal telluride, or any combination thereof.

Examples of the metal oxide may include a tungsten oxide (e.g., WO, $W_2O_3$, $WO_2$, $WO_3$, or $W_2O_5$), a vanadium oxide (e.g., VO, $V_2O_3$, $VO_2$, or $V_2O_5$), a molybdenum oxide (MoO, $Mo_2O_3$, $MoO_2$, $MoO_3$, or $Mo_2O_5$), and a rhenium oxide (e.g., $ReO_3$).

Examples of the metal halide may include an alkali metal halide, an alkaline earth metal halide, a transition metal halide, a post-transition metal halide, a lanthanide metal halide, and the like.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, CsI, and the like.

Examples of the alkaline earth metal halide may include $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide may include a titanium halide (e.g., $TiF_4$, $TiCl_4$, $TiBr_4$, or $TiI_4$), a zirconium halide (e.g., $ZrF_4$, $ZrCl_4$, $ZrBr_4$, or $ZrI_4$), a hafnium halide (e.g., $HfF_4$, $HfCl_4$, $HfBr_4$, or $HfI_4$), a vanadium halide (e.g., $VF_3$, $VCl_3$, $VBr_3$, or $VI_3$), a niobium halide (e.g., $NbF_3$, $NbCl_3$, $NbBr_3$, or $NbI_3$), a tantalum halide (e.g., $TaF_3$, $TaCl_3$, $TaBr_3$, or $TaI_3$), a chromium halide (e.g., $CrF_3$, $CrCl_3$, $CrBr_3$, or $CrI_3$), a molybdenum halide (e.g., $MoF_3$, $MoCl_3$, $MoBr_3$, or $MoI_3$), a tungsten halide (e.g., $WF_3$, $WCl_3$, $WBr_3$, or $WI_3$), a manganese halide (e.g., $MnF_2$, $MnCl_2$, $MnBr_2$, or $MnI_2$), a technetium halide (e.g., $TcF_2$, $TcCl_2$, $TcBr_2$, or $TcI_2$), a rhenium halide (e.g., $ReF_2$, $ReCl_2$, $ReBr_2$, or $ReI_2$), an iron halide (e.g., $FeF_2$, $FeCl_2$, $FeBr_2$, or $FeI_2$), a ruthenium halide (e.g., $RuF_2$, $RuCl_2$, $RuBr_2$, or $RuI_2$), an osmium halide (e.g., $OsF_2$, $OsCl_2$, $OsBr_2$, or $OsI_2$), a cobalt halide (e.g., $CoF_2$, $CoCl_2$, $CoBr_2$, or $CoI_2$), a rhodium halide (e.g., $RhF_2$, $RhCl_2$, $RhBr_2$, or $RhI_2$), an iridium halide (e.g., $IrF_2$, $IrCl_2$, $IrBr_2$, or $IrI_2$), a nickel halide (e.g., $NiF_2$, $NiCl_2$, $NiBr_2$, or $NiI_2$), a palladium halide (e.g., $PdF_2$, $PdCl_2$, $PdBr_2$, or $PdI_2$), a platinum halide (e.g., $PtF_2$, $PtCl_2$, $PtBr_2$, or $PtI_2$), a copper halide (e.g., CuF, CuCl, CuBr, or CuI), a silver halide (e.g., AgF, AgCl, AgBr, or AgI), and a gold halide (e.g., AuF, AuCl, AuBr, or AuI).

Examples of the post-transition metal halide may include a zinc halide (e.g., $ZnF_2$, $ZnCl_2$, $ZnBr_2$, or $ZnI_2$), an indium halide (e.g., $InI_3$), and a tin halide (e.g., $SnI_2$).

Examples of the lanthanide metal halide may include YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, YbI, $YbI_2$, $YbI_3$, and $SmI_3$.

Examples of the metalloid halide may include an antimony halide (e.g., $SbCl_5$).

Examples of the metal telluride may include an alkali metal telluride (e.g., $Li_2Te$, $Na_2Te$, $K_2Te$, $Rb_2Te$, or $Cs_2Te$), an alkaline earth metal telluride (e.g., BeTe, MgTe, CaTe, SrTe, or BaTe), a transition metal telluride (e.g., $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, or $Au_2Te$), a post-transition metal telluride (e.g., ZnTe), and a lanthanide metal telluride (e.g., LaTe, CeTe, PrTe, NdTe, PmTe, EuTe, GdTe, TbTe, DyTe, HoTe, ErTe, TmTe, YbTe, or LuTe).

[Emission Layer in Interlayer 130]

When the light-emitting device 10 is a full color light-emitting device, the emission layer may be patterned into a red emission layer, a green emission layer, and/or a blue emission layer, according to a sub-pixel. In embodiments, the emission layer may have a stacked structure. The stacked structure may include two or more layers selected from a red emission layer, a green emission layer, and a blue emission layer. The two or more layers may directly contact each other. In embodiments, the two or more layers may be separated from each other. In embodiments, the emission layer may include two or more materials. The two or more materials may include a red light-emitting material, a green light-emitting material, or a blue light-emitting material. The two or more materials may be mixed with each other in a single layer. The two or more materials mixed with each other in the single layer may emit white light.

The emission layer may include a host and a dopant. The dopant may be a phosphorescent dopant, a fluorescent dopant, or any combination thereof.

An amount of the dopant in the emission layer may be in a range of about 0.01 parts to about 15 parts by weight, based on 100 parts by weight of the host.

In embodiments, the emission layer may include a quantum dot.

The emission layer may include a delayed fluorescence material. The delayed fluorescence material may serve as a host or as a dopant in the emission layer.

A thickness of the emission layer may be in a range of about 100 Å to about 1,000 Å. For example, the thickness of the emission layer may be in a range of about 200 Å to about 600 Å. When the thickness of the emission layer is within any of these ranges, improved luminescence characteristics may be obtained without a substantial increase in driving voltage.

[Host]

The host may include a compound represented by Formula 301:

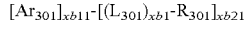

[Formula 301]

In Formula 301,

Ar$_{301}$ and L$_{301}$ may each independently be a $C_3$-$C_{60}$ carbocyclic group unsubstituted or substituted with at least one R$_{10a}$ or a $C_1$-$C_{60}$ heterocyclic group unsubstituted or substituted with at least one R$_{10a}$, xb11 may be 1, 2, or 3, xb1 may be an integer from 0 to 5, R$_{301}$ may be hydrogen, deuterium, —F, —Cl, —Br, —I, a hydroxyl group, a cyano group, a nitro group, a $C_1$-$C_{60}$ alkyl group unsubstituted or substituted with at least one R$_{10a}$, a $C_2$-$C_{60}$ alkenyl group unsubstituted or substituted with at least one R$_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si$(Q_{301})(Q_{302})(Q_{303})$, —N$(Q_{301})(Q_{302})$, —B$(Q_{301})(Q_{302})$, —C(=O)$(Q_{301})$, —S(=O)$_2(Q_{301})$, or —P(=O)$(Q_{301})(Q_{302})$, xb21 may be an integer from 1 to 5, and $Q_{301}$ to $Q_{303}$ may each independently be the same as described in connection with $Q_1$.

In embodiments, when xb11 in Formula 301 is 2 or greater, at least two $Ar_{301}$(s) may be bound via a single bond.

In embodiments, the host may include a compound represented by Formula 301-1, a compound represented by Formula 301-2, or any combination thereof:

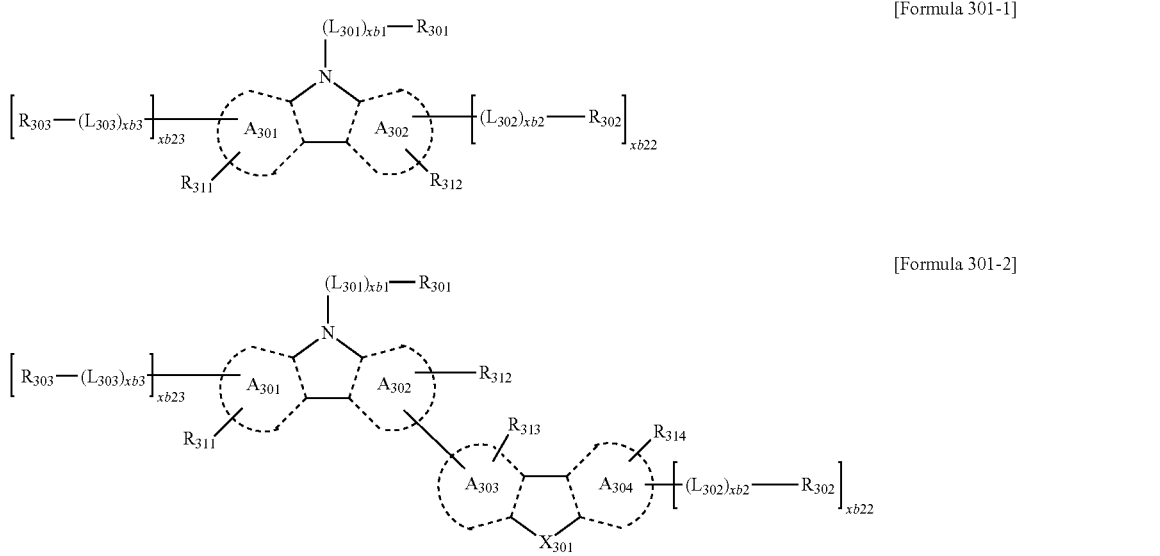

[Formula 301-1]

[Formula 301-2]

In Formulae 301-1 to 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[$(L_{304})_{xb4}$-$R_{304}$], C$(R_{304})(R_{305})$, or Si$(R_{304})(R_{305})$, xb22 and xb23 may each independently be 0, 1, or 2, $L_{301}$, xb1, and $R_{301}$ may each independently be understood by referring to the descriptions of $L_{301}$, xb1, and $R_{301}$ provided herein, $L_{302}$ to $L_{304}$ may each independently be the same as described in connection with $L_{301}$, xb2 to xb4 may each independently be the same as described in connection with xb1, and $R_{302}$ to $R_{305}$ and $R_{311}$ to $R_{314}$ may each independently be the same as described in connection with $R_{301}$.

In embodiments, the host may include an alkaline earth-metal complex, a post-transitional metal complex, or any combination thereof. For example, the host may include a Be complex (e.g., Compound H55), a Mg complex, a Zn complex, or any combination thereof.

In embodiments, the host may include one of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolyl-benzene (mCP), 1,3,5-tri(carbazol-9-yl)benzene (TCP), or any combination thereof:

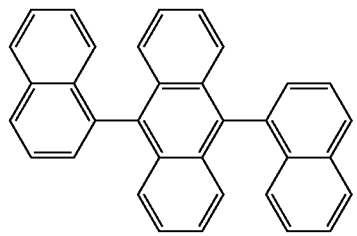

H1

-continued

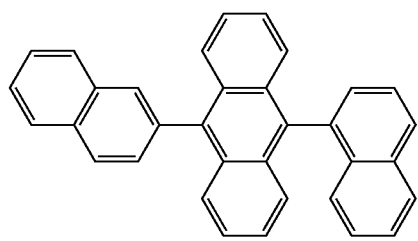

H2

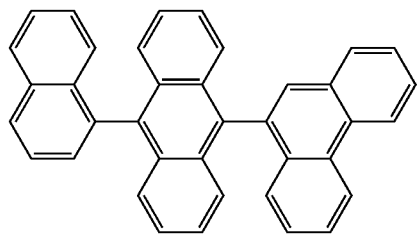

H3

-continued
H4
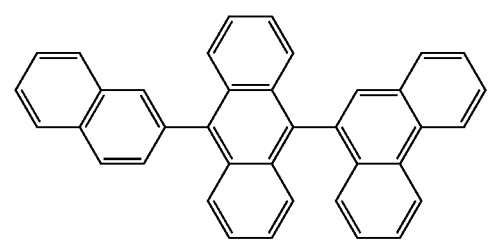
H5
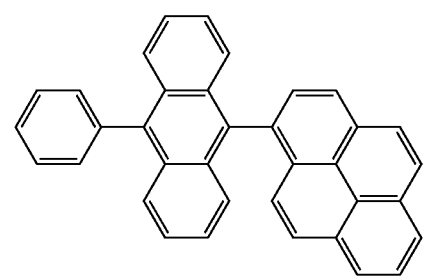
H6
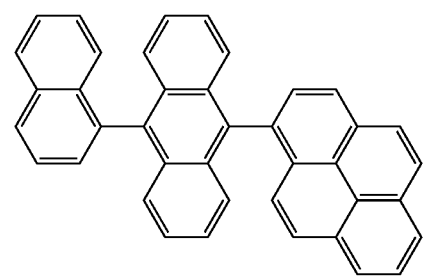
H7
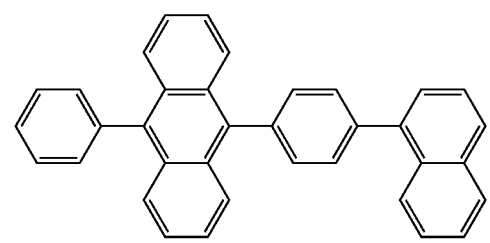
H8
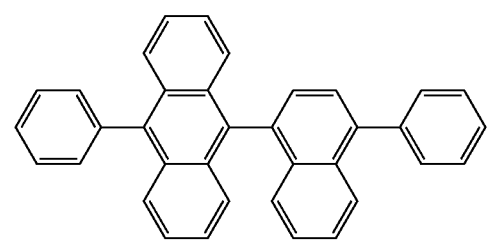
H9
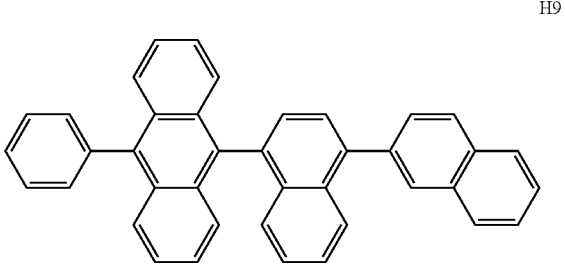
-continued
H10
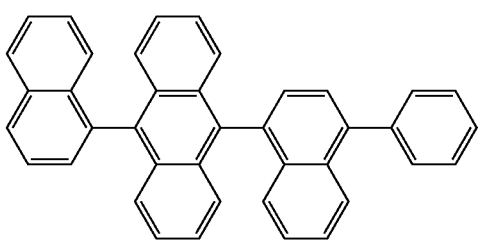
H11
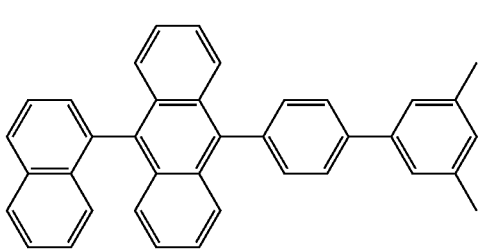
H12
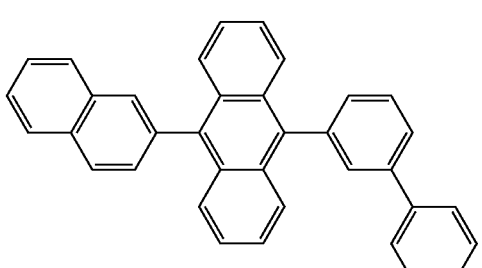
H13
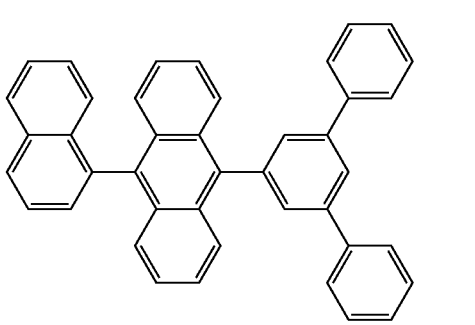
H14
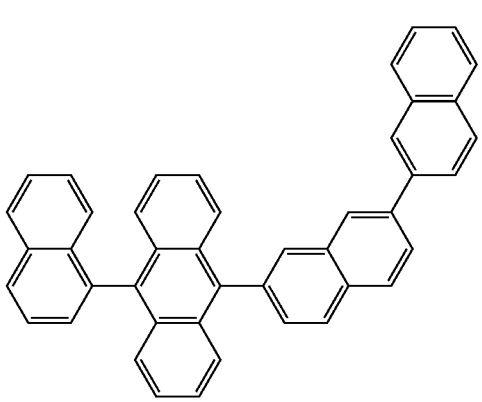

H15
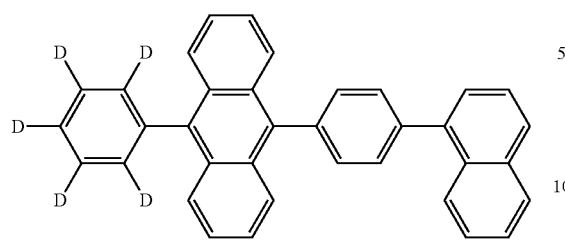
H16
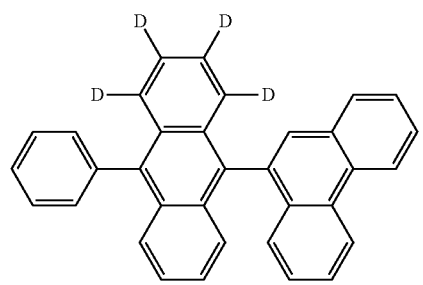
H17
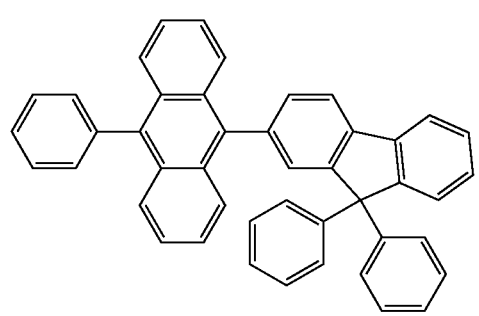
H18
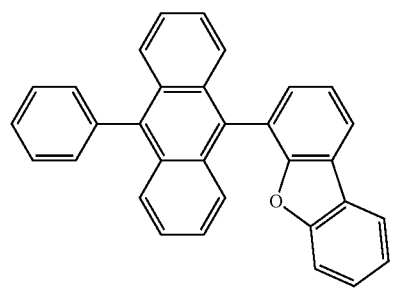
H19
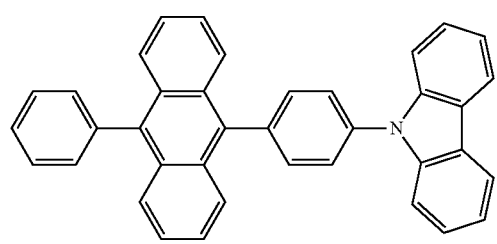
H20
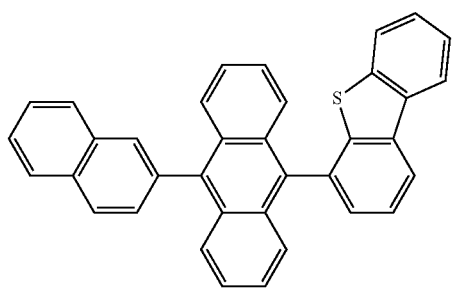
H21
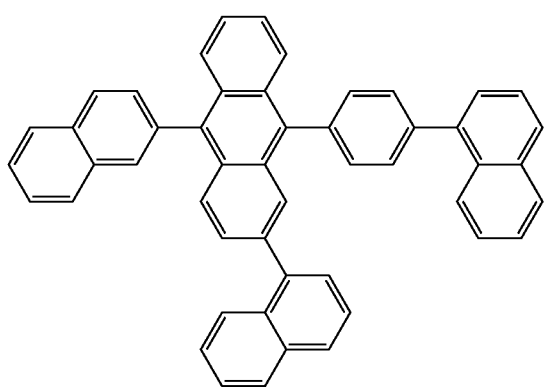
H22
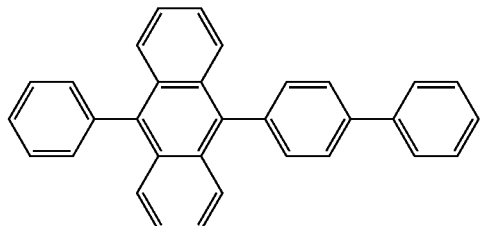
H23
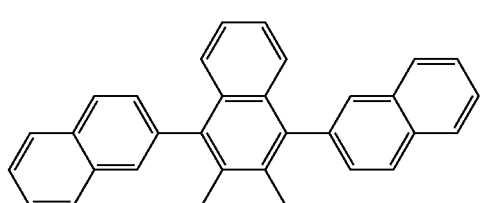

H24
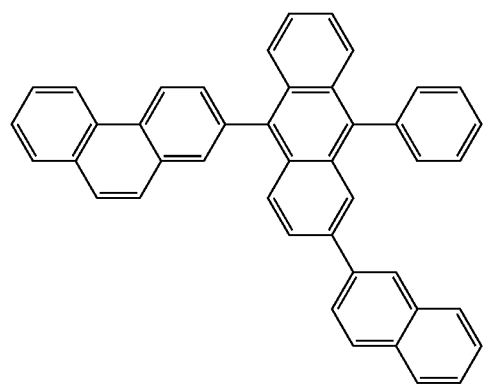
H25
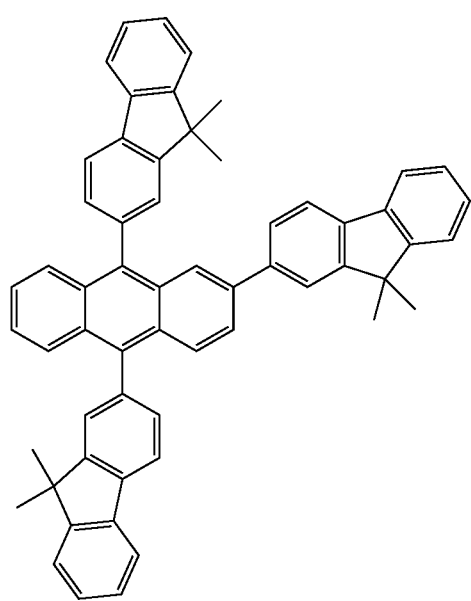
H26
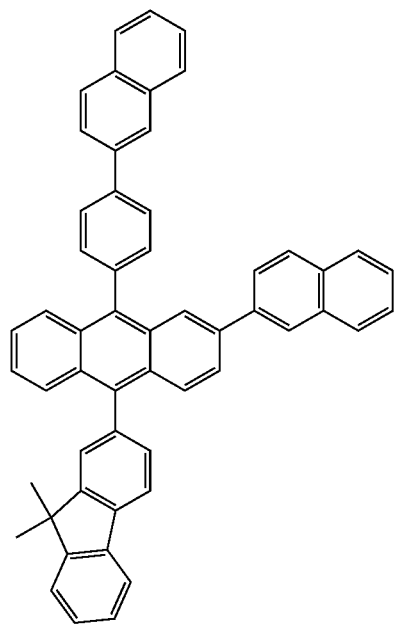
H27
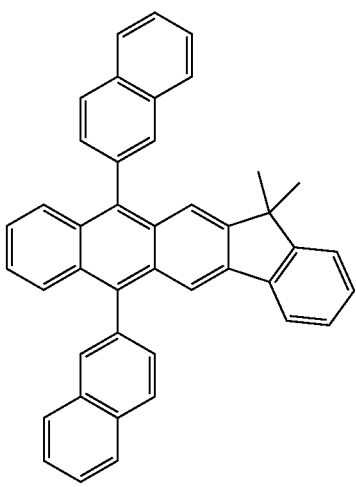
H28
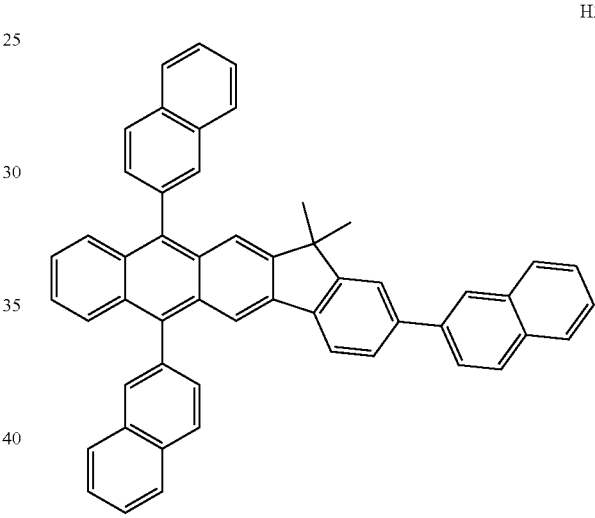
H29
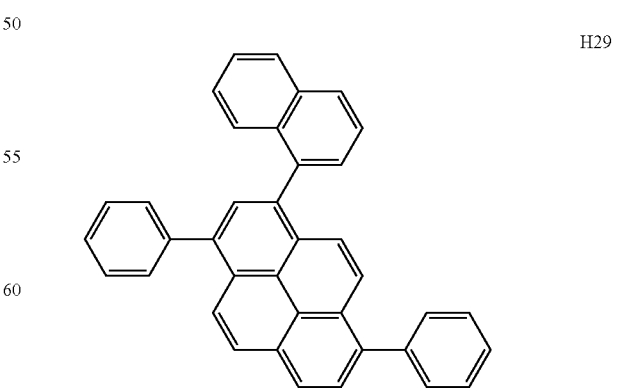

H30
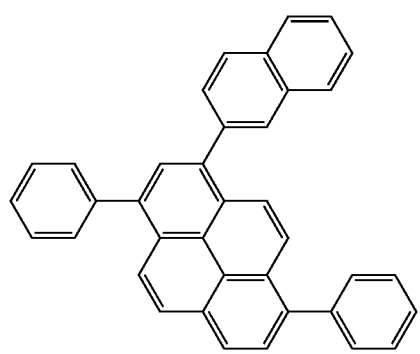
H31
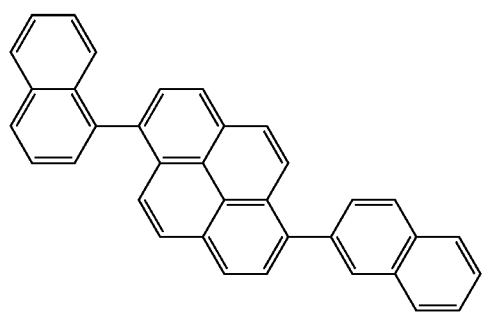
H32
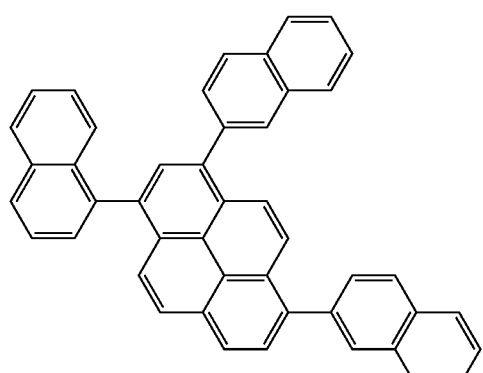
H33
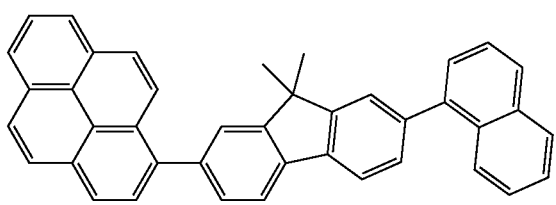
H34
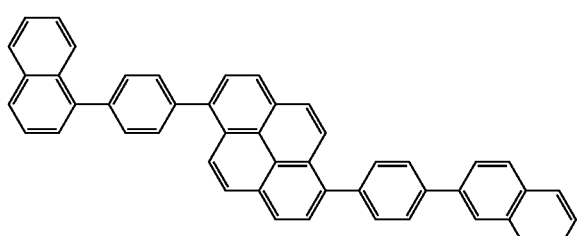
H35
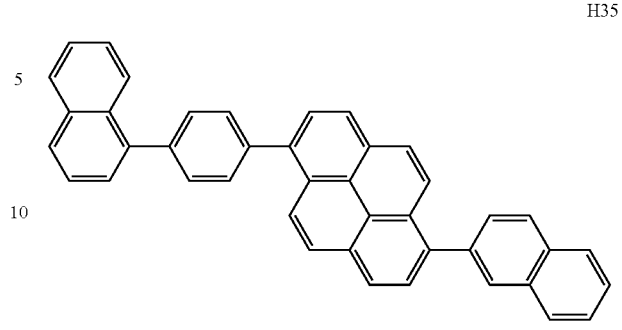
H36
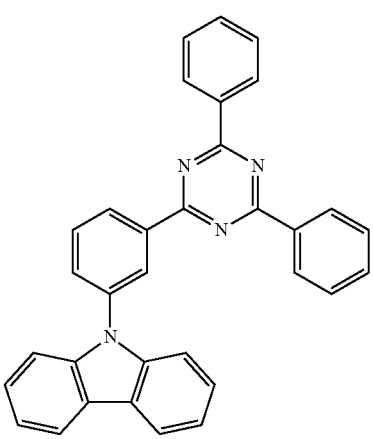
H37
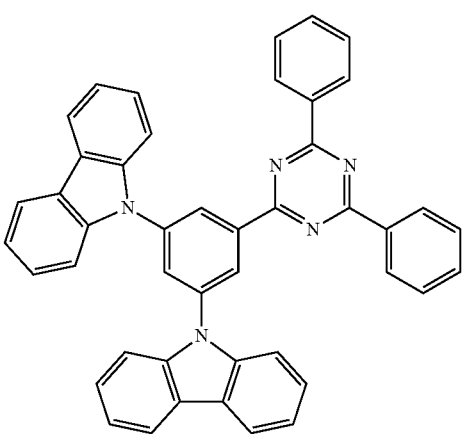
H38
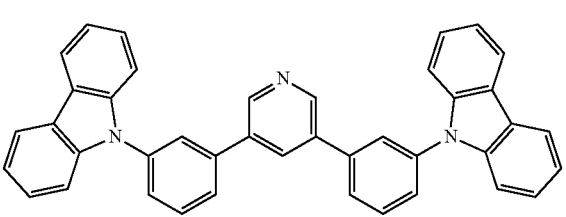

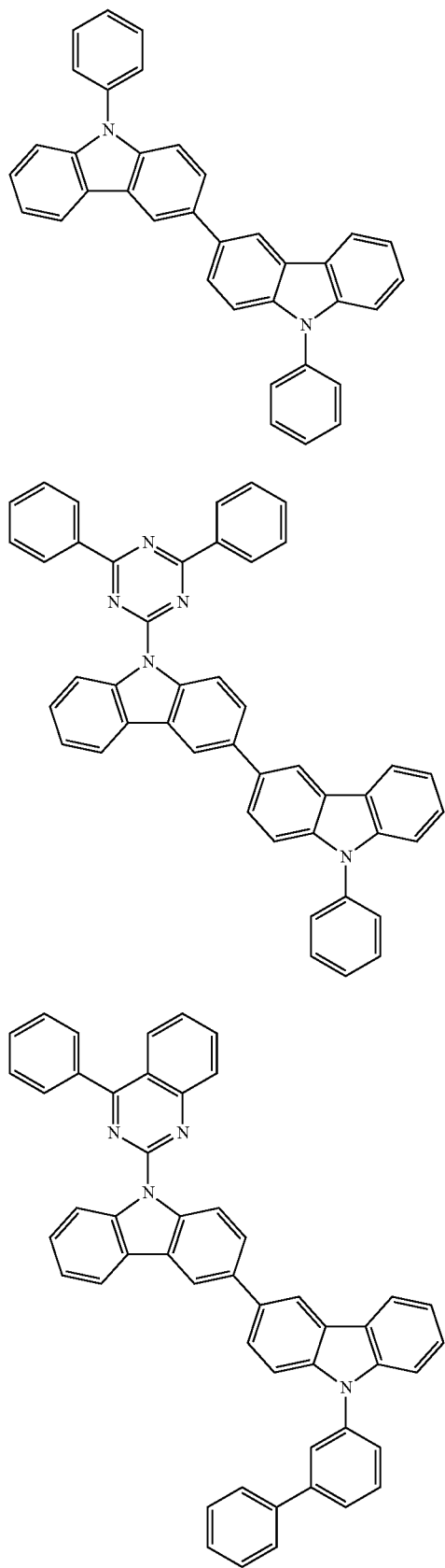
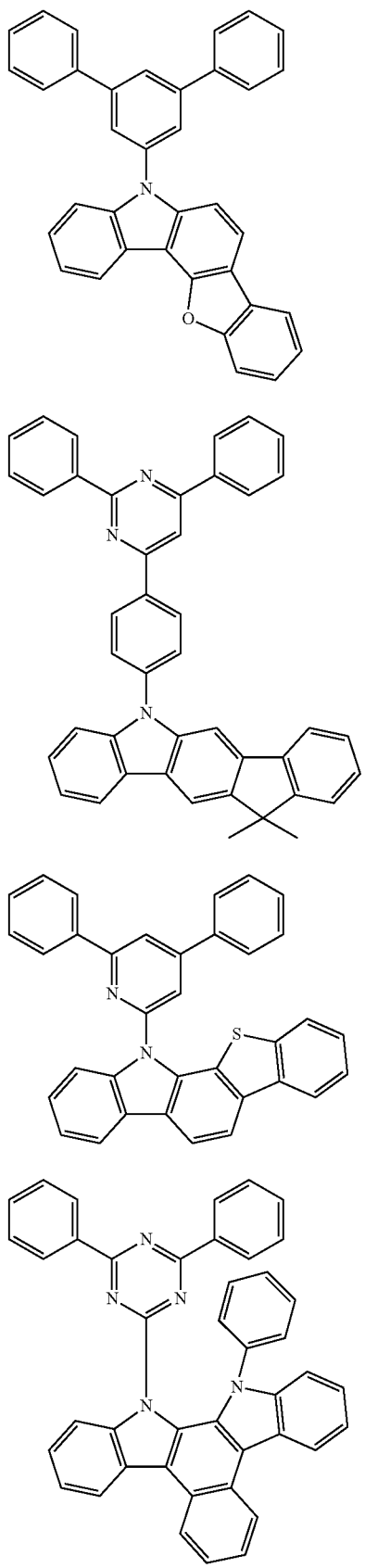

H46 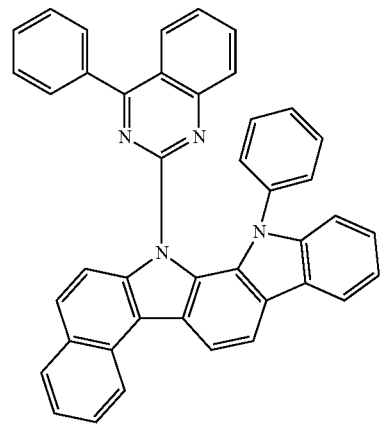
H47 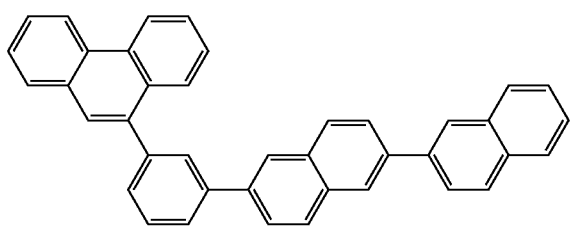
H48 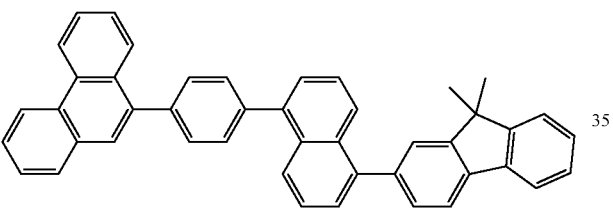
H49 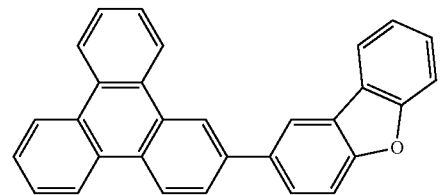
H50 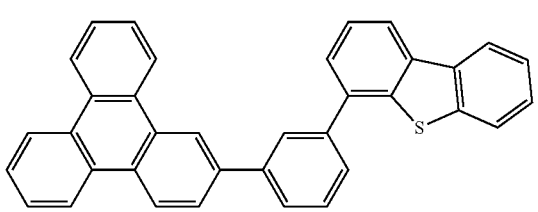
H51 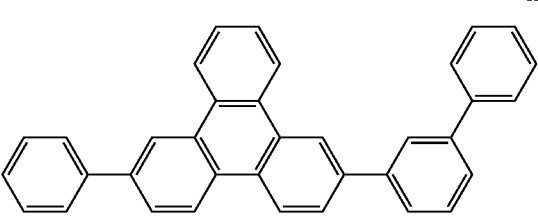
H52 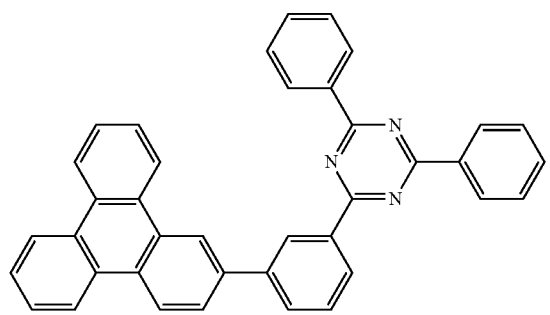
H53 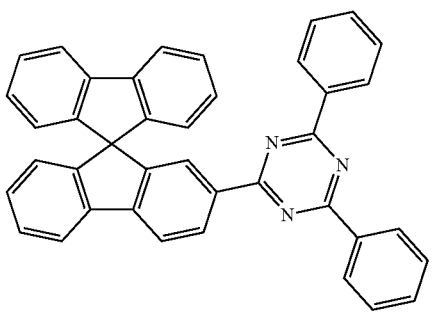
H54 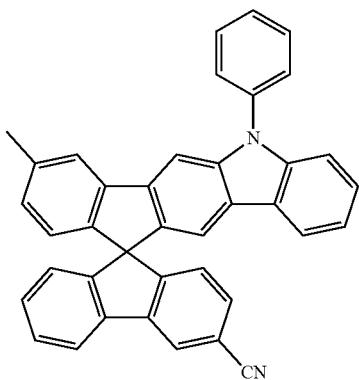
H55 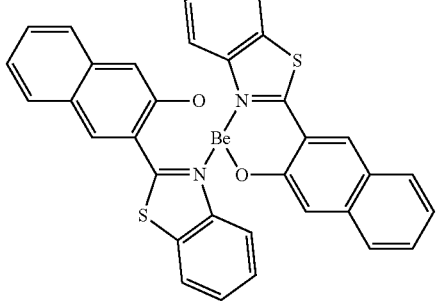

H56
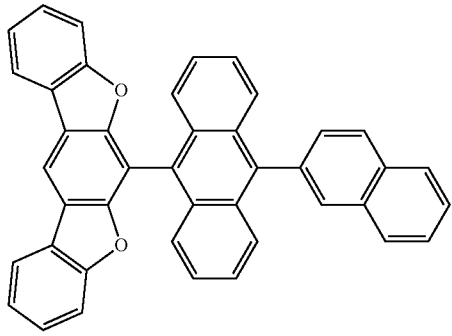
H57
H58
H59
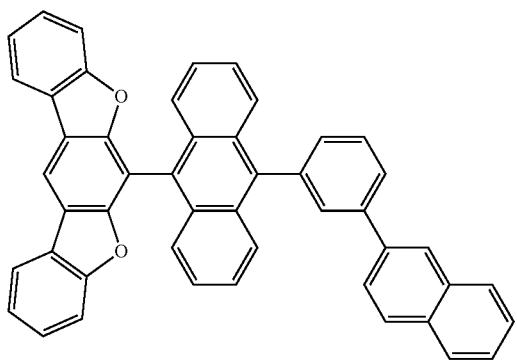
H60
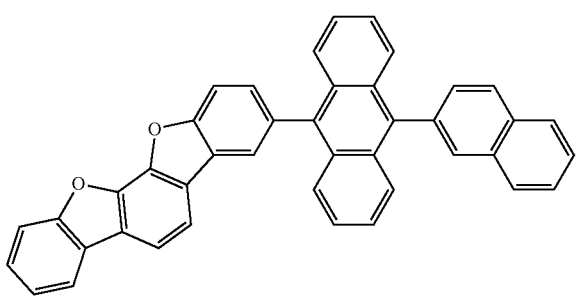
H61
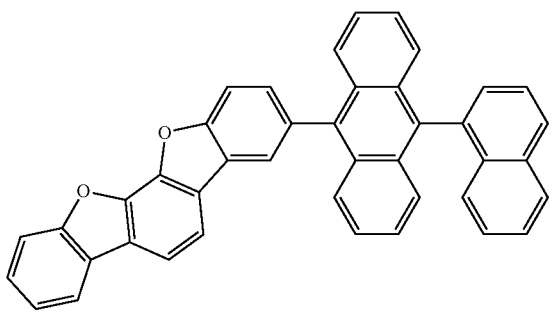
H62
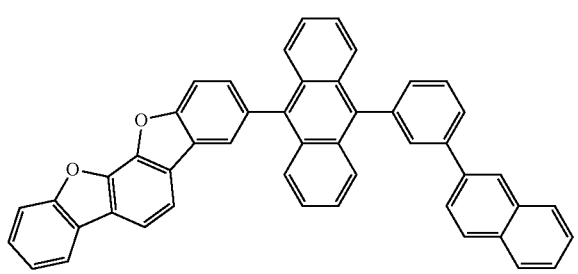
H63
H64
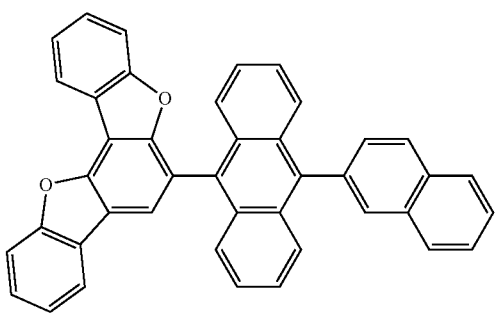

H65
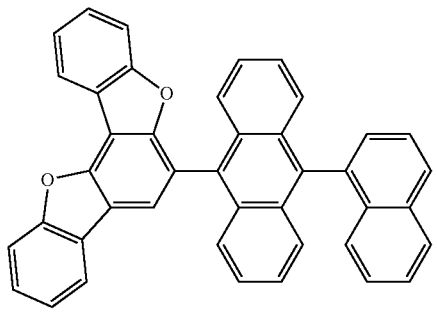
H66
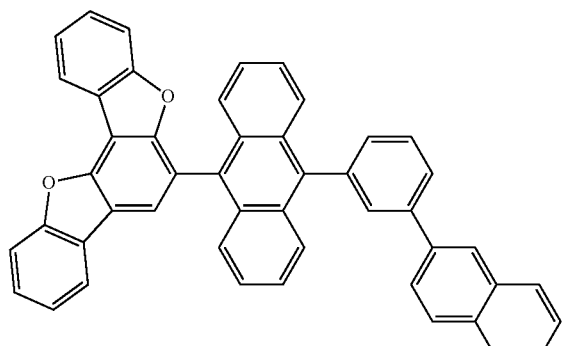
H67
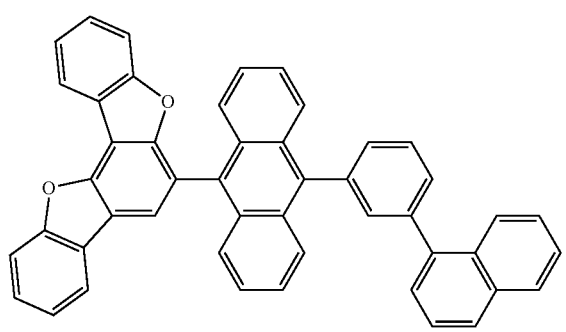
H68
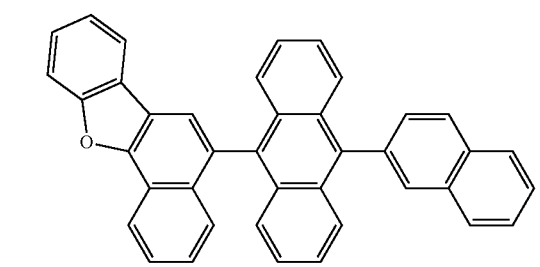
H69
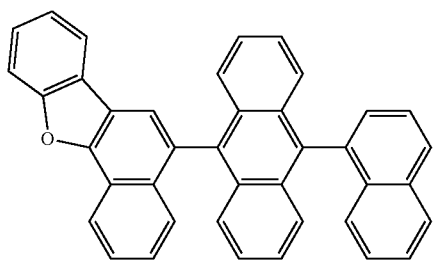
H70
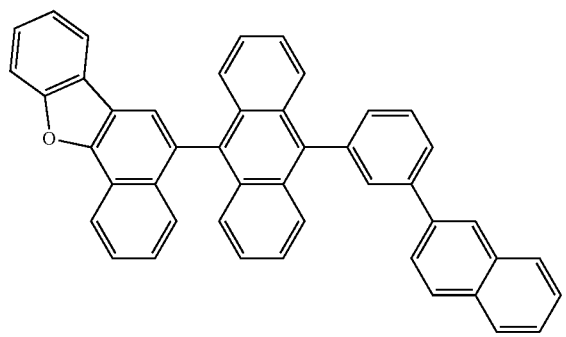
H71
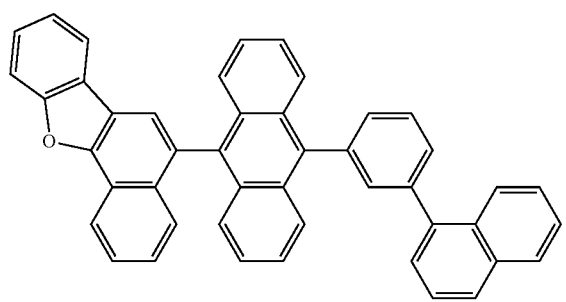
H72
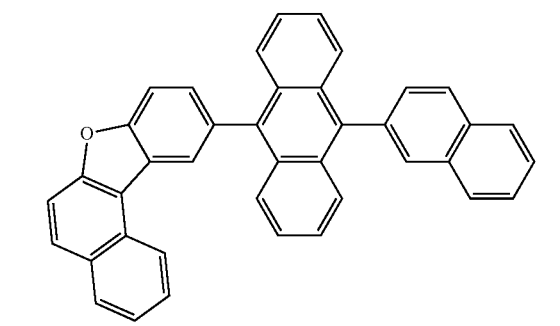
H73
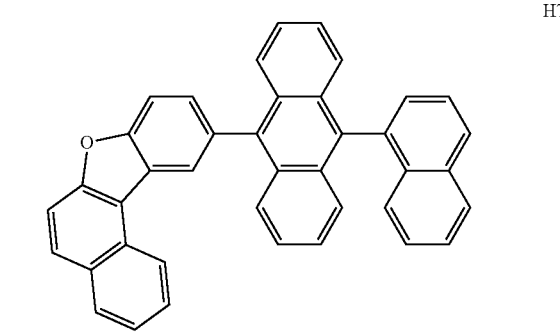

H74
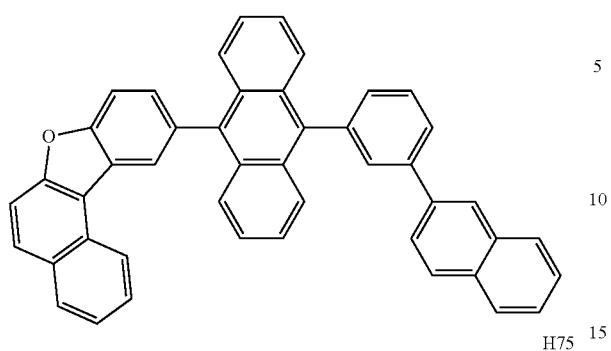
H75
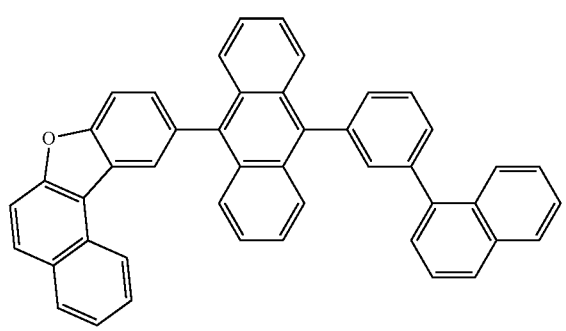
H76
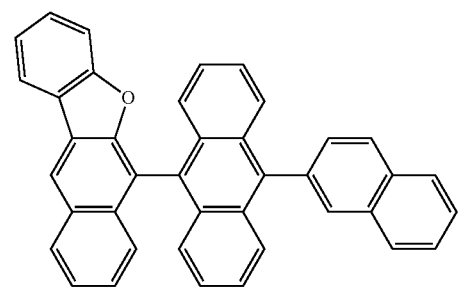
H77
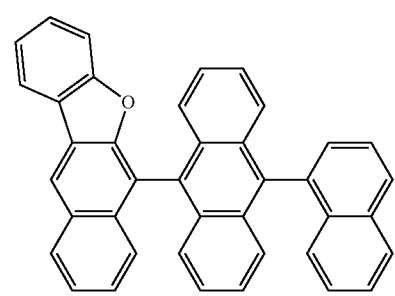
H78
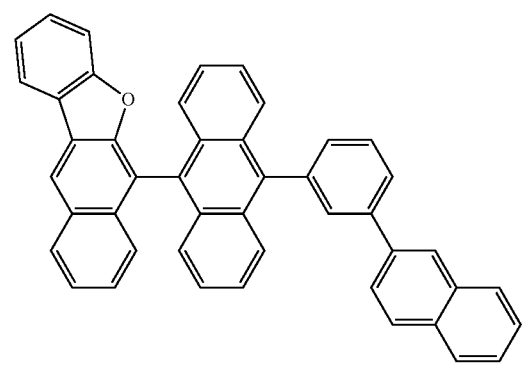
H79
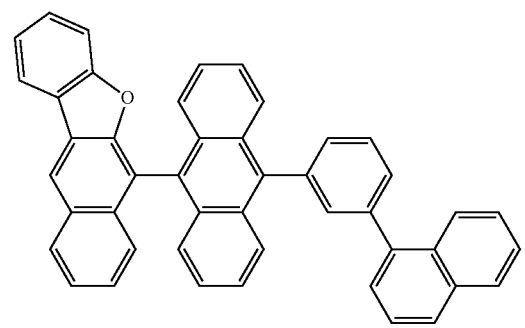
H80
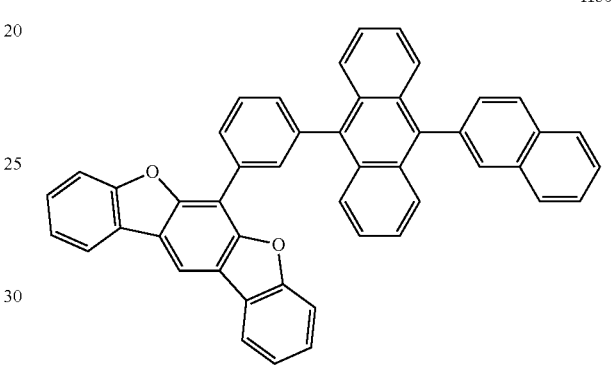
H81
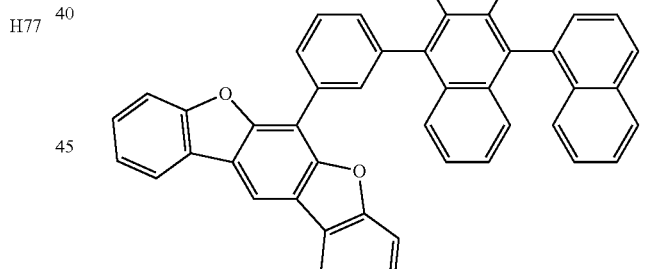
H82
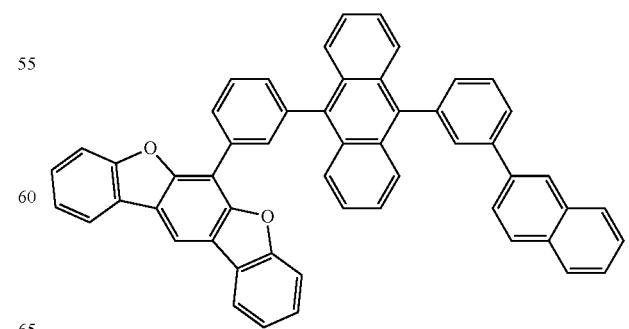

-continued
H83
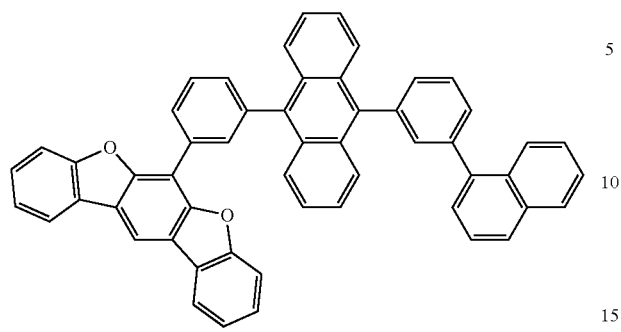
H87
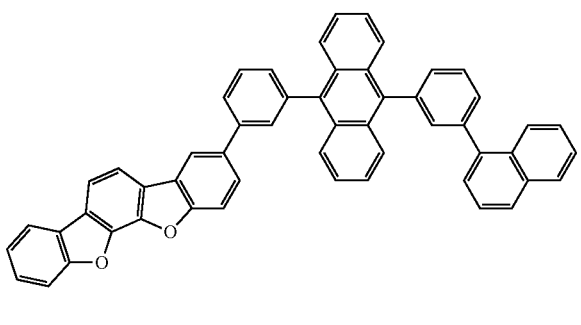
H84
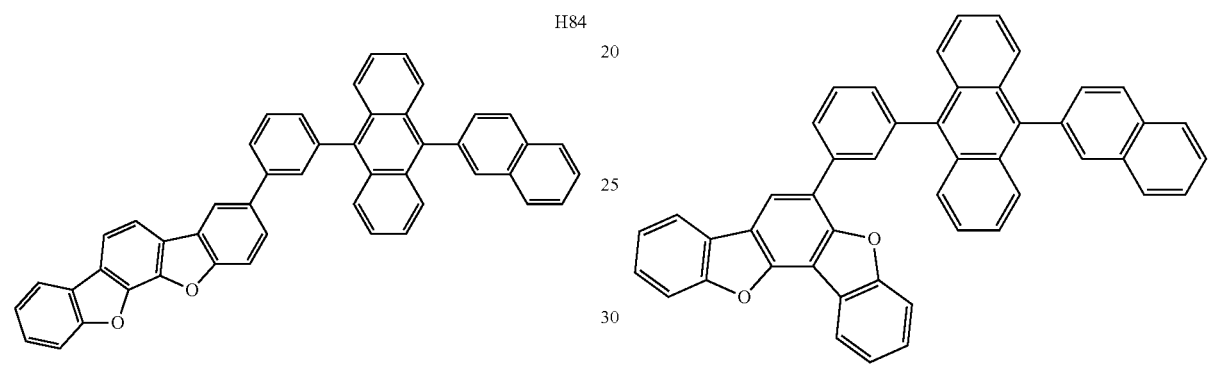
H88
H85
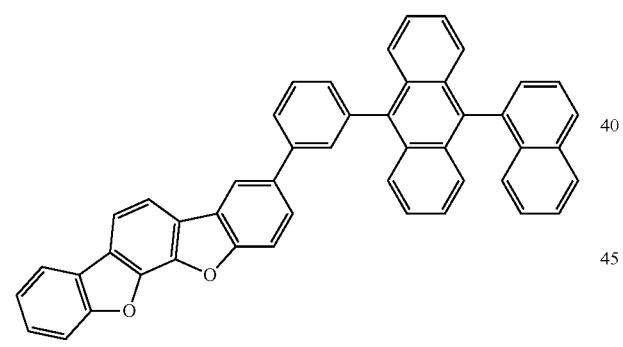
H89
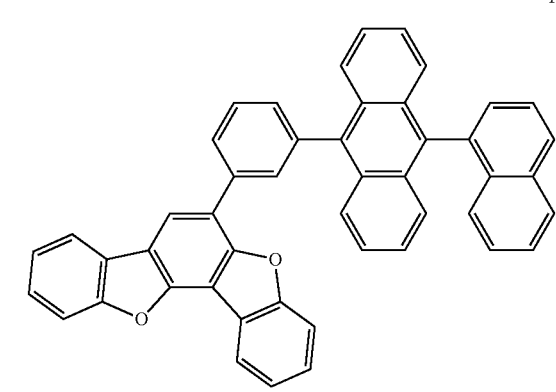
H86
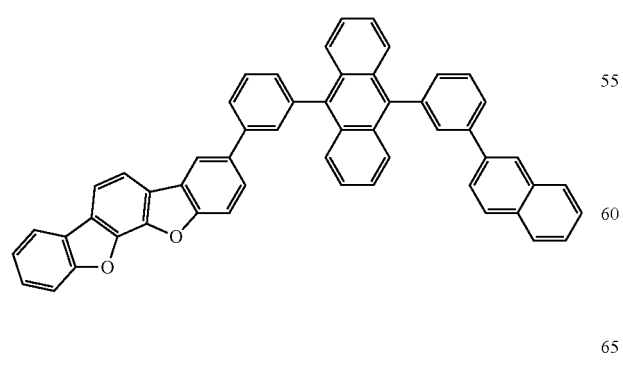
H90
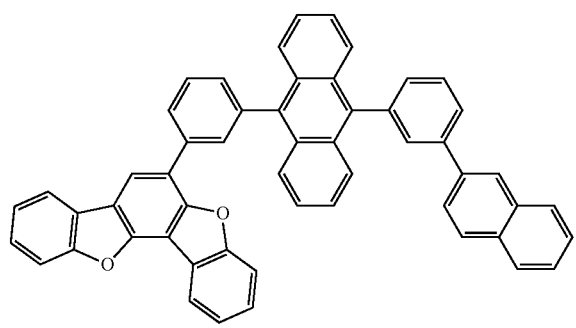

H91
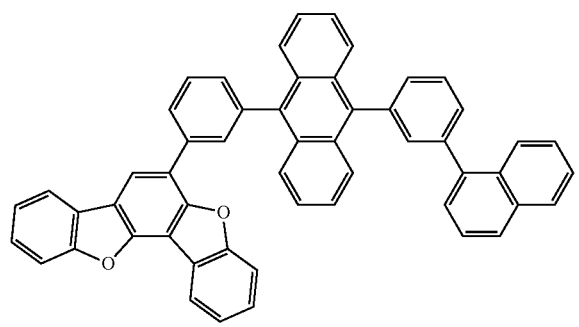
H92
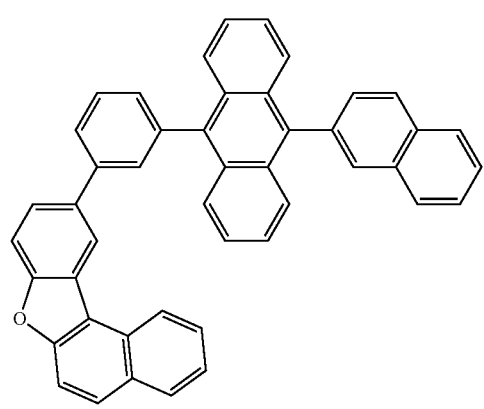
H93
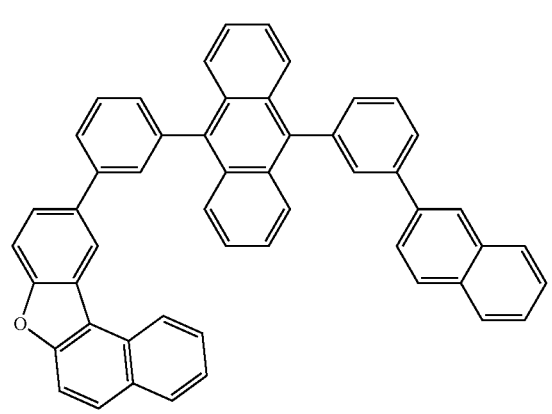
H94
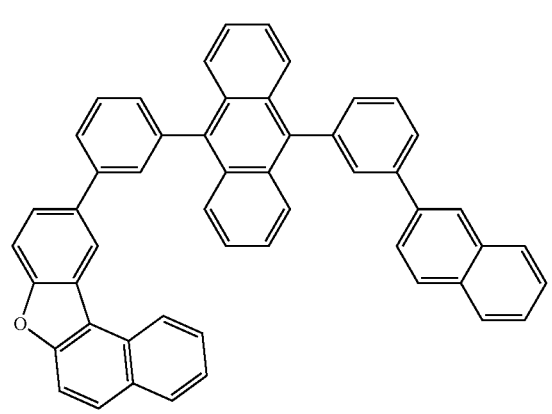
H95
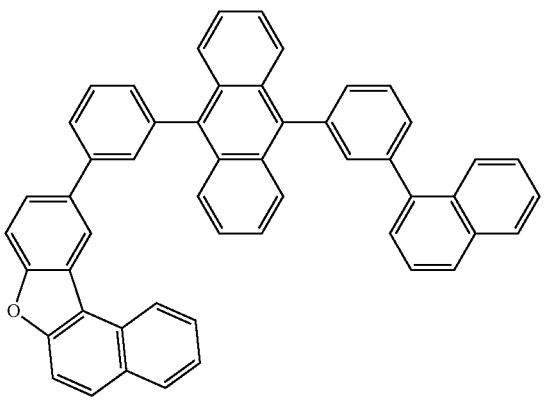
H96
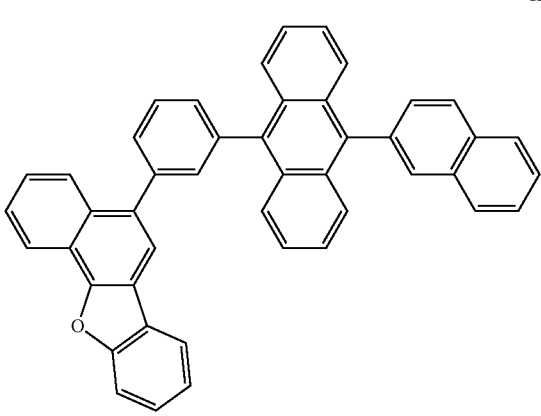
H97
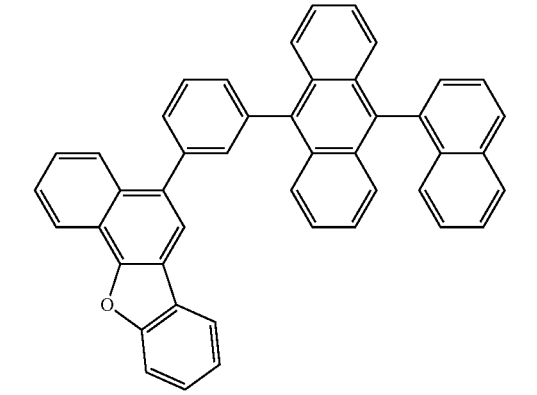
H98
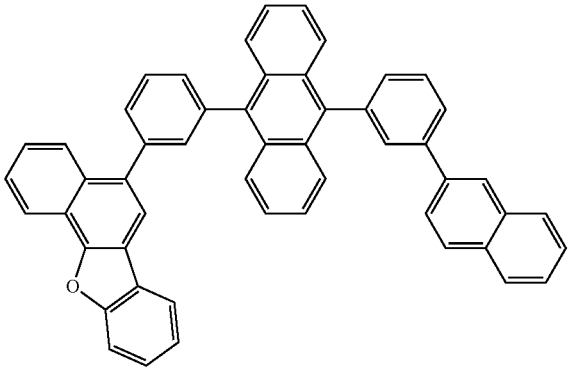

H99
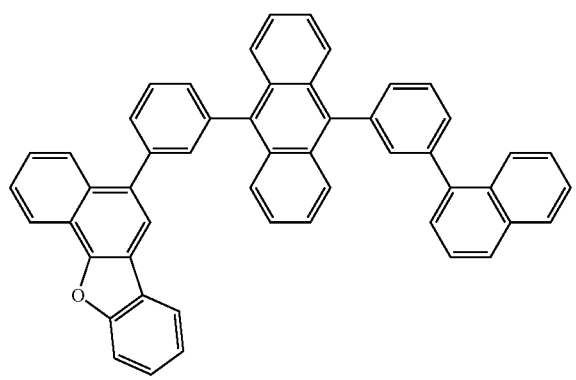
H100
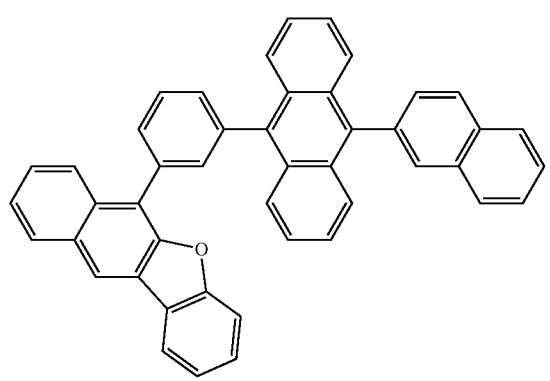
H101
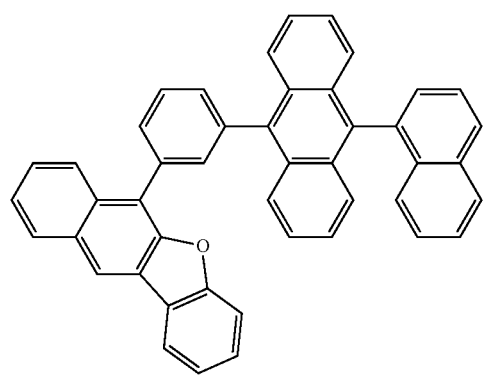
H102
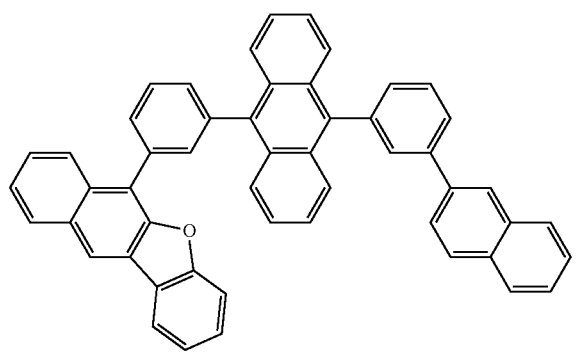
H103
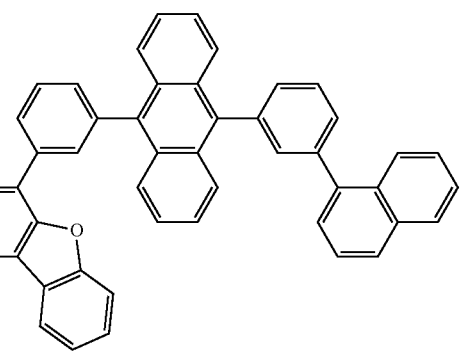
H104
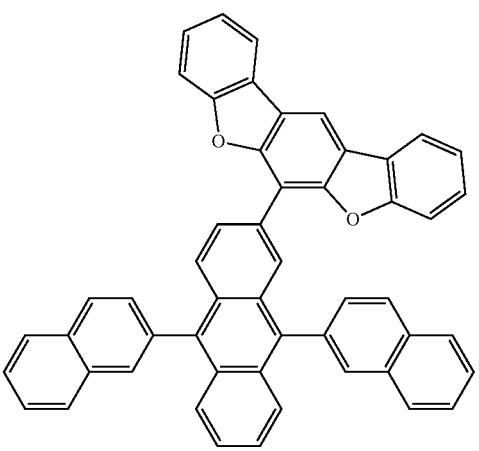
H105
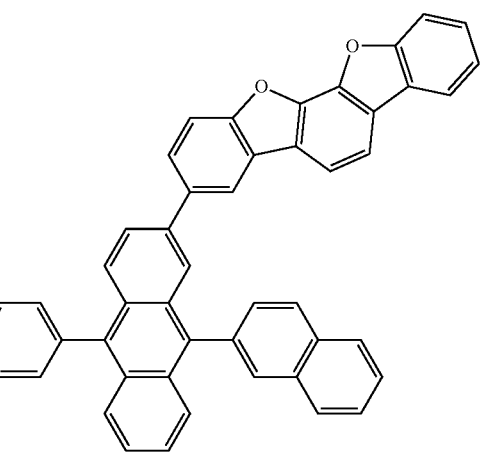

H106
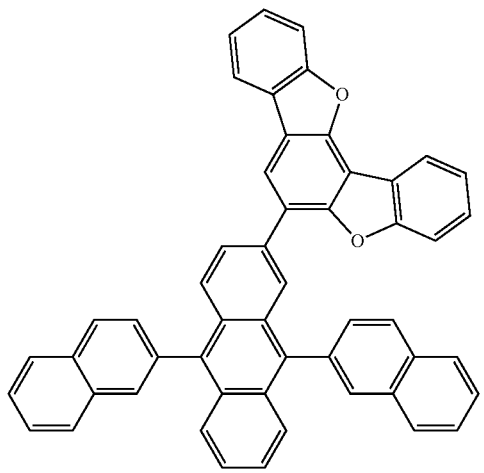
H107
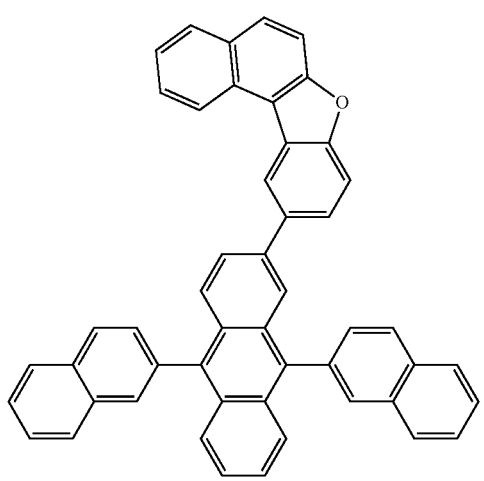
H108
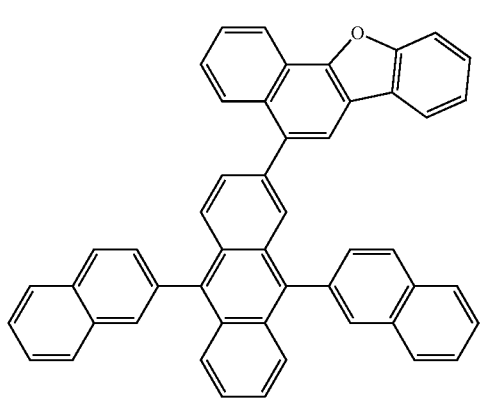
H109
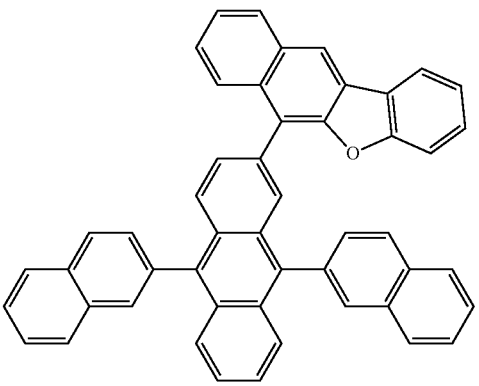
H110
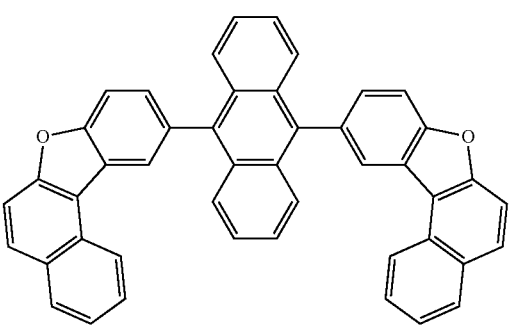
H111
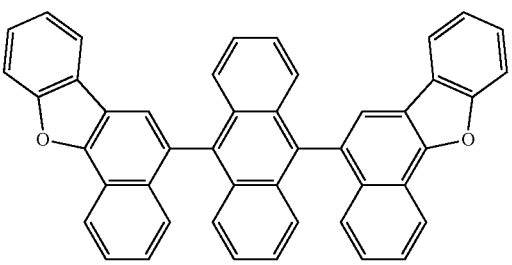
H112
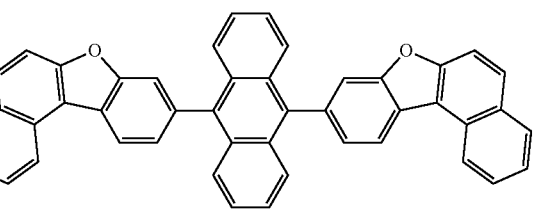
H113
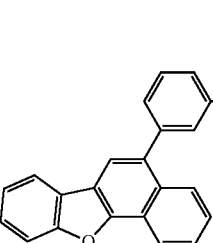

-continued
H114
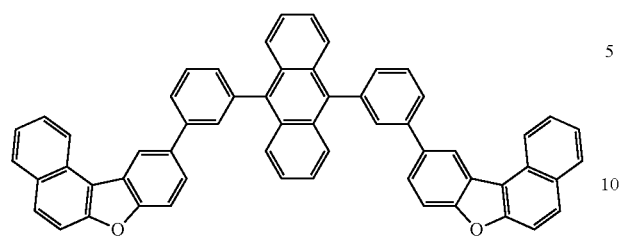
H115
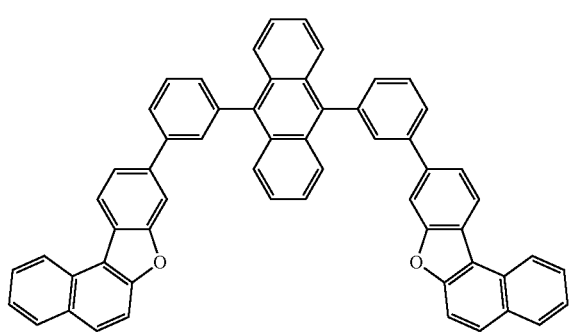
H116
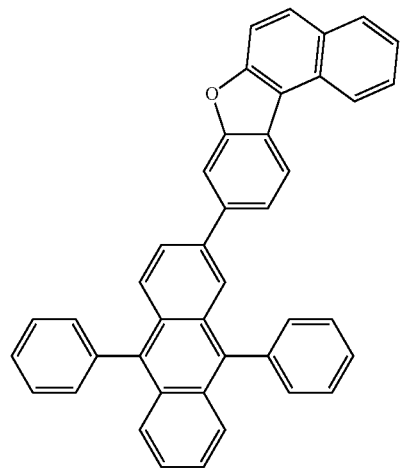
H117
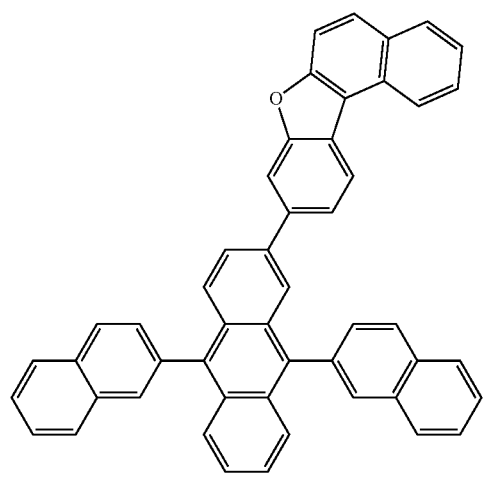
-continued
H118
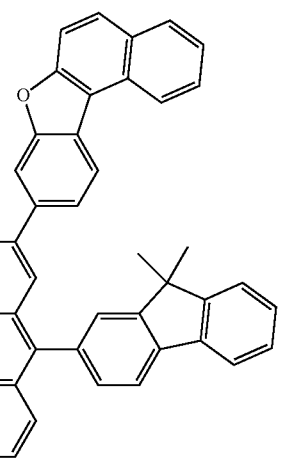
H119
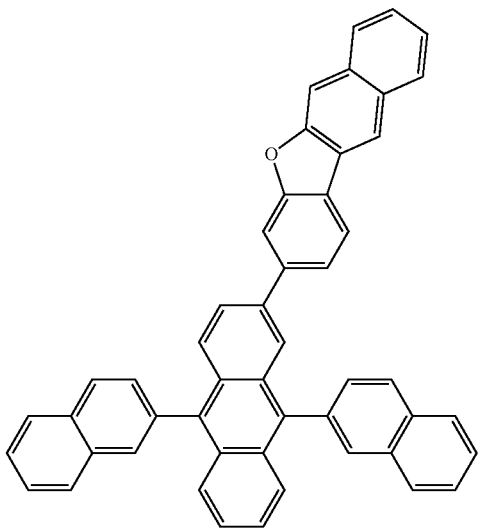
H120
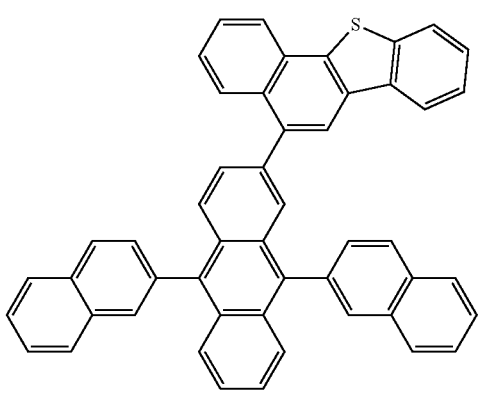

-continued

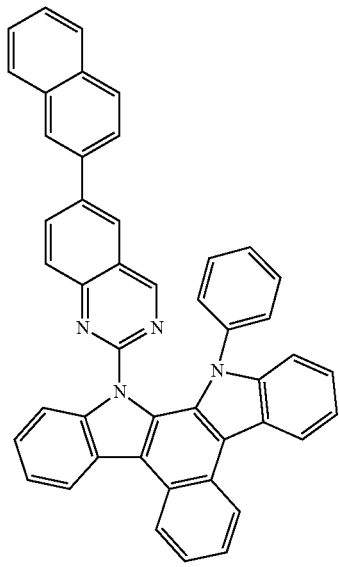
H121

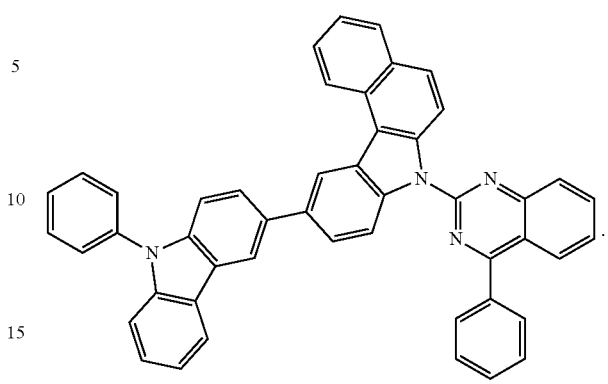
H124

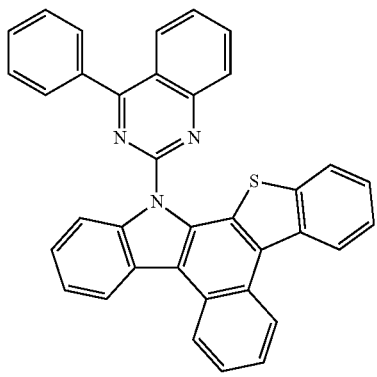
H122

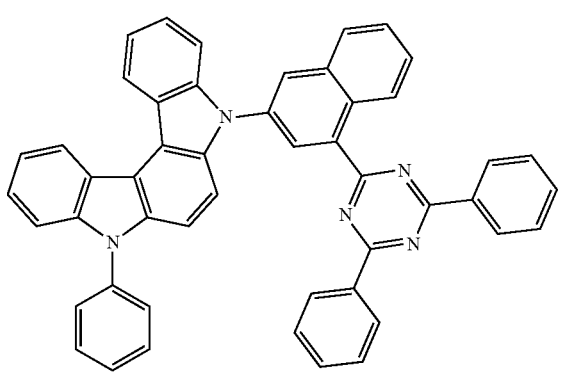
H123

[Phosphorescent Dopant]

The phosphorescent dopant may include at least one transition metal as a center metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In embodiments, the phosphorescent dopant may include an organometallic complex represented by Formula 401:

$$M(L_{401})_{xc1}(L_{402})_{xc2}$$ [Formula 401]

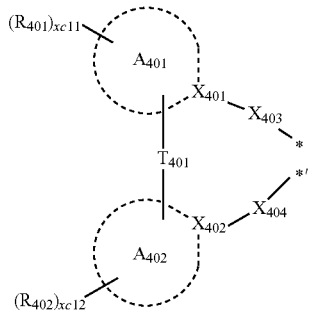

[Formula 402]

In Formulae 401 and 402,

M may be a transition metal (e.g., iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, and when xc1 is 2 or greater, at least two $L_{401}$(s) may be identical to or different from each other, $L_{402}$ may be an organic ligand, and xc2 may be an integer from 0 to 4, and when xc2 is 2 or greater, at least two $L_{402}$(s) may be identical to or different from each other, $X_{401}$ and $X_{402}$ may each independently be nitrogen (N) or carbon (C), ring $A_{401}$ and ring $A_{402}$ may each independently be a $C_3$-$C_{60}$ carbocyclic group or a $C_1$-$C_{60}$ heterocyclic group, $T_{401}$ may be a single bond, —O—, —S—, —C(=O)—, —N($Q_{411}$)-, —C($Q_{411}$)($Q_{412}$)-, —C($Q_{411}$)=C($Q_{412}$)-, —C($Q_{411}$)=, or =C=, $X_{403}$ and $X_{404}$ may each independently be a chemical bond (e.g., a covalent bond or a coordinate bond), O, S, $N(Q_{413})$, $B(Q_{413})$, $P(Q_{413})$, $C(Q_{413})(Q_{414})$, or $Si(Q_{413})(Q_{414})$, $Q_{411}$ to $Q_{414}$ may each independently be the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{401})(Q_{402})(Q_{403})$, —$N(Q_{401})(Q_{402})$, —$B(Q_{401})(Q_{402})$, —$C(=O)(Q_{401})$, —$S(=O)_2(Q_{401})$, or —$P(=O)(Q_{401})(Q_{402})$, $Q_{401}$ to $Q_{403}$ may each independently be the same as described in connection with $Q_1$, xc11 and xc12 may each independently be an integer from 0 to 10, and

* and *' in Formula 402 each indicate a binding site to M in Formula 401.

For example, in Formula 402, $X_{401}$ may be nitrogen and $X_{402}$ may be carbon, or $X_{401}$ and $X_{402}$ may each be nitrogen.

In embodiments, when xc1 in Formula 402 is 2 or greater, two ring $A_{401}$(s) of at least two $L_{401}$(s) may optionally be bound via $T_{402}$ as a linking group, or two ring $A_{402}$(s) may optionally be bound via $T_{403}$ as a linking group (see Compounds PD1 to PD4 and PD7). $T_{402}$ and $T_{403}$ may each independently be the same as described in connection with $T_{401}$.

In Formula 401, $L_{402}$ may be any suitable organic ligand. For example, $L_{402}$ may be a halogen group, a diketone group (e.g., an acetylacetonate group), a carboxylic acid group (e.g., a picolinate group), —C(=O), an isonitrile group, —CN, or a phosphorus group (e.g., a phosphine group or a phosphite group).

The phosphorescent dopant may be, for example, one of Compounds PD1 to PD39 or any combination thereof:

PD1

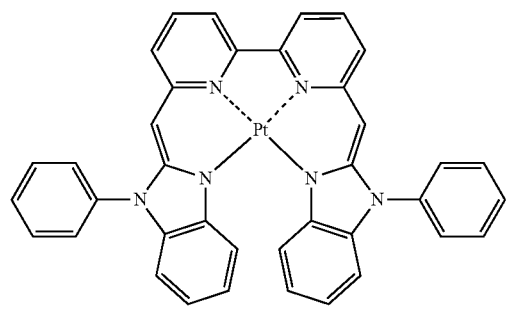

PD2

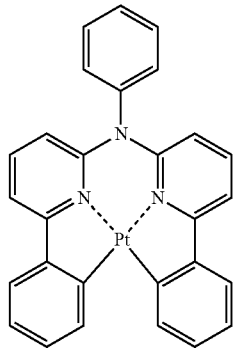

PD3

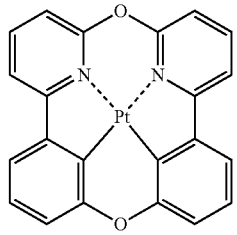

PD4

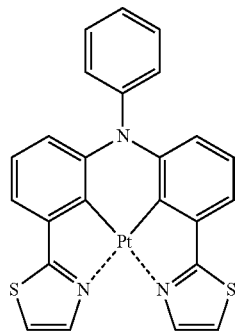

PD5

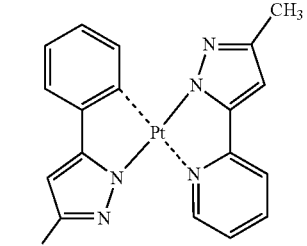

PD6

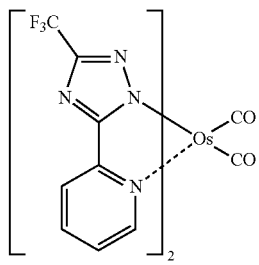

-continued
PD7
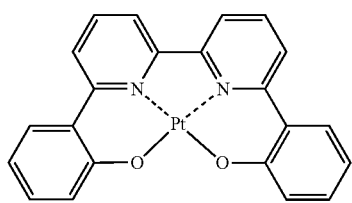
PD8
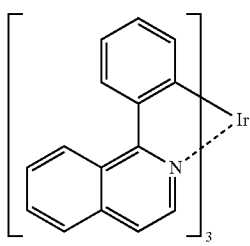
PD9
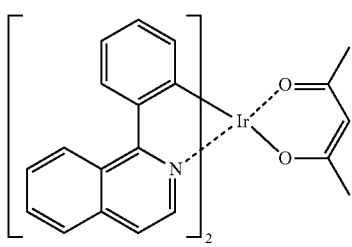
PD10
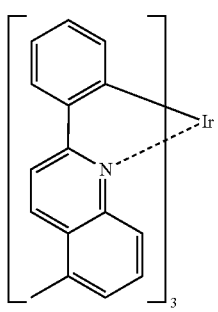
PD11
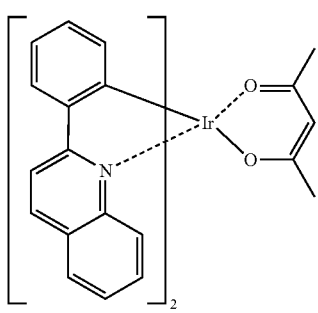
-continued
PD12
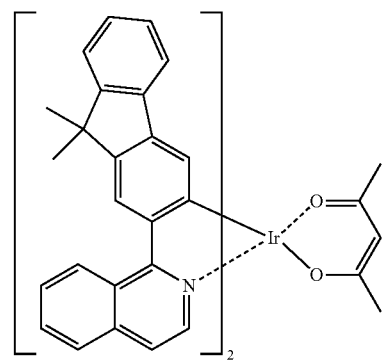
PD13
PD14
PD15
PD16

PD17 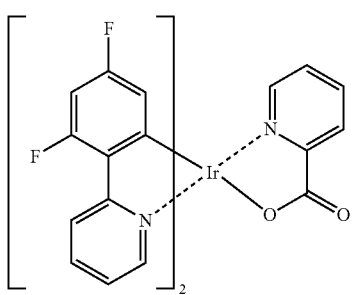
PD18 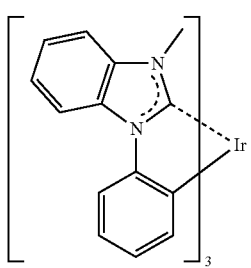
PD19 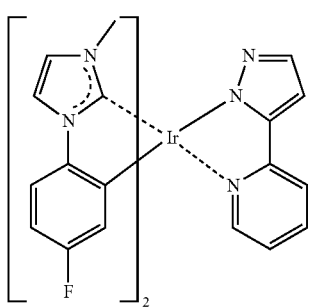
PD20 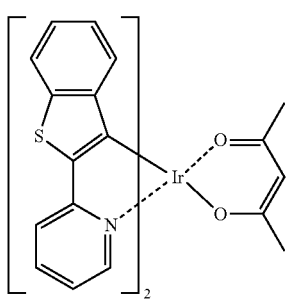
PD21 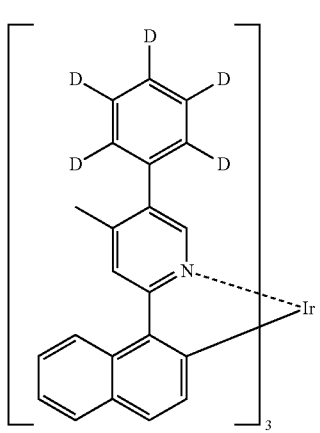
PD22 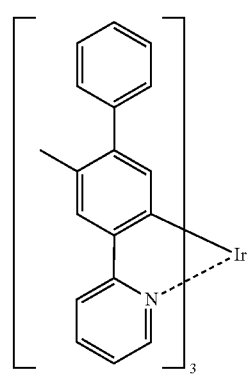
PD23 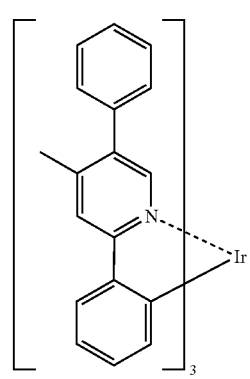
PD24 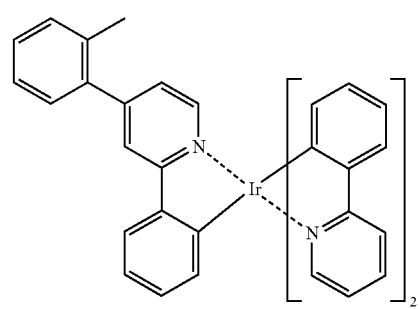
PD25 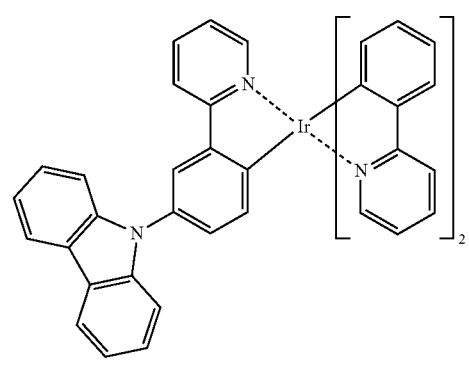

PD26 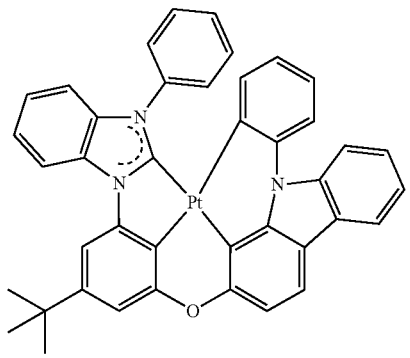
PD30 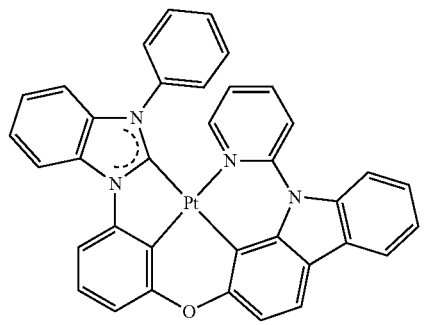
PD27 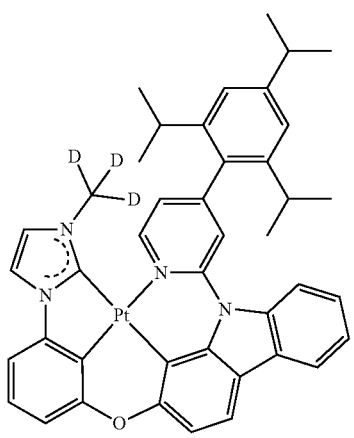
PD31 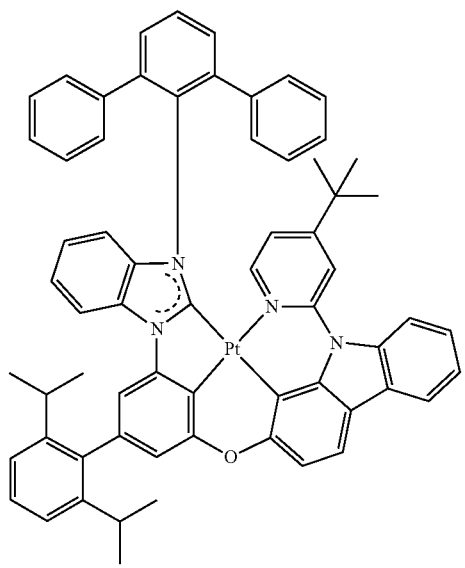
PD28 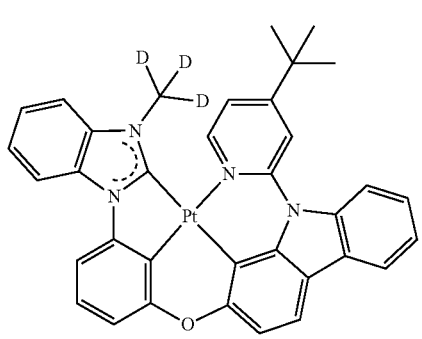
PD32 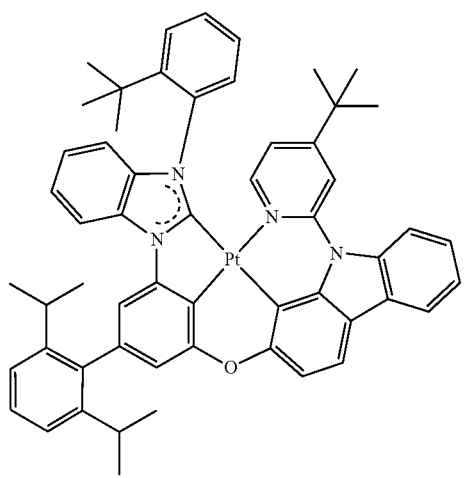
PD29

PD33
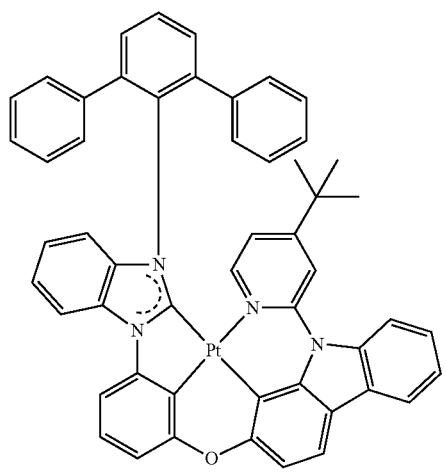
PD34
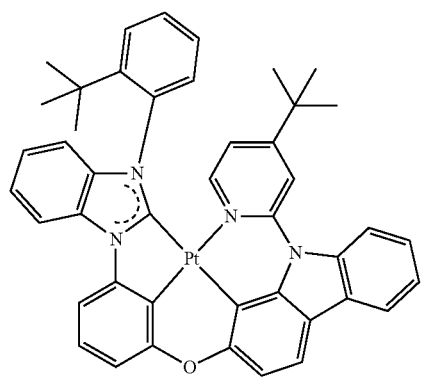
PD35
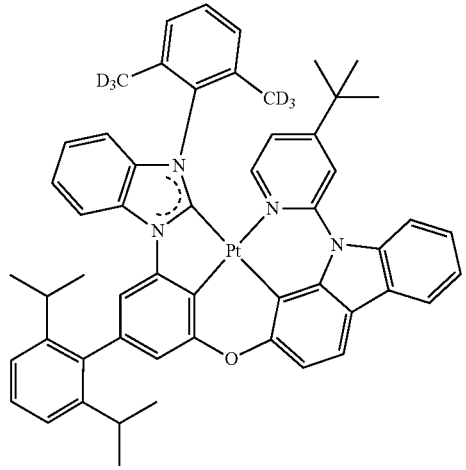
PD36
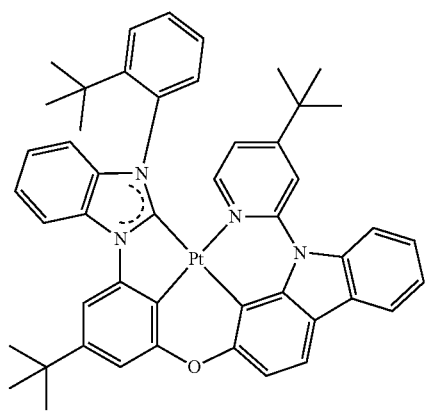
PD37
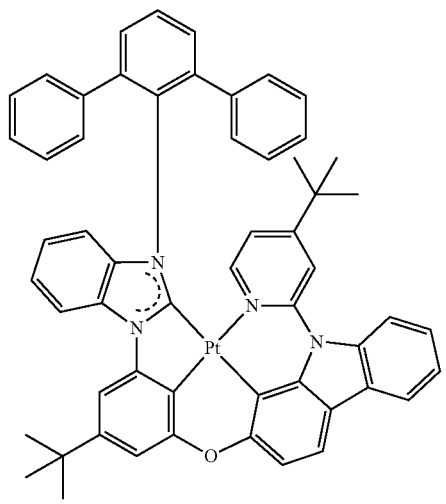

-continued

PD38

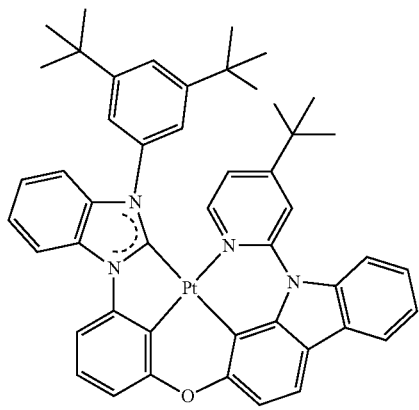

PD39

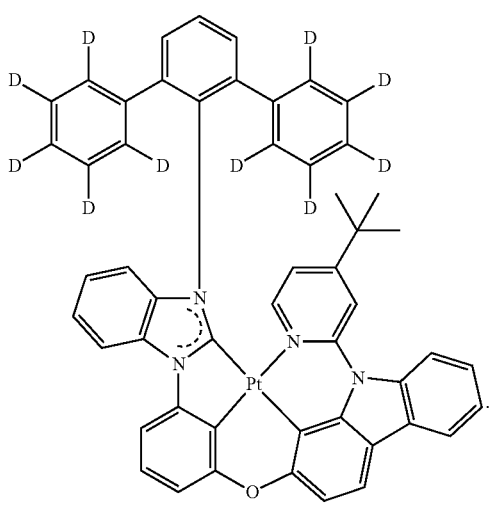

[Fluorescent Dopant]

The fluorescent dopant may include an amine group-containing compound, a styryl group-containing compound, or any combination thereof.

In embodiments, the fluorescent dopant may include a compound represented Formula 501:

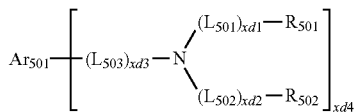

[Formula 501]

In Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In embodiments, in Formula 501, $Ar_{501}$ may include a condensed ring group (e.g., an anthracene group, a chrysene group, or a pyrene group) in which at least three monocyclic groups are condensed.

In embodiments, xd4 in Formula 501 may be 2.

In embodiments, the fluorescent dopant may include one of Compounds FD1 to FD36, DPVBi, DPAVBi, or any combination thereof:

FD1

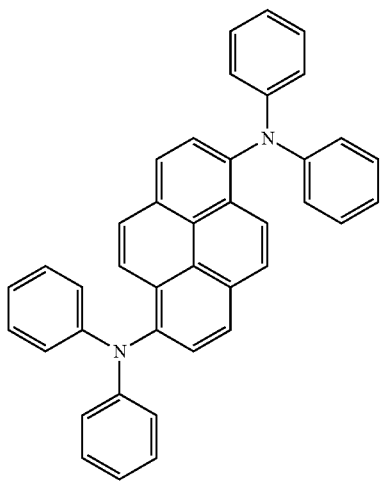

FD2

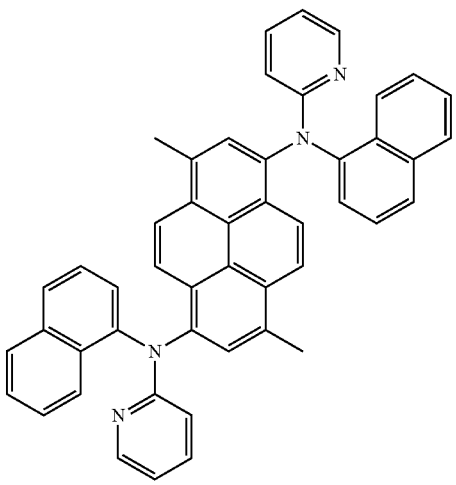

-continued
FD3
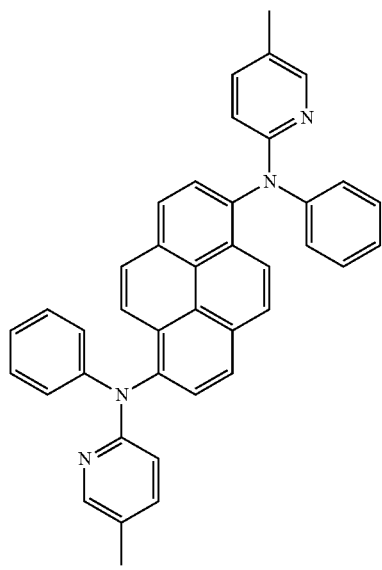
FD4
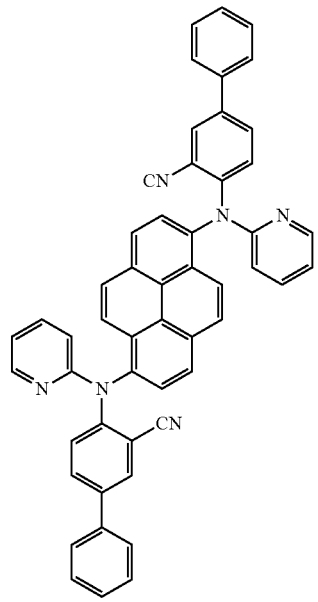
FD5
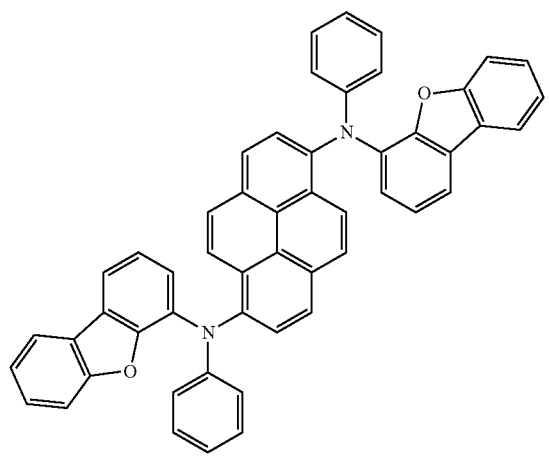
FD6
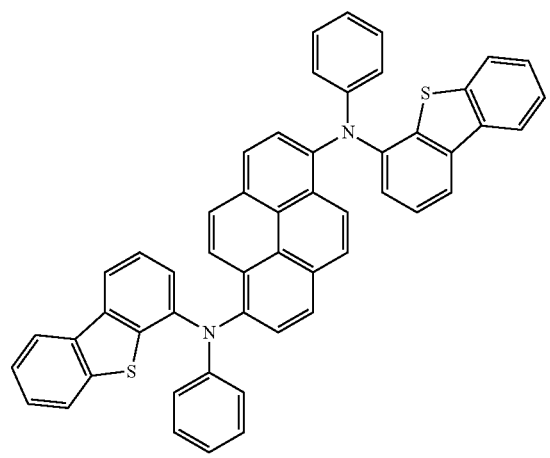
FD7
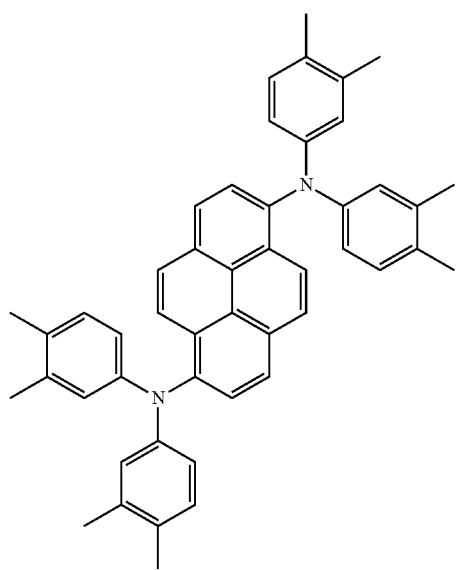
FD8
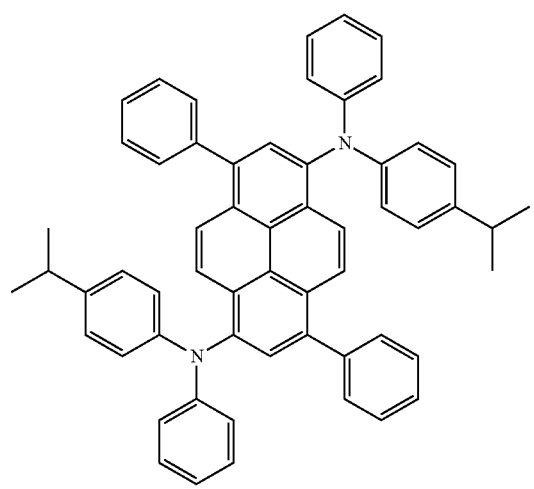

-continued
FD9
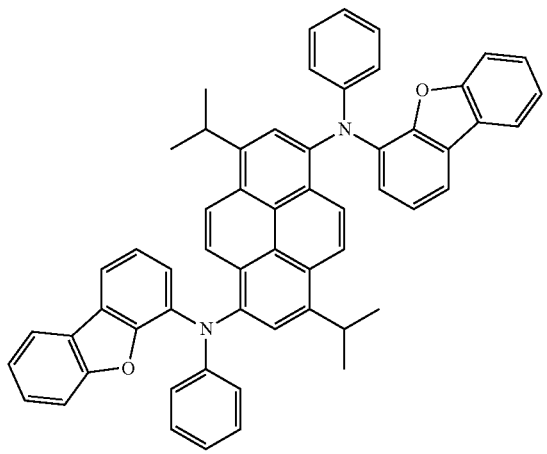
FD10
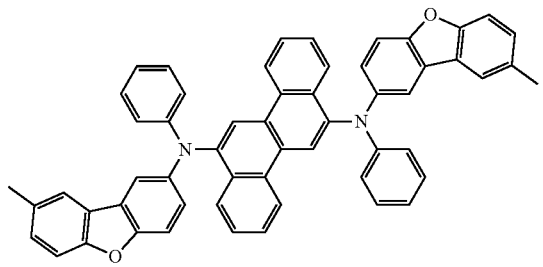
FD11
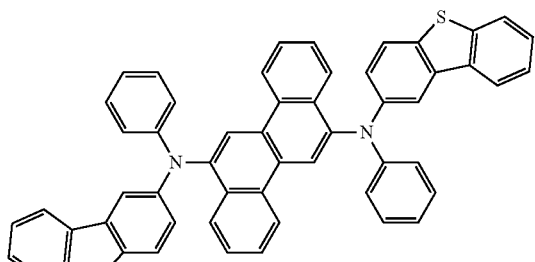
FD12
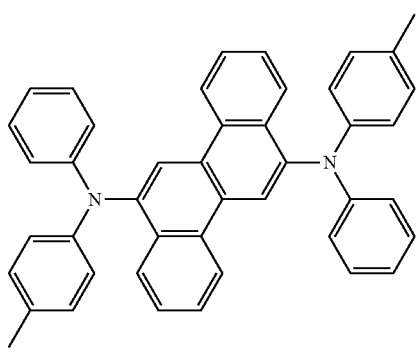
PD13
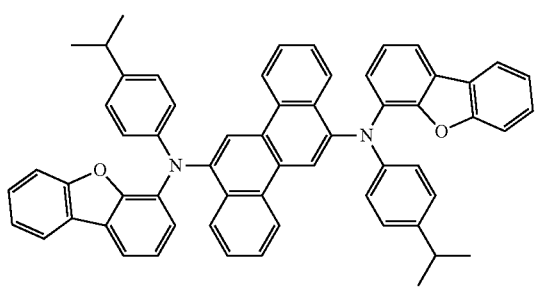
PD14
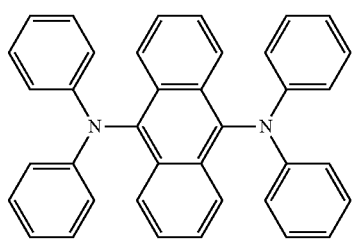
PD15
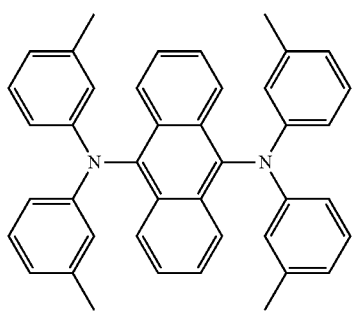
PD16
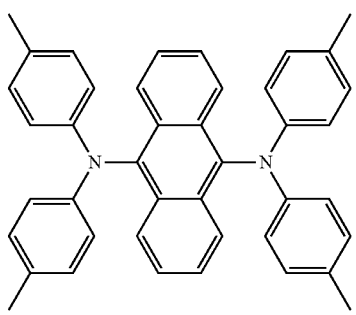

-continued
PD17
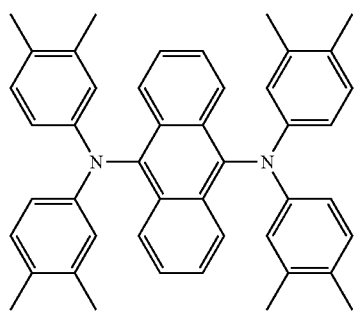
PD18
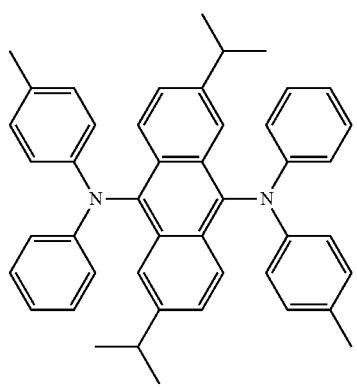
PD19
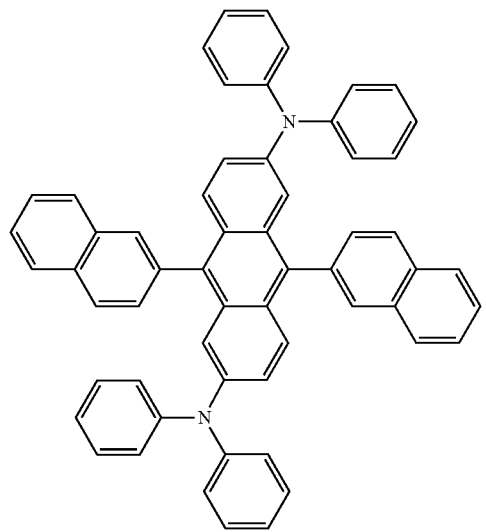
PD20
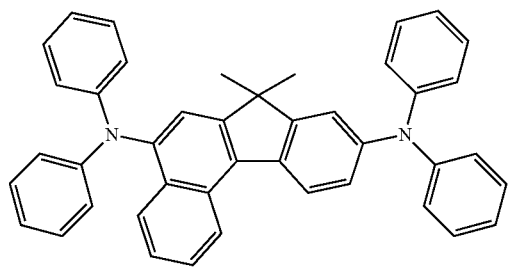
FD21
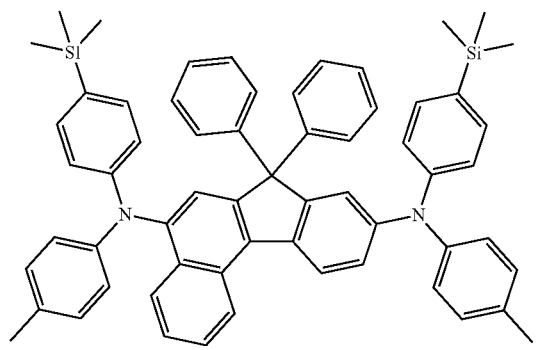
FD22
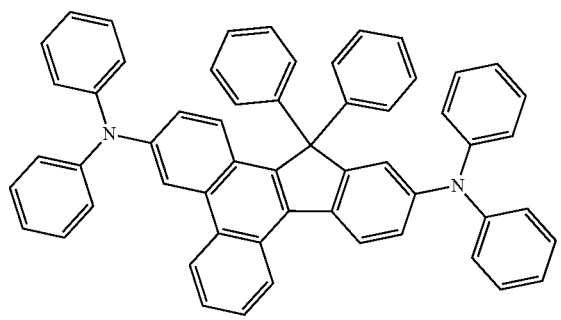

-continued
FD23
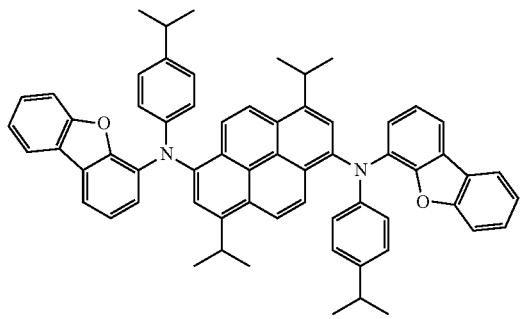
FD24
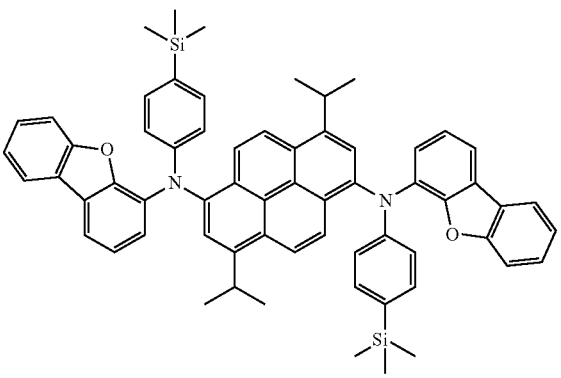
FD25
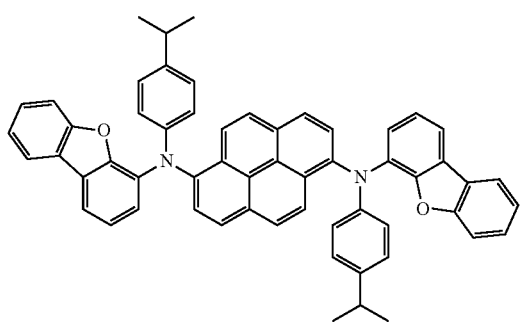
FD26
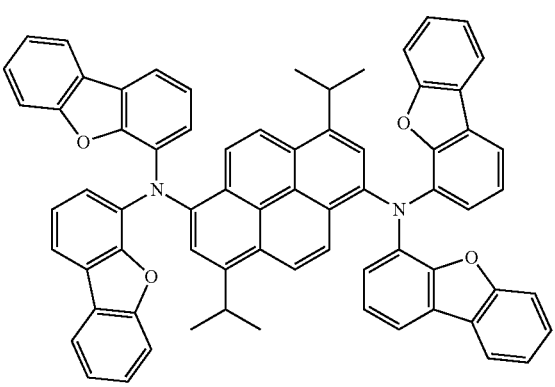
FD27
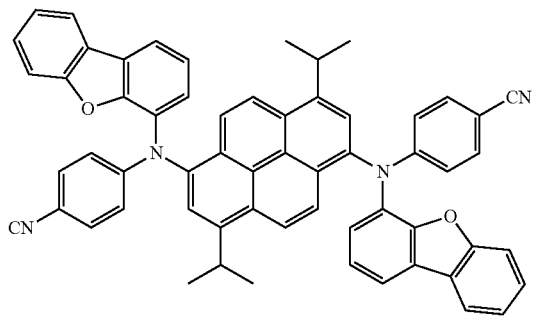
FD28
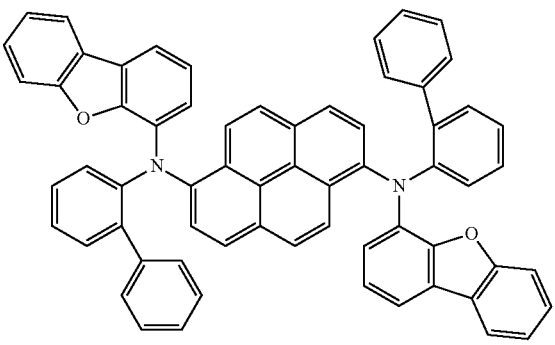
FD29
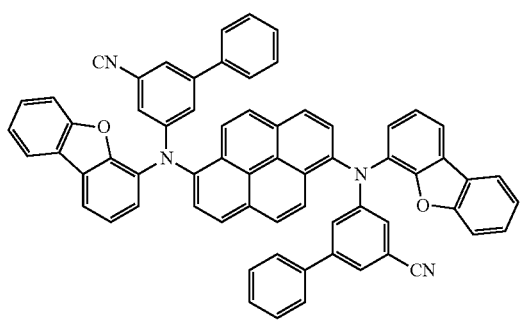
FD30
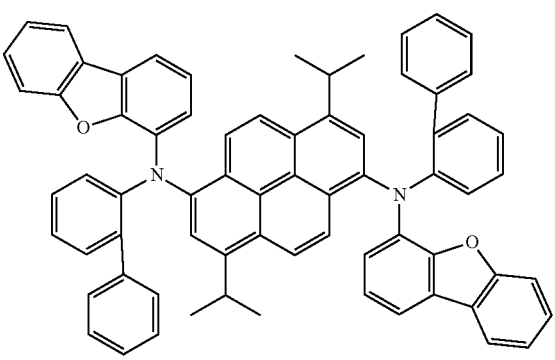

-continued
FD31
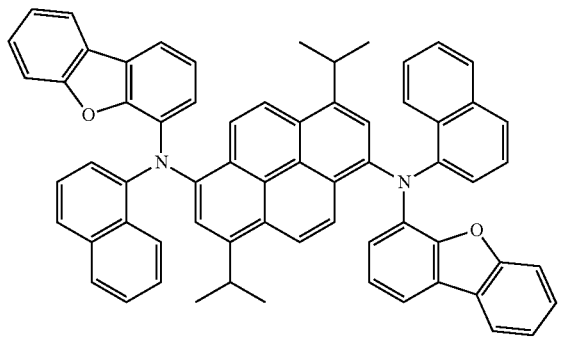
FD32
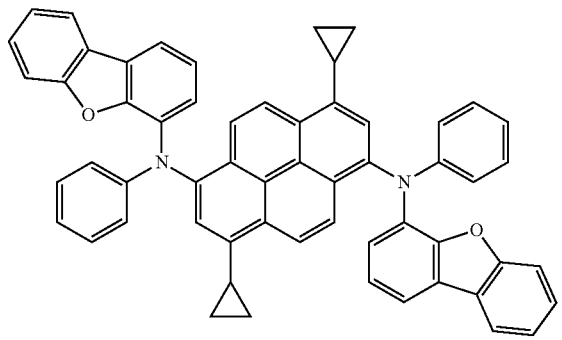
FD33
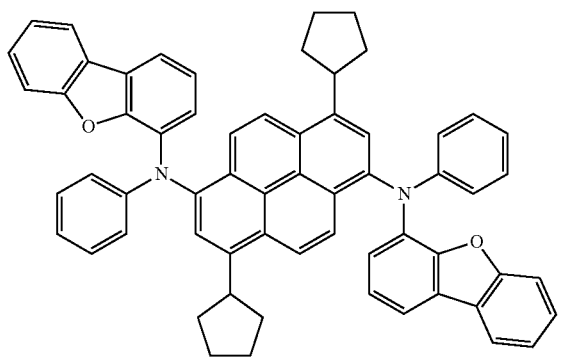
FD34
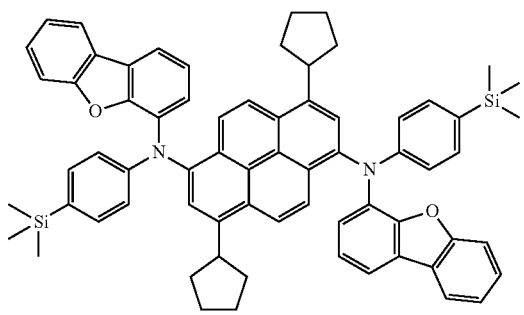
FD35
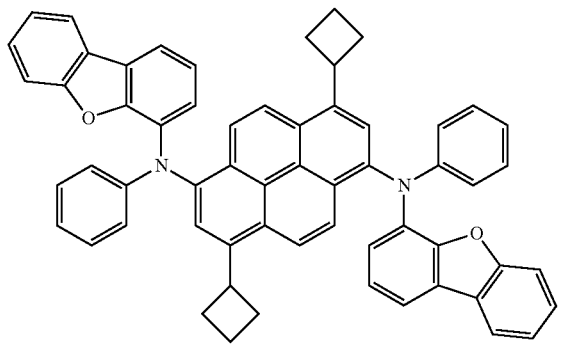
FD36
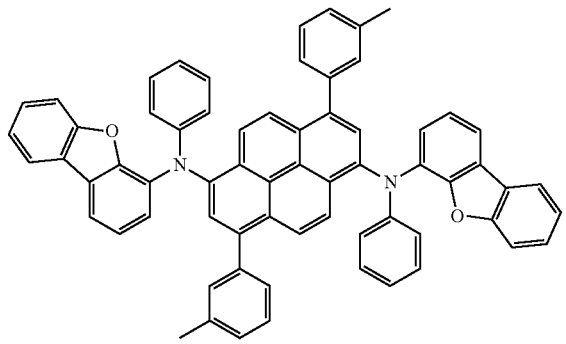
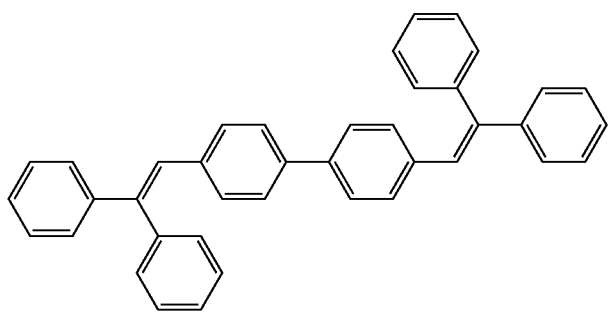
DPVBi

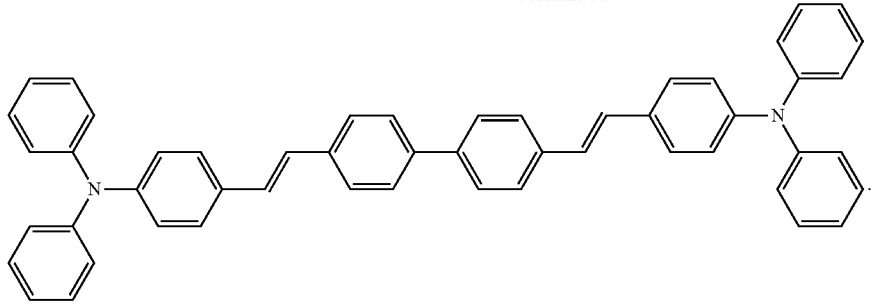

DDPAVBi

[Delayed Fluorescence Material]

The emission layer may include a delayed fluorescence material.

The delayed fluorescence material described herein may be any suitable compound that may emit delayed fluorescence according to a delayed fluorescence emission mechanism.

The delayed fluorescence material included in the emission layer may serve as a host or as a dopant, depending on types of other materials included in the emission layer.

In embodiments, a difference between a triplet energy level (eV) of the delayed fluorescence material and a singlet energy level (eV) of the delayed fluorescence material may be in a range of about 0 eV to about 0.5 eV. When the difference between a triplet energy level (eV) of the delayed fluorescence material and a singlet energy level (eV) of the delayed fluorescence material is within this range, up-conversion from a triplet state to a singlet state in the delayed fluorescence material may effectively occur, thus improving luminescence efficiency and the like of the light-emitting device 10.

In embodiments, the delayed fluorescence material may include a material including at least one electron donor (e.g., a π electron-rich $C_3$-$C_{60}$ cyclic group such as a carbazole group and the like) and at least one electron acceptor (e.g., a sulfoxide group, a cyano group, a π electron-deficient nitrogen-containing $C_1$-$C_{60}$ cyclic group, and the like); a material including a $C_8$-$C_{60}$ polycyclic group including at least two cyclic groups condensed to each other and sharing boron (B); and the like.

Examples of the delayed fluorescence material may include at least one of Compounds DF1 to DF9:

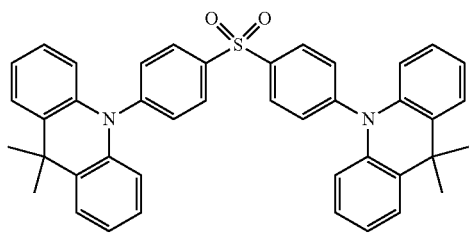

DF1(DMAC-DPS)

DF2(ACRFLCN)

DF3(ACRSA)

DF4(CC2TA)

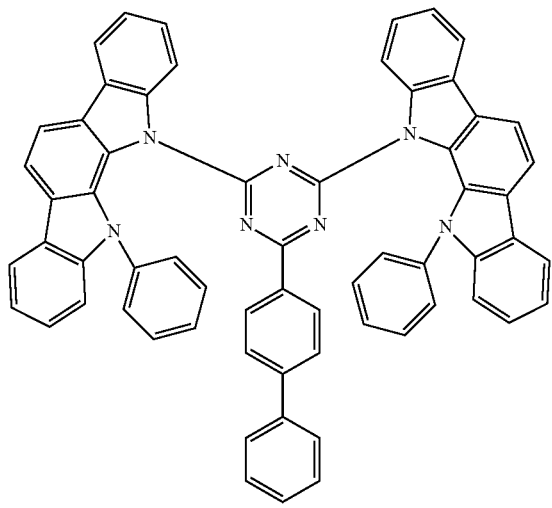

DF5(PIC-TRZ)

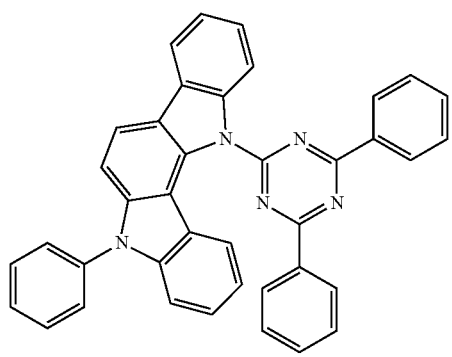

DF6(PIC-TRZ2)

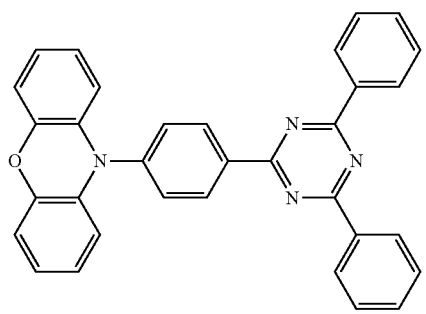

DF7(PXZ-TRZ)

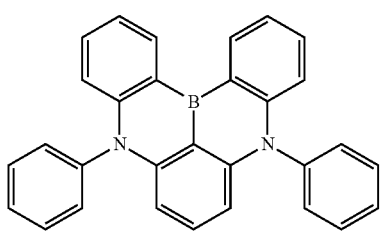

DF8(DABNA-1)

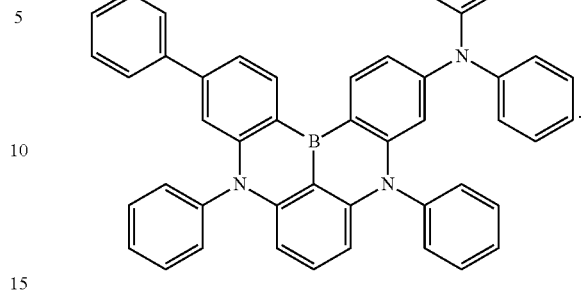

DF9(DABNA-2)

[Quantum Dots]

The emission layer may include quantum dots.

The term "quantum dot" as used herein refers to a crystal of a semiconductor compound and may include any suitable material capable of emitting light of various emission wavelengths according to a size of the crystal.

A diameter of the quantum dot may be, for example, in a range of about 1 nm to about 10 nm.

Quantum dots may be synthesized by a wet chemical process, an organic metal chemical vapor deposition process, a molecular beam epitaxy process, or any similar process.

The wet chemical process is a method of growing a quantum dot particle crystal by mixing a precursor material with an organic solvent. When the crystal grows, the organic solvent may naturally serve as a dispersant coordinated on the surface of the quantum dot crystal and control the growth of the crystal. Thus, the wet chemical method may be more readily performed than a vapor deposition process such as a metal organic chemical vapor deposition (MOCVD) or a molecular beam epitaxy (MBE) process. Further, the growth of quantum dot particles may be controlled with a lower manufacturing cost.

The quantum dot may include a Group II-VI semiconductor compound, a Group III-V semiconductor compound, a Group III-VI semiconductor compound, a Group I-III-VI semiconductor compound, a Group IV-VI semiconductor compound, a Group IV element or compound, or any combination thereof.

Examples of the Group II-VI semiconductor compound may include a binary compound such as CdS, CdSe, CdTe, ZnS, ZnSe, ZnTe, ZnO, HgS, HgSe, HgTe, MgSe, or MgS; a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound such as CdZnSeS, CdZnSeTe, CdZnSTe, CdHgSeS, CdHgSeTe, CdHgSTe, HgZnSeS, HgZnSeTe, or HgZnSTe; or any combination thereof.

Examples of the Group III-V semiconductor compound may include a binary compound such as GaN, GaP, GaAs, GaSb, AlN, AlP, AlAs, AlSb, InN, InP, InAs, or InSb; a ternary compound such as GaNP, GaNAs, GaNSb, GaPAs, GaPSb, AlNP, AlNAs, AlNSb, AlPAs, AlPSb, InGaP, InNP, InAlP, InNAs, InNSb, InPAs, or InPSb; a quaternary compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb; or any combination thereof. In embodiments, the Group III-V semiconductor compound may further include a Group II element. Examples of the Group III-V semiconductor compound further including the Group II element may include InZnP, InGaZnP, InAlZnP, and the like.

Examples of the Group III-VI semiconductor compound may include a binary compound such as GaS, GaSe, $Ga_2Se_3$, GaTe, InS, InSe, $In_2S_3$, $In_2Se_3$, InTe, and the like; a ternary compound such as $InGaS_3$, $InGaSe_3$, and the like; or any combination thereof.

Examples of the Group I-III-VI semiconductor compound may include a ternary compound such as AgInS, $AgInS_2$, CuInS, $CuInS_2$, $CuGaO_2$, $AgGaO_2$, or $AgAlO_2$; or any combination thereof.

Examples of the Group IV-VI semiconductor compound may include a binary compound such as SnS, SnSe, SnTe, PbS, PbSe, or PbTe; a ternary compound such as SnSeS, SnSeTe, SnSTe, PbSeS, PbSeTe, PbSTe, SnPbS, SnPbSe, or SnPbTe; a quaternary compound such as SnPbSSe, SnPbSeTe, or SnPbSTe; or any combination thereof.

The Group IV element or compound may be a single element material such as Si or Ge; a binary compound such as SiC or SiGe; or any combination thereof.

Individual elements included in a multi-element compound, such as a binary compound, a ternary compound, and a quaternary compound, may be present in a particle at a uniform concentration or at a non-uniform concentration.

The quantum dot may have a single structure in which the concentration of each element included in the quantum dot is uniform, or the quantum dot may have a core-shell structure. In embodiments, materials included in the core may be different from materials included in the shell.

The shell of the quantum dot may be a protective layer that prevents chemical denaturation of the core to maintain semiconductor characteristics and/or may be a charging layer that imparts electrophoretic characteristics to the quantum dot. The shell may be a monolayer or a multilayer. An interface between a core and a shell may have a concentration gradient where a concentration of an element that is present in the shell may decrease toward the core.

Examples of the shell of the quantum dot may include a metal oxide, a metalloid oxide, a nonmetal oxide, a semiconductor compound, or a combination thereof. Examples of the metal oxide, the metalloid oxide, or the nonmetal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO; a ternary compound such as $MgAl_2O_4$, $CoFe_2O_4$, $NiFe_2O_4$, or $CoMn_2O_4$; or any combination thereof. Examples of the semiconductor compound may include a Group II-VI semiconductor compound; a Group III-V semiconductor compound; a Group III-VI semiconductor compound; a Group I-III-VI semiconductor compound; a Group IV-VI semiconductor compound; or any combination thereof. In embodiments, the semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

The quantum dot may have a full width of half maximum (FWHM) of a spectrum of an emission wavelength equal to or less than about 45 nm. For example, the quantum dot may have a FWHM of a spectrum of an emission wavelength equal to or less than about 40 nm. For example, the quantum dot may have a FWHM of a spectrum of an emission wavelength equal to or less than about 30 nm. When the FWHM of the quantum dot is within these ranges, color purity or color reproducibility may be improved. Light emitted through the quantum dots may be emitted in all directions, and thus an optical viewing angle may be improved.

The quantum dot may be a spherical particle, a pyramidal particle, a multi-arm particle, a cubic particle, a nanoparticle, a nanotube, a nanowire, a nanofiber, or a nanoplate.

By adjusting the size of the quantum dot, the energy band gap may also be adjusted, thereby obtaining light of various wavelengths in the quantum dot emission layer. By using quantum dots of various sizes, a light-emitting device that may emit light of various wavelengths may be realized. In embodiments, the size of the quantum dot may be selected such that the quantum dot may emit red light, green light, and/or blue light. A size of the quantum dot may be selected such that the quantum dot may emit white light by combining light of various colors.

[Electron Transport Region in Interlayer 130]

The electron transport region may have a structure consisting of a layer consisting of a single material, a structure consisting of a layer including different materials, or a multi-layered structure having layers including different materials.

The electron transport region may include an electron transport layer. The electron transport region may further include a hole blocking layer, an electron injection layer, or any combination thereof.

The electron transport layer may be prepared by a preparation method using an ink composition for a light-emitting device, wherein the ink composition may include a phosphine oxide-based charge transporting organic material, a first solvent represented by Formula 1, a second solvent represented by Formula 2, and a third solvent that may be polar aprotic.

In embodiments, the electron transport region may have an electron transport layer/electron injection layer structure or a hole blocking layer/electron transport layer/electron injection layer structure, wherein layers of each structure may be stacked on the emission layer in its respective stated order.

The electron transport region (e.g., a hole blocking layer or an electron transport layer in the electron transport region) may include a metal-free compound including at least one π electron-deficient nitrogen-containing $C_1$-$C_{60}$ cyclic group.

In embodiments, the electron transport region may include a compound represented by Formula 601:

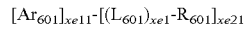

[Formula 601]

In Formula 601,

Ar$_{601}$ and L$_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{601}$)($Q_{602}$)($Q_{603}$), —C(=O)($Q_{601}$), —S(=O)$_2$($Q_{601}$), or —P(=O)($Q_{601}$)($Q_{602}$), wherein $Q_{601}$ to $Q_{603}$ may each independently be the same as described in connection with $Q_1$, xe21 may be 1, 2, 3, 4, or 5, and at least one of Ar$_{601}$, L$_{601}$, and R$_{601}$ may each independently be a π electron-deficient nitrogen-containing $C_1$-$C_{60}$ cyclic group unsubstituted or substituted with at least one $R_{10a}$.

For example, in Formula 601, when xe11 is 2 or greater, at least two $Ar_{601}(s)$ may be bound to each other via a single bond.

In embodiments, in Formula 601, $Ar_{601}$ may be a substituted or unsubstituted anthracene group.

In embodiments, the electron transport region may include a compound represented by Formula 601-1:

[Formula 601-1]

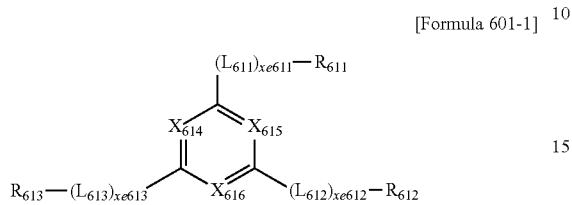

In Formula 601-1, $X_{614}$ may be N or $C(R_{614})$, $X_{615}$ may be N or $C(R_{615})$, $X_{616}$ may be N or $C(R_{616})$, and at least one of $X_{614}$ to $X_{616}$ may be N, $L_{611}$ to $L_{613}$ may each independently be the same as described in connection with $L_{601}$, xe611 to xe613 may each independently be the same as described in connection with xe1, $R_{611}$ to $R_{613}$ may each independently be the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, in Formulae 601 and 601-1, xe1 and xe611 to xe613 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), $Alq_3$, BAlq, TAZ, NTAZ, or any combination thereof:

ET1

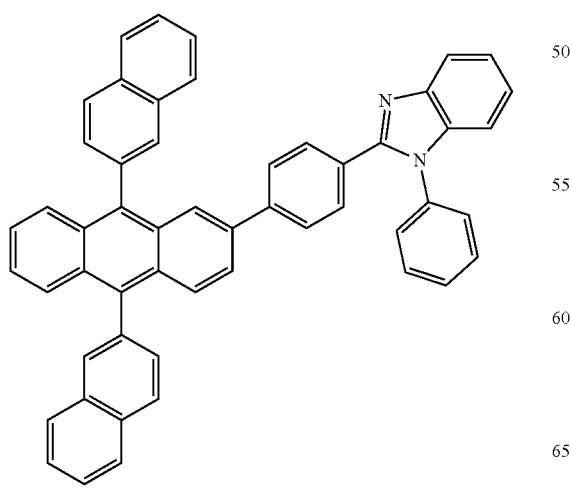

-continued

ET2

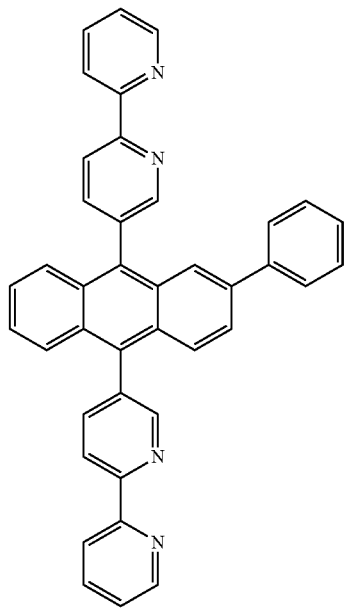

ET3

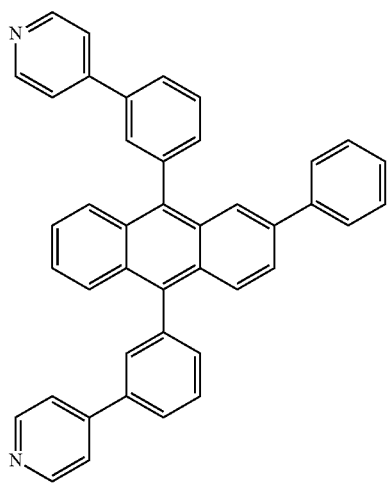

ET4

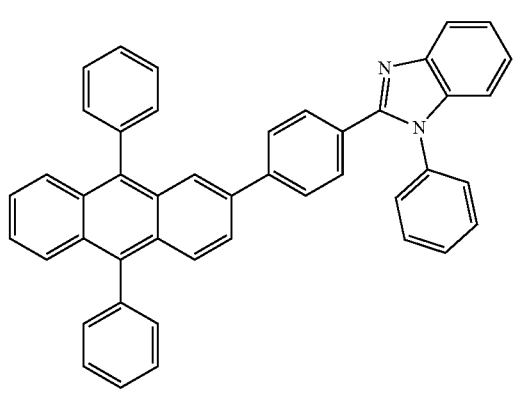

-continued
ET5
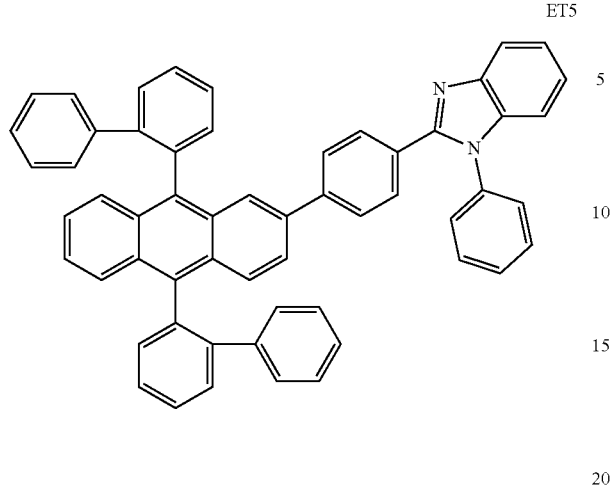
ET6
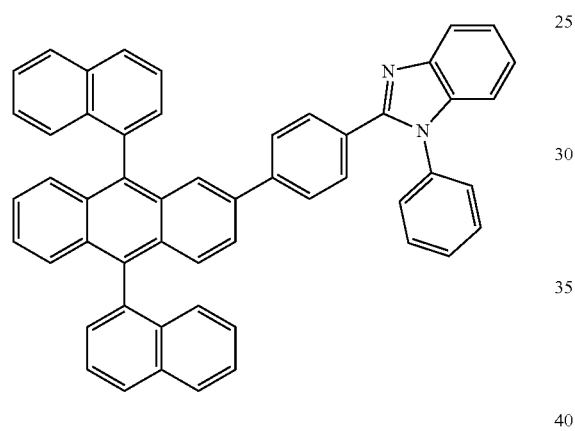
ET7
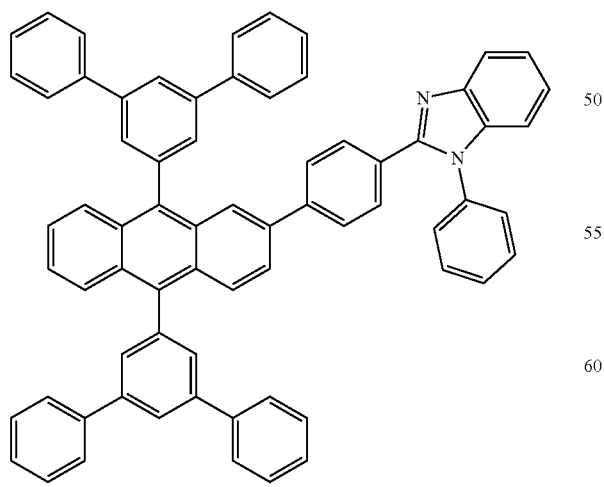
-continued
ET8
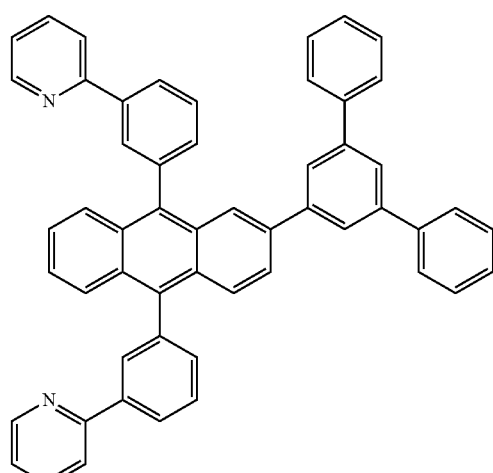
ET9
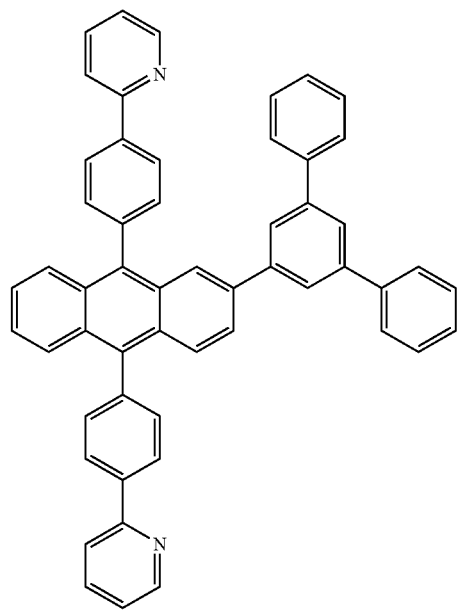

ET10
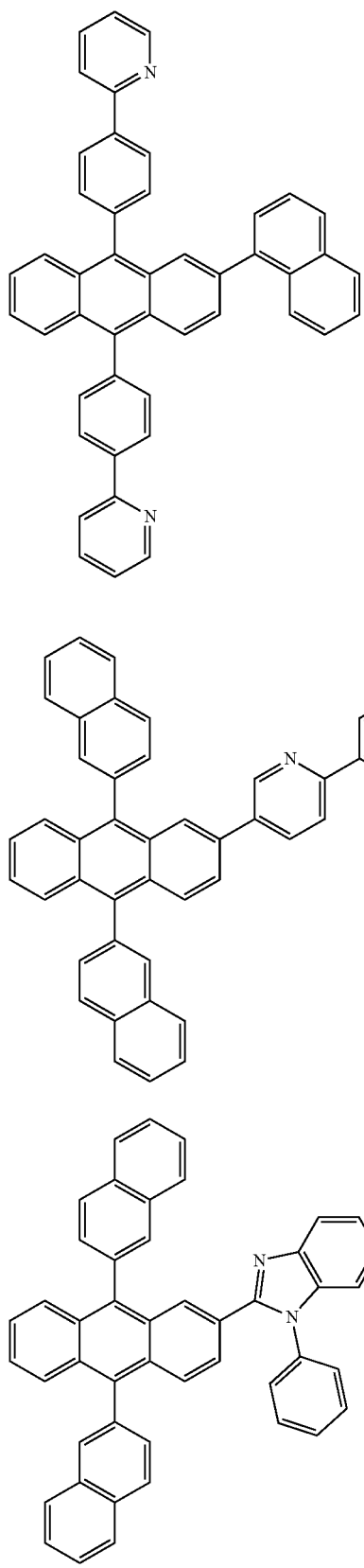
ET11
ET12
ET13
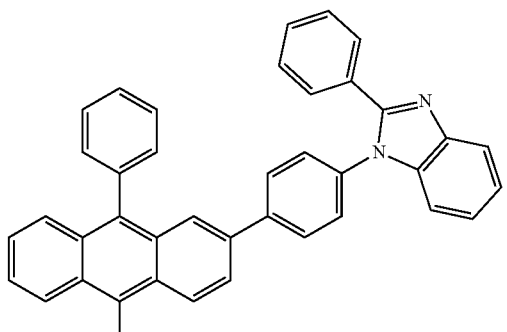
ET14
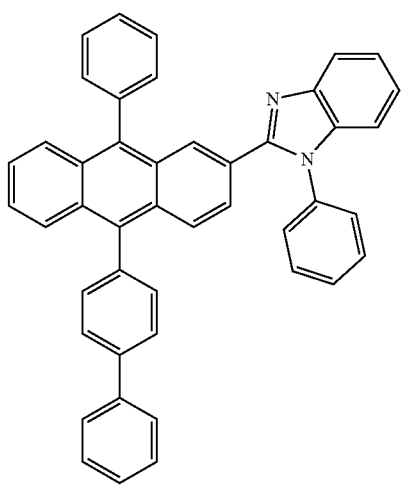
ET15
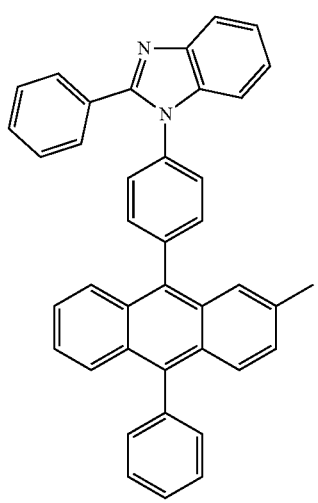

ET16
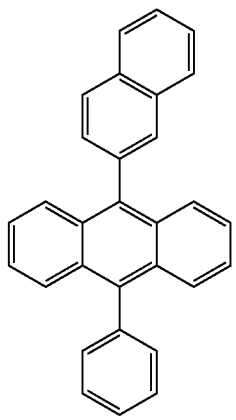
ET17
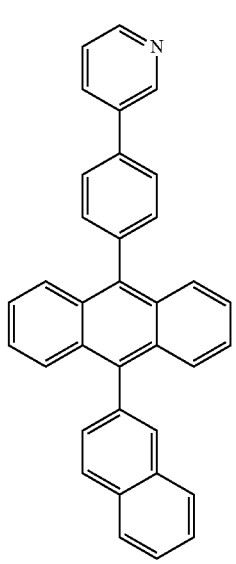
ET18
ET19
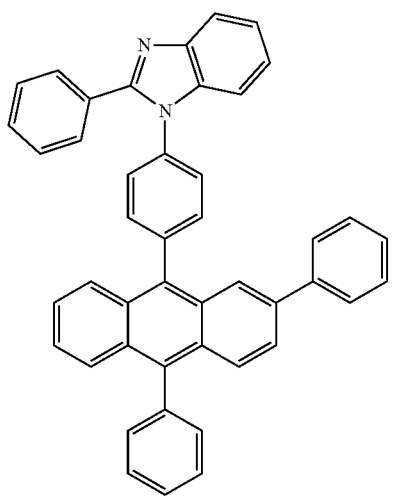
ET20
ET21
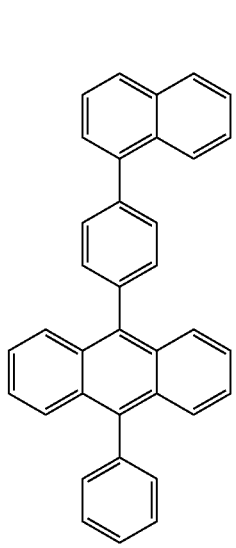
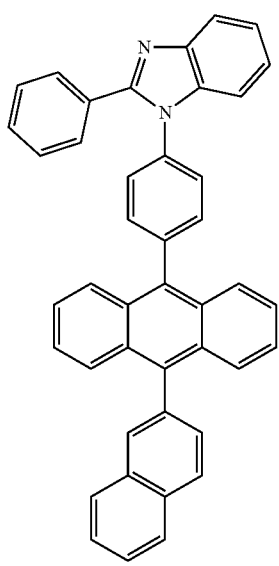
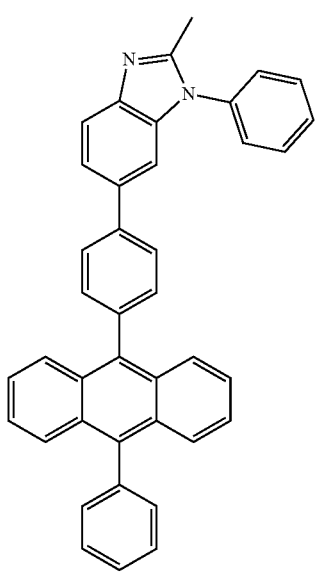

ET22
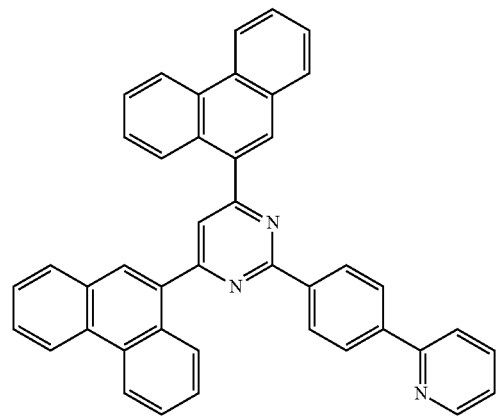
ET23
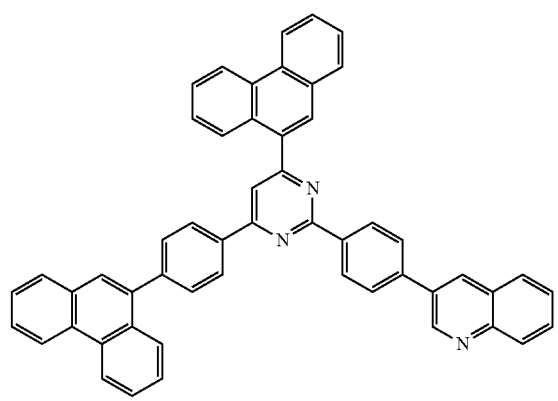
ET24
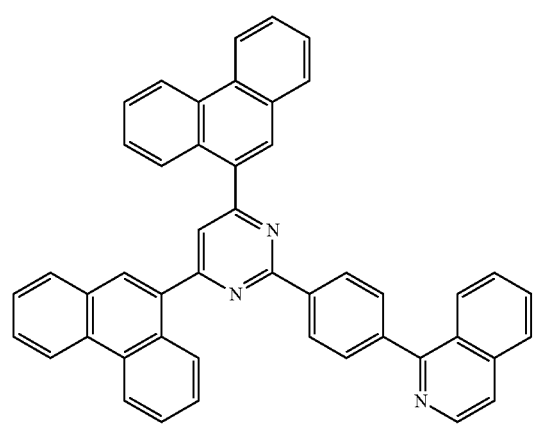
ET25
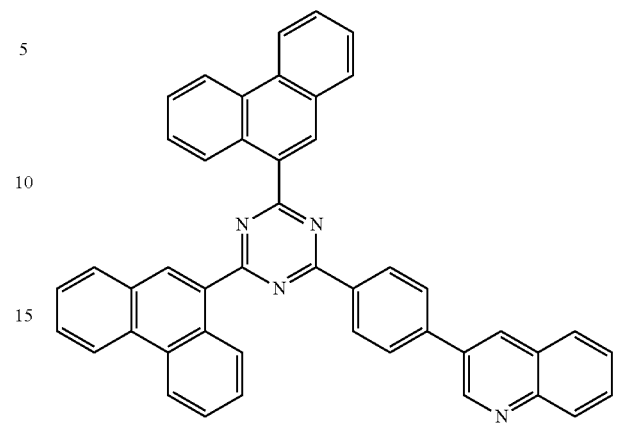
ET26
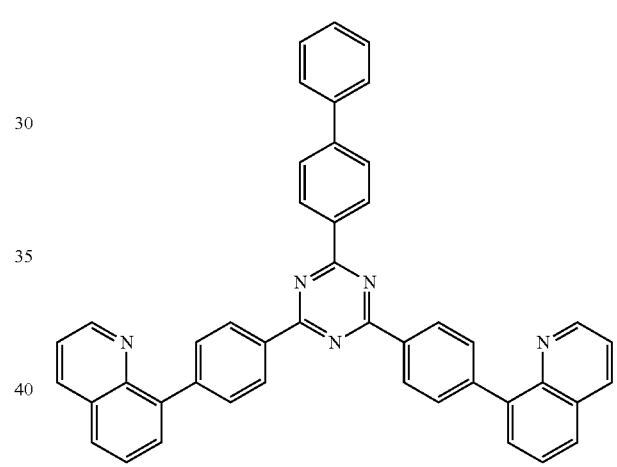
ET27
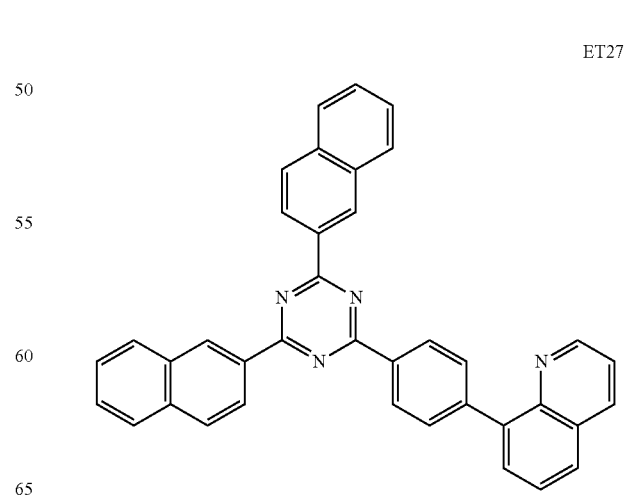

ET28
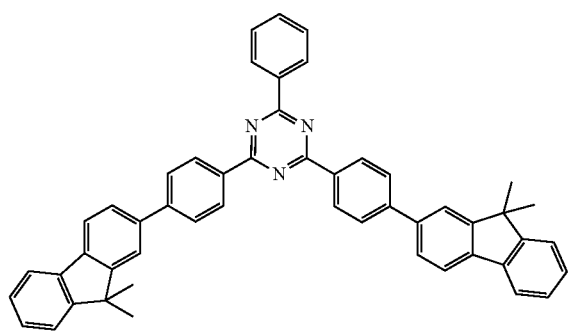
ET29
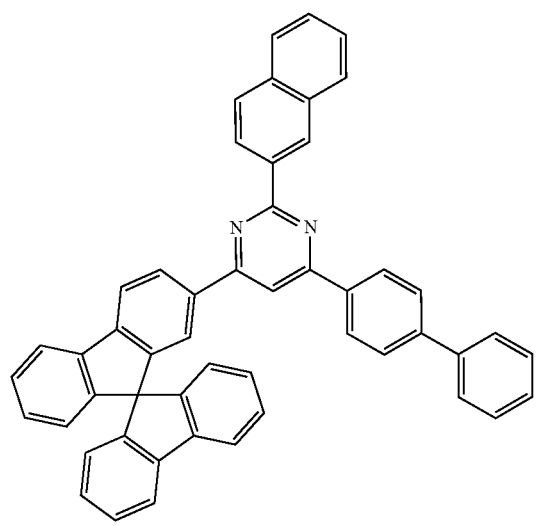
ET30
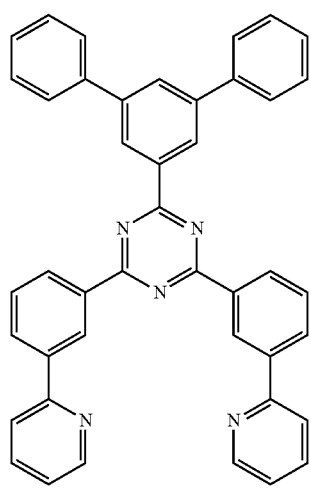
ET31
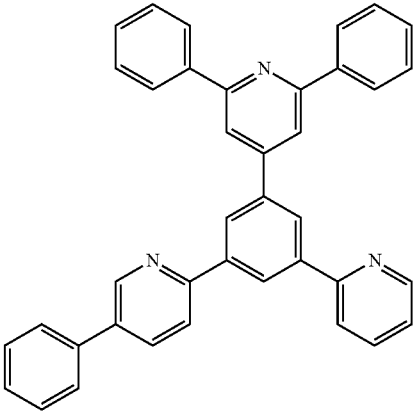
ET32
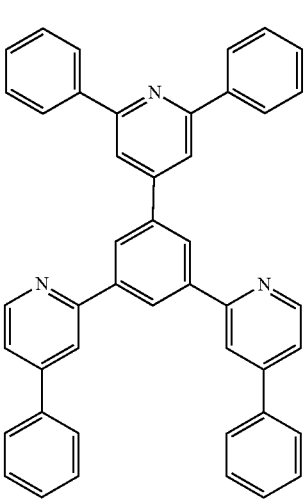
ET33
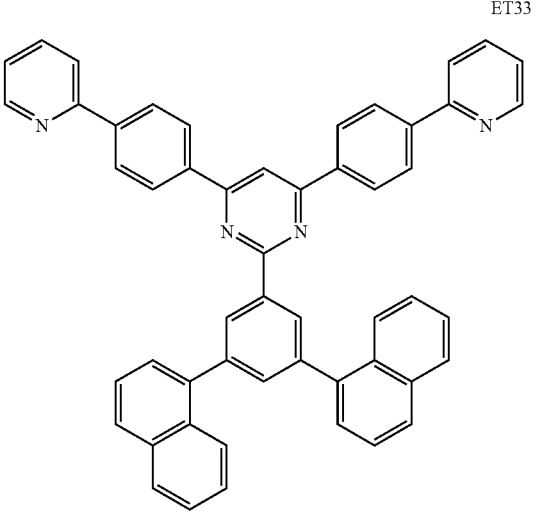

ET34
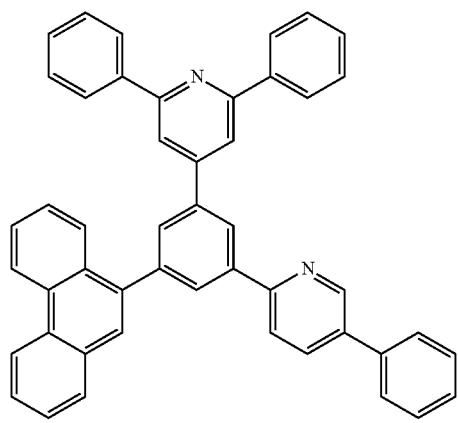
ET38
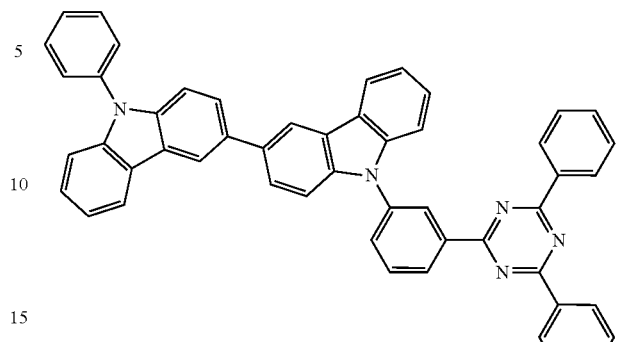
ET35
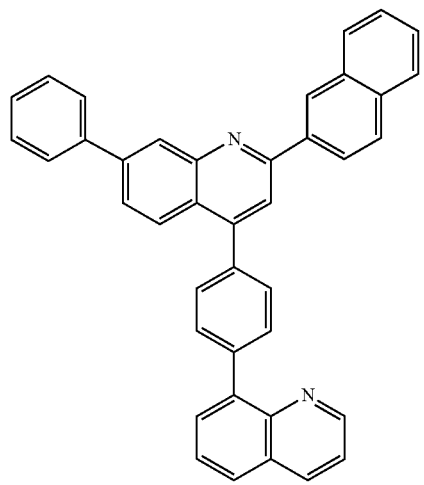
ET39
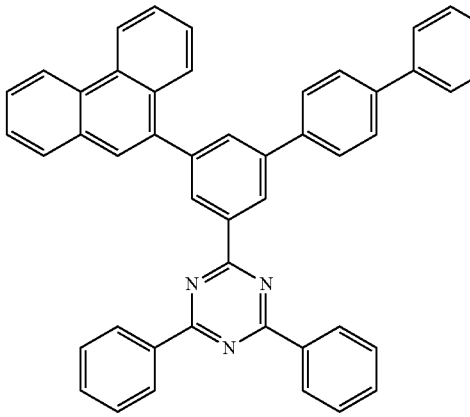
ET36
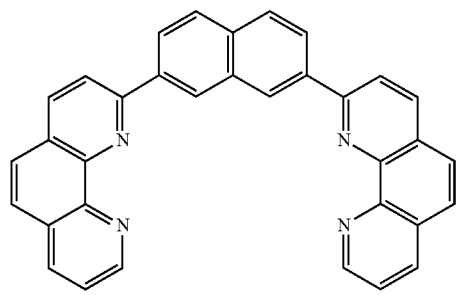
ET37
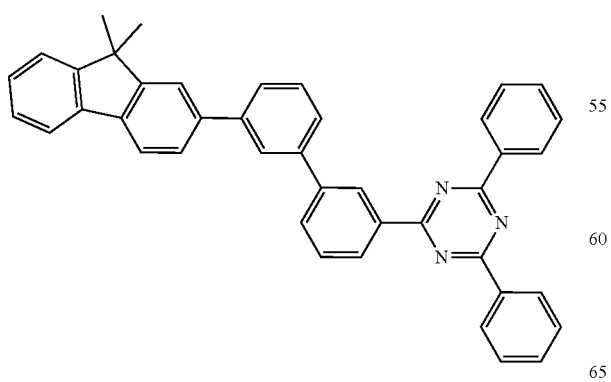
ET40
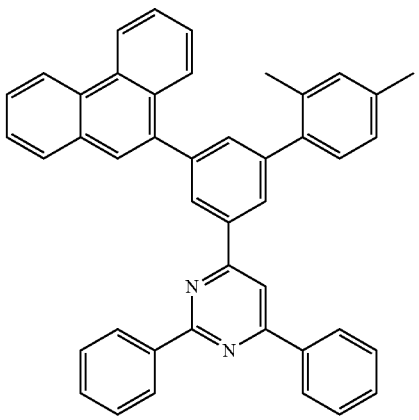

ET41
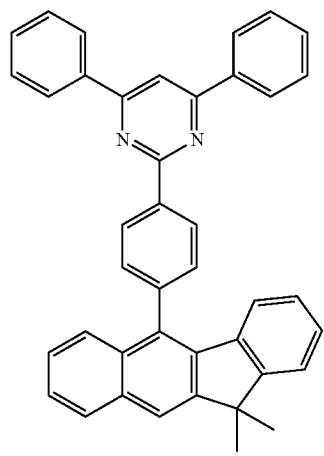
ET42
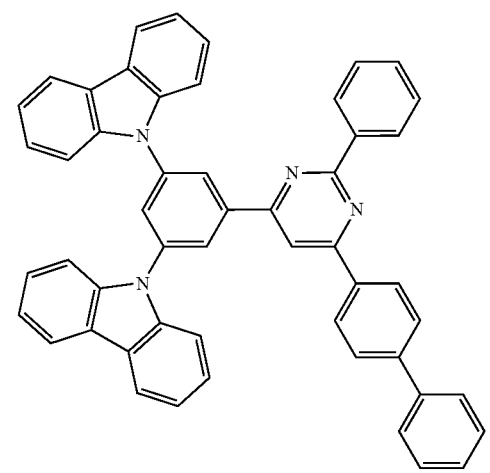
ET43
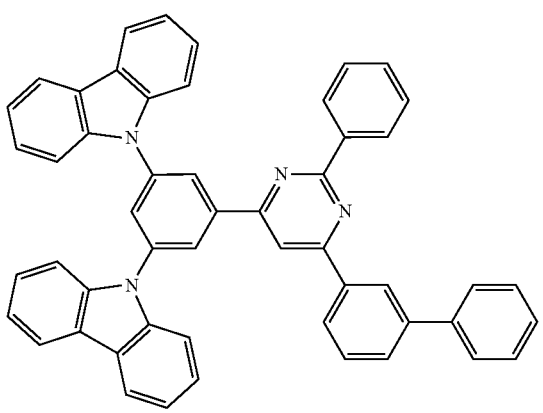
ET44
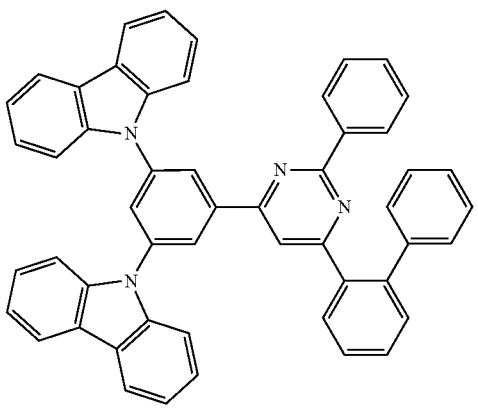
ET45
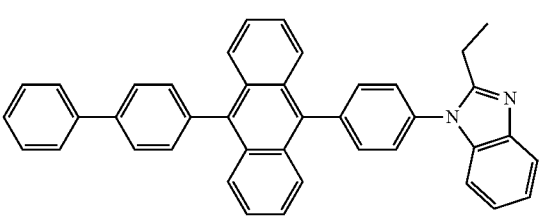
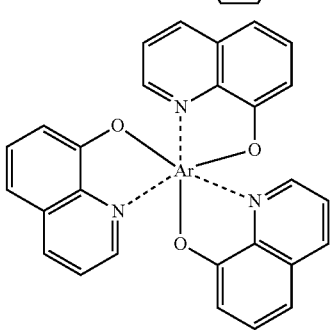
Alq₃
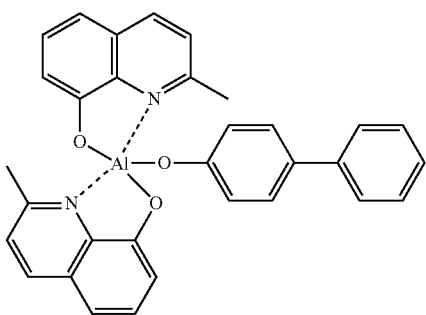
BAlq
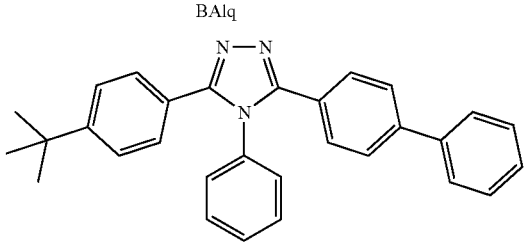
TAZ -continued

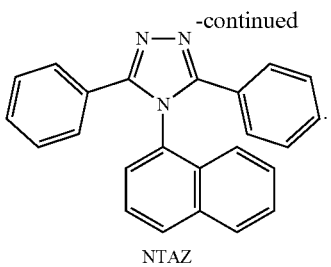

NTAZ

A thickness of the electron transport region may be in a range of about 100 Angstroms (Å) to about 5,000 Å. For example, the thickness of the electron transport region may be in a range of about 160 Å to about 4,000 Å. When the electron transport region includes a hole blocking layer, an electron transport layer, or any combination thereof, a thickness of the hole blocking layer may be in a range of about 20 Å to about 1,000 Å, and a thickness of the electron transport layer may be in a range of about 100 Å to about 1,000 Å. For example, the thickness of the hole blocking layer may be in a range of about 30 Å to about 300 Å. For example, the thickness of the electron transport layer may be in a range of about 150 Å to about 500 Å. When the thickness of the hole blocking layer and/or the electron transport layer is within any of these ranges, excellent electron transport characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. A metal ion of the alkali metal complex may be a lithium (Li) ion, a sodium (Na) ion, a potassium (K) ion, a rubidium (Rb) ion, or a cesium (Cs) ion. A metal ion of the alkaline earth metal complex may be a beryllium (Be) ion, a magnesium (Mg) ion, a calcium (Ca) ion, a strontium (Sr) ion, or a barium (Ba) ion. For example, the metal-containing material may be a Li-based compound or a Ca-based compound. Each ligand coordinated with the metal ion of the alkali metal complex or the metal ion of the alkaline earth metal complex may each independently be hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, cyclopentadiene, or any combination thereof.

For example, the metal-containing material may include a Li complex. The Li complex may include, e.g., Compound ET-D1 (LiQ) or Compound ET-D2:

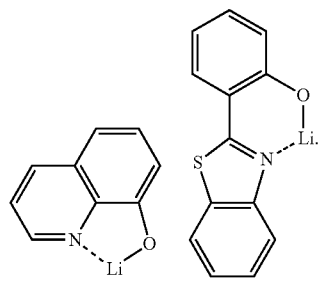

ET-D1      ET-D2

The electron transport region may include an electron injection layer that facilitates the injection of electrons from the second electrode 150. The electron injection layer may directly contact the second electrode 150.

The electron injection layer may have a structure consisting of a layer consisting of a single material, a structure consisting of a layer including different materials, or a multi-layered structure having layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may be Li, Na, K, Rb, Cs, or any combination thereof. The alkaline earth metal may be Mg, Ca, Sr, Ba, or any combination thereof. The rare earth metal may be Sc, Y, Ce, Tb, Yb, Gd, or any combination thereof.

The alkali metal-containing compound, the alkaline earth metal-containing compound, and the rare earth metal-containing compound may respectively be oxides, halides (e.g., fluorides, chlorides, bromides, or iodides), tellurides, or any combination thereof of each of the alkali metal, the alkaline earth metal, and the rare earth metal.

The alkali metal-containing compound may include alkali metal oxides such as $Li_2O$, $Cs_2O$, or $K_2O$, alkali metal halides such as LiF, NaF, CsF, KF, LiI, NaI, CsI, or KI, or any combination thereof. The alkaline earth-metal-containing compound may include alkaline earth-metal oxides, such as BaO, SrO, CaO, $Ba_xSr_{1-x}O$ (wherein x is a real number satisfying 0<x<1), or $Ba_xCa_{1-x}O$ (wherein x is a real number satisfying 0<x<1). The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In embodiments, the rare earth metal-containing compound may include a lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth metal complex, and the rare earth metal complex may include one of ions of the alkali metal, ions of the alkaline earth metal, and ions of the rare earth metal described above, and a ligand bonded to the metal ion, e.g., hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, cyclopentadiene, or any combination thereof.

The electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In embodiments, the electron injection layer may further include an organic material (e.g., a compound represented by Formula 601).

In embodiments, the electron injection layer may consist of an alkali metal-containing compound (e.g., alkali metal halide); or an alkali metal-containing compound (e.g., alkali metal halide), and an alkali metal, an alkaline earth metal, a rare earth metal, or any combination thereof. In embodiments, the electron injection layer may be a KI:Yb co-deposition layer, a RbI:Yb co-deposition layer, or the like.

When the electron injection layer further includes an organic material, the alkali metal, the alkaline earth metal, the rare earth metal, the alkali metal-containing compound, the alkaline earth metal-containing compound, the rare earth metal-containing compound, the alkali metal complex, the alkaline earth metal complex, the rare earth metal complex, or any combination thereof may be homogeneously or non-homogeneously dispersed in a matrix including the organic material.

A thickness of the electron injection layer may be in a range of about 1 Å to about 100 Å. For example, the thickness of the electron injection layer may be in a range of about 3 Å to about 90 Å. When the thickness of the electron injection layer is within any of these ranges, excellent electron injection characteristics may be obtained without a substantial increase in driving voltage.

[Second Electrode 150]

The second electrode 150 may be on the interlayer 130. In an embodiment, the second electrode 150 may be a cathode that is an electron injection electrode. In an embodiment, a material for forming the second electrode 150 may be a material having a low work function, for example, a metal, an alloy, an electrically conductive compound, or any combination thereof.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure, or a structure including two or more layers.

[Capping Layer]

A first capping layer may be located outside the first electrode 110, and/or a second capping layer may be located outside the second electrode 150. In embodiments, the light-emitting device 10 may have a structure in which the first capping layer, the first electrode 110, the interlayer 130, and the second electrode 150 are stacked in this stated order, a structure in which the first electrode 110, the interlayer 130, the second electrode 150, and the second capping layer are stacked in this stated order, or a structure in which the first capping layer, the first electrode 110, the interlayer 130, the second electrode 150, and the second capping layer are stacked in this stated order.

In the light-emitting device 10, light emitted from the emission layer in the interlayer 130 may pass through the first electrode 110 (which may be a semi-transmissive electrode or a transmissive electrode) and through the first capping layer to the outside. In the light-emitting device 10, light emitted from the emission layer in the interlayer 130 may pass through the second electrode 150 (which may be a semi-transmissive electrode or a transmissive electrode) and through the second capping layer to the outside.

The first capping layer and the second capping layer may each improve the external luminescence efficiency based on the principle of constructive interference. Accordingly, the optical extraction efficiency of the light-emitting device 10 may be increased, thus improving the luminescence efficiency of the light-emitting device 10.

The first capping layer and the second capping layer may each include a material having a refractive index equal to or greater than about 1.6 or higher (at a wavelength of about 589 nm).

The first capping layer and the second capping layer may each independently be a capping layer including an organic material, an inorganic capping layer including an inorganic material, or an organic-inorganic composite capping layer including an organic material and an inorganic material.

At least one of the first capping layer and the second capping layer may each independently include carbocyclic compounds, heterocyclic compounds, amine group-containing compounds, porphine derivatives, phthalocyanine derivatives, naphthalocyanine derivatives, alkali metal complexes, alkaline earth metal complexes, or any combination thereof. The carbocyclic compound, the heterocyclic compound, and the amine group-containing compound may each independently be optionally substituted with a substituent including O, N, S, Se, Si, F, Cl, Br, I, or any combination thereof.

In embodiments, at least one of the first capping layer and the second capping layer may each independently include an amine group-containing compound.

In embodiments, at least one of the first capping layer and the second capping layer may each independently include a compound represented by Formula 201, a compound represented by Formula 202, or any combination thereof.

In embodiments, at least one of the first capping layer and the second capping layer may each independently include one of Compounds HT28 to HT33, one of Compounds CP1 to CP6, β-NPB, or any combination thereof:

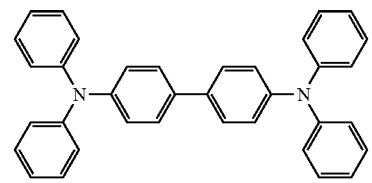

CP1

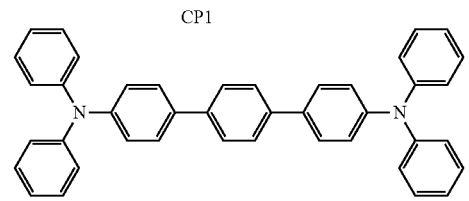

CP2

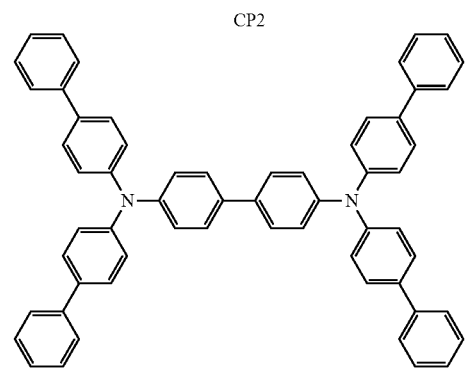

CP3

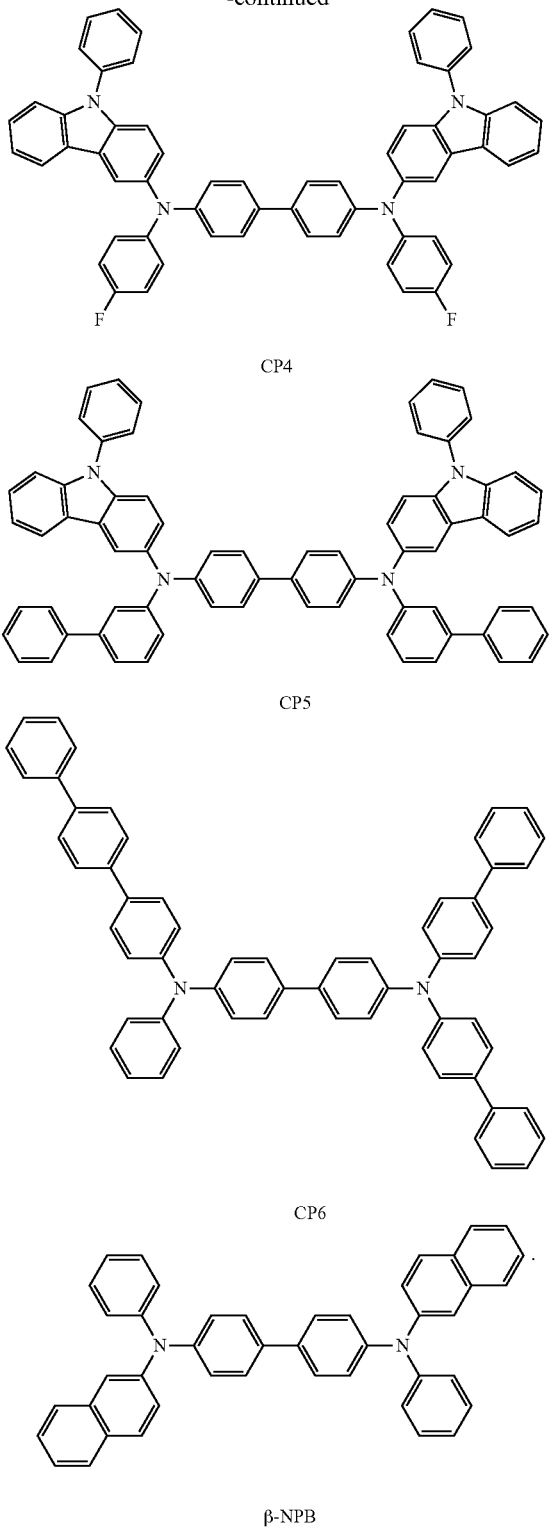

CP4

CP5

CP6

β-NPB

[Electronic Apparatus]

The light-emitting device may be included in various electronic apparatuses. In embodiments, an electronic apparatus including the light-emitting device may be a light-emitting apparatus or an authentication apparatus.

The electronic apparatus (e.g., a light-emitting apparatus) may further include, in addition to the light-emitting device, a color filter, a color-conversion layer, or a color filter and a color-conversion layer. The color filter and/or the color-conversion layer may be disposed on at least one traveling direction of light emitted from the light-emitting device. For example, light emitted from the light-emitting device may be blue light. The light-emitting device may be understood by referring to the descriptions provided herein. In embodiments, the color-conversion layer may include quantum dots. The quantum dot may be, for example, a quantum dot as described herein.

The electronic apparatus may include a first substrate. The first substrate may include sub-pixels, the color filter may include color filter areas respectively corresponding to the sub-pixels, and the color-conversion layer may include color-conversion areas respectively corresponding to the sub-pixels.

A pixel-defining film may be located between the sub-pixels to define each sub-pixel.

The color filter may further include color filter areas and light-blocking patterns between the color filter areas, and the color-conversion layer may further include color-conversion areas and light-blocking patterns between the color-conversion areas.

The color filter areas (or the color-conversion areas) may include a first area emitting first color light, a second area emitting second color light, and/or a third area emitting third color light, and the first color light, the second color light, and/or the third color light may have different maximum emission wavelengths. In embodiments, the first color light may be red light, the second color light may be green light, and the third color light may be blue light. In embodiments, the color filter areas (or the color-conversion areas) may each include quantum dots. In embodiments, the first area may include red quantum dots, the second area may include green quantum dots, and the third area may not include a quantum dot. The quantum dot may be understood by referring to the description of the quantum dot provided herein. The first area, the second area, and/or the third area may each further include a scatterer.

In embodiments, the light-emitting device may emit first light, the first area may absorb the first light to emit 1-1 color light, the second area may absorb the first light to emit 2-1 color light, and the third area may absorb the first light to emit 3-1 color light. In an embodiment, the 1-1 color light, the 2-1 color light, and the 3-1 color light may each have a different maximum emission wavelength. In embodiments, the first light may be blue light, the 1-1 color light may be red light, the 2-1 color light may be green light, and the 3-1 light may be blue light.

The electronic apparatus may further include a thin-film transistor, in addition to the light-emitting device. The thin-film transistor may include a source electrode, a drain electrode, and an active layer, wherein one of the source electrode and the drain electrode may be electrically connected to one of the first electrode and the second electrode of the light-emitting device.

The thin-film transistor may further include a gate electrode, a gate insulating film, or the like.

The active layer may include a crystalline silicon, an amorphous silicon, an organic semiconductor, and an oxide semiconductor.

The electronic apparatus may further include an encapsulation unit for sealing the light-emitting device. The encapsulation unit may be located between the color filter and/or the color-conversion layer and the light-emitting device. The encapsulation unit may allow light to pass to the outside from the light-emitting device and may prevent air and/or moisture from permeating into the light-emitting device at the same time. The encapsulation unit may be a sealing substrate including transparent glass or a plastic substrate. The encapsulation unit may be a thin-film encapsulating layer including at least one of an organic layer and/or an inorganic layer. When the encapsulation unit is a thin-film encapsulating layer, the electronic apparatus may be flexible.

Various functional layers may be disposed on the encapsulation unit in addition to the color filter and/or the color-conversion layer, depending on a use of an electronic apparatus. Examples of the functional layer may include a touch screen layer, a polarizing layer, an authentication apparatus, and the like. The touch screen layer may be a resistive touch screen layer, a capacitive touch screen layer, or an infrared beam touch screen layer. The authentication apparatus may be, for example, a biometric authentication apparatus that identifies an individual according to biometric information (e.g., a fingertip, a pupil, or the like).

The authentication apparatus may further include a biometric information collecting unit, in addition to the light-emitting device described above.

The electronic apparatus may be applicable to various displays, such as an optical source, lighting, a personal computer (e.g., a mobile personal computer), a cellphone, a digital camera, an electronic note, an electronic dictionary, an electronic game console, a medical device (e.g., an electronic thermometer, a blood pressure meter, a glucometer, a pulse measuring device, a pulse wave measuring device, an electrocardiograph recorder, an ultrasonic diagnosis device, or an endoscope display device), a fish finder, various measurement devices, gauges (e.g., gauges of an automobile, an airplane, or a ship), and a projector.

Figure 2:
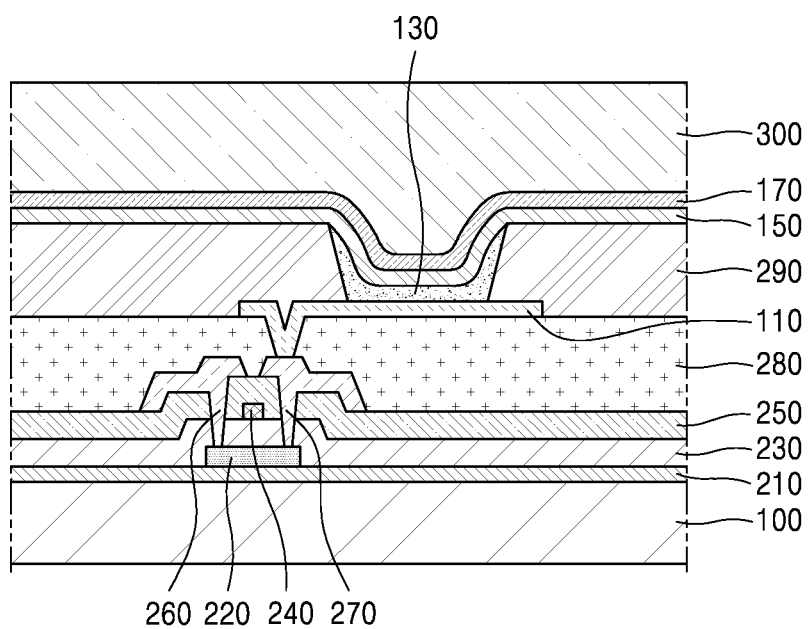
FIG. 2 is a schematic cross-sectional view of an embodiment of an electronic apparatus.
Figure 3:
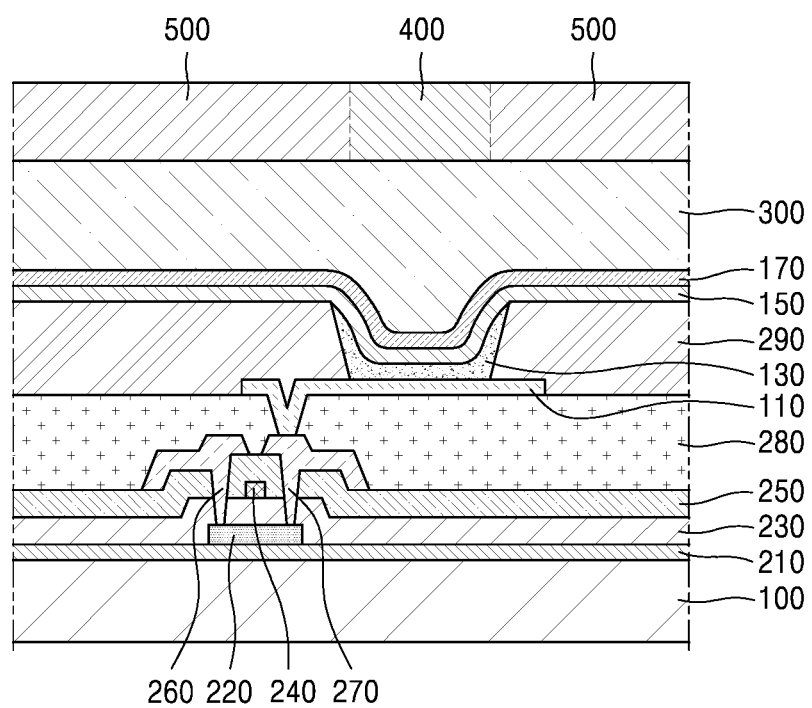
FIG. 3 is a schematic cross-sectional view of another embodiment of an electronic apparatus.

[Descriptions of FIGS. 2 and 3]

FIG. 2 is a schematic cross-sectional view of an embodiment of an electronic apparatus.

The electronic apparatus of FIG. 2 may include a substrate 100, a thin-film transistor, a light-emitting device, and an encapsulation unit 300 sealing the light-emitting device.

The substrate 100 may be a flexible substrate, a glass substrate, or a metal substrate. A buffer layer 210 may be on the substrate 100. The buffer layer 210 may prevent penetration of impurities through the substrate 100 and may provide a flat surface on the substrate 100.

A thin-film transistor may be on the buffer layer 210. The thin-film transistor may include an active layer 220, a gate electrode 240, a source electrode 260, and a drain electrode 270.

The active layer 220 may include an inorganic semiconductor such as silicon or polysilicon, an organic semiconductor, or an oxide semiconductor, and may include a source area, a drain area, and a channel area.

A gate insulating film 230 for insulating the active layer 220 and the gate electrode 240 may be on the active layer 220, and the gate electrode 240 may be on the gate insulating film 230.

An interlayer insulating film 250 may be on the gate electrode 240. The interlayer insulating film 250 may be between the gate electrode 240 and the source electrode 260 and between the gate electrode 240 and the drain electrode 270 to provide insulation therebetween.

The source electrode 260 and the drain electrode 270 may be on the interlayer insulating film 250. The interlayer insulating film 250 and the gate insulating film 230 may be formed to expose the source area and the drain area of the active layer 220, and the source electrode 260 and the drain electrode 270 may be adjacent to the exposed source area and the exposed drain area of the active layer 220. For example, the source electrode 260 and the drain electrode 270 may respectively contact the exposed source area and the exposed drain area of the active layer 220.

The thin-film transistor may be electrically connected to a light-emitting device to drive the light-emitting device and may be protected by a passivation layer 280. The passivation layer 280 may include an inorganic insulating film, an organic insulating film, or a combination thereof. A light-emitting device may be on the passivation layer 280. The light-emitting device may include a first electrode 110, an interlayer 130, and a second electrode 150.

The first electrode 110 may be on the passivation layer 280. The passivation layer 280 may not fully cover the drain electrode 270 and may expose an area of the drain electrode 270, and the first electrode 110 may be disposed to connect to the exposed area of the drain electrode 270. For example, the first electrode 110 may be electrically connected to the exposed area of the drain electrode 270.

A pixel-defining film 290 may be on the first electrode 110. The pixel-defining film 290 may expose an area of the first electrode 110, and the interlayer 130 may be formed in the exposed area of the first electrode 110. The pixel-defining film 290 may be a polyimide or polyacryl organic film. Although it is not shown in FIG. 2, one or more layers of the interlayer 130 may extend to the upper portion of the pixel-defining film 290 and may be provided in the form of a common layer.

The second electrode 150 may be on the interlayer 130, and a capping layer 170 may be additionally formed on the second electrode 150. The capping layer 170 may be formed to cover the second electrode 150.

The encapsulation unit 300 may be on the capping layer 170. The encapsulation unit 300 may be on a light-emitting device to protect the light-emitting device from moisture and/or oxygen. The encapsulation unit 300 may include an inorganic film including silicon nitride ($SiN_x$), silicon oxide ($SiO_x$), indium tin oxide, indium zinc oxide, or any combination thereof; an organic film including PET, polyethylene naphthalate, polycarbonate, polyimide, polyethylene sulfonate, polyoxy methylene, poly arylate, hexamethyl disiloxane, an acrylic resin (e.g., polymethyl methacrylate, polyacrylic acid, and the like), an epoxy resin (e.g., aliphatic glycidyl ether (AGE) and the like), or any combination thereof; or a combination of the inorganic film and the organic film.

FIG. 3 is a schematic cross-sectional view of another embodiment of an electronic apparatus.

The electronic apparatus shown in FIG. 3 may differ from the electronic apparatus shown in FIG. 2, at least in that a light-shielding pattern 500 and a functional area 400 are additionally located on the encapsulation unit 300. The functional area 400 may be a color filter area, a color-conversion area, or a combination of a color filter area and a color-conversion area. In embodiments, the light-emitting device shown in FIG. 3 included in the electronic apparatus may be a tandem light-emitting device.

[Manufacturing Method]

The layers constituting the hole transport region, the emission layer, and the layers constituting the electron transport region may be formed in a specific region by using one or more suitable methods such as vacuum deposition, spin coating, casting, Langmuir-Blodgett (LB) deposition, ink-jet printing, laser printing, and laser-induced thermal imaging.

When layers constituting the hole transport region, the emission layer, and layers constituting the electron transport region are each independently formed by spin coating, the spin coating may be performed at a coating rate of about 2,000 revolutions per minute (rpm) to about 5,000 rpm and at a heat treatment temperature of about 80° C. to 200° C., depending on the material to be included in each layer and the structure of each layer to be formed.

[Definitions of Terms]

The term "$C_3$-$C_{60}$ carbocyclic group" as used herein may be a cyclic group consisting only of carbon atoms as ring-forming atoms and having 3 to 60 carbon atoms. The term "$C_1$-$C_{60}$ heterocyclic group" as used herein may be a cyclic group having 1 to 60 carbon atoms in addition to a heteroatom other than carbon atoms, as ring-forming atoms. The $C_3$-$C_{60}$ carbocyclic group and the $C_1$-$C_{60}$ heterocyclic group may each be a monocyclic group consisting of one ring or a polycyclic group in which at least two rings are condensed. For example, the number of ring-forming atoms in the $C_1$-$C_{60}$ heterocyclic group may be in a range of 3 to 61.

The term "cyclic group" as used herein may include the $C_3$-$C_{60}$ carbocyclic group and the $C_1$-$C_{60}$ heterocyclic group.

The term "π electron-rich $C_3$-$C_{60}$ cyclic group" as used herein may be a cyclic group having 3 to 60 carbon atoms and may not include *—N=*' as a ring-forming moiety. The term "π electron-deficient nitrogen-containing $C_1$-$C_{60}$ cyclic group" as used herein may be a heterocyclic group having 1 to 60 carbon atoms and may include *—N=*' as a ring-forming moiety.

In embodiments, the $C_3$-$C_{60}$ carbocyclic group may be a T1 group or a group in which at least two T1 groups are condensed (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be a T2 group, a group in which at least two T2 groups are condensed, or a group in which at least one T2 group is condensed with at least one T1 group (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and the like), the π electron-rich $C_3$-$C_{60}$ cyclic group may be a T1 group, a condensed group in which at least two T1 groups are condensed, a T3 group, a condensed group in which at least two T3 groups are condensed, or a condensed group in which at least one T3 group is condensed with at least one T1 group (for example, a $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, and the like), and the π electron-deficient nitrogen-containing $C_1$-$C_{60}$ cyclic group may be a T4 group, a group in which at least two T4 groups are condensed, a group in which at least one T4 group is condensed with at least one T1 group, a group in which at least one T4 group is condensed with at least one T3 group, or a group in which at least one T4 group, at least one T1 group, and at least one T3 group are condensed (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and the like), wherein the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "cyclic group", "$C_3$-$C_{60}$ carbocyclic group", "$C_1$-$C_{60}$ heterocyclic group", "π electron-rich $C_3$-$C_{60}$ cyclic group", or "π electron-deficient nitrogen-containing $C_1$-$C_{60}$ cyclic group" as used herein may each be a group condensed with any suitable cyclic group, a monovalent group, or a polyvalent group (e.g., a divalent group, a trivalent group, a tetravalent group, or the like), according to a structure of the formula to which the term is applied. For example, a "benzene group" may be a benzene ring, a phenyl group, a phenylene group, or the like, and this may be understood by one of ordinary skill in the art, depending on the structure of the formula including the "benzene group".

In embodiments, examples of the monovalent $C_3$-$C_{60}$ carbocyclic group and monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and examples of the divalent $C_3$-$C_{60}$ carbocyclic group and the divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein may be a linear or branched aliphatic hydrocarbon monovalent group having 1 to 60 carbon atoms, and examples thereof may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an iso-nonyl group, a sec-nonyl group, a tert-nonyl group, an n-decyl group, an isodecyl group, a sec-decyl group, and a tert-decyl group. The term "$C_1$-$C_{60}$ alkylene group" as used herein may be a divalent group having a substantially same structure as the $C_1$-$C_{60}$ alkyl group.

The term "$C_2$-$C_{60}$ alkenyl group" as used herein may be a hydrocarbon group having at least one carbon-carbon double bond in the middle or at the terminus of the $C_2$-$C_{60}$ alkyl group. Examples thereof may include an ethenyl group, a propenyl group, and a butenyl group. The term "$C_2$-$C_{60}$ alkenylene group" as used herein may be a divalent group having a substantially same structure as the $C_2$-$C_{60}$ alkenyl group.

The term "$C_2$-$C_{60}$ alkynyl group" as used herein may be a monovalent hydrocarbon group having at least one carbon-carbon triple bond in the middle or at the terminus of the $C_2$-$C_{60}$ alkyl group. Examples thereof may include an ethynyl group and a propynyl group. The term "$C_2$-$C_{60}$ alkynylene group" as used herein may be a divalent group having a substantially same structure as the $C_2$-$C_{60}$ alkynyl group.

The term "$C_1$-$C_{60}$ alkoxy group" as used herein may be a monovalent group represented by —O($A_{101}$) (wherein $A_{101}$ is a $C_1$-$C_{60}$ alkyl group). Examples thereof may include a methoxy group, an ethoxy group, and an isopropyloxy group.

The term "$C_3$-$C_{10}$ cycloalkyl group" as used herein may be a monovalent saturated hydrocarbon monocyclic group including 3 to 10 carbon atoms. Examples of the $C_3$-$C_{10}$ cycloalkyl group as used herein may include a cyclopropyl group, a cyclobutyl group, a cyclopentyl group, a cyclohexyl group, a cycloheptyl group, a cyclooctyl group, an adamantanyl group, a norbornanyl (bicyclo[2.2.1]heptyl) group, a bicyclo[1.1.1]pentyl group, a bicyclo[2.1.1]hexyl group, or a bicyclo[2.2.2]octyl group. The term "$C_3$-$C_{10}$ cycloalkylene group" as used herein may be a divalent group having a substantially same structure as the $C_3$-$C_{10}$ cycloalkyl group.

The term "$C_1$-$C_{10}$ heterocycloalkyl group" as used herein may be a monovalent cyclic group including at least one heteroatom other than carbon atoms as a ring-forming atom and having 1 to 10 carbon atoms. Examples thereof may include a 1,2,3,4-oxatriazolidinyl group, a tetrahydrofuranyl group, and a tetrahydrothiophenyl group. The term "$C_1$-$C_{10}$ heterocycloalkylene group" as used herein may be a divalent group having a substantially same structure as the $C_1$-$C_{10}$ heterocycloalkyl group.

The term "$C_3$-$C_{10}$ cycloalkenyl group" as used herein may be a monovalent cyclic group that has 3 to 10 carbon atoms and at least one carbon-carbon double bond in its ring, and is not aromatic. Examples thereof may include a cyclopentenyl group, a cyclohexenyl group, and a cycloheptenyl group. The term "$C_3$-$C_{10}$ cycloalkenylene group" as used herein may be a divalent group having a substantially same structure as the $C_3$-$C_{10}$ cycloalkenyl group.

The term "$C_1$-$C_{10}$ heterocycloalkenyl group" as used herein may be a monovalent cyclic group including at least one heteroatom other than carbon atoms as a ring-forming atom, 1 to 10 carbon atoms, and at least one double bond in its ring. Examples of the $C_1$-$C_{10}$ heterocycloalkenyl group may include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkylene group" as used herein may be a divalent group having a substantially same structure as the $C_1$-$C_{10}$ heterocycloalkenyl group.

The term "$C_6$-$C_{60}$ aryl group" as used herein may be a monovalent group having a carbocyclic aromatic system having 6 to 60 carbon atoms. The term "$C_6$-$C_{60}$ arylene group" as used herein may be a divalent group having a carbocyclic aromatic system having 6 to 60 carbon atoms. Examples of the $C_6$-$C_{60}$ aryl group may include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each independently include two or more rings, the respective rings may be fused with each other.

The term "$C_1$-$C_{60}$ heteroaryl group" as used herein may be a monovalent group having a heterocyclic aromatic system further including at least one heteroatom other than carbon atoms as a ring-forming atom and 1 to 60 carbon atoms. The term "$C_1$-$C_{60}$ heteroarylene group" as used herein may be a divalent group having a heterocyclic aromatic system further including at least one heteroatom other than carbon atoms as a ring-forming atom and 1 to 60 carbon atoms. Examples of the $C_1$-$C_{60}$ heteroaryl group may include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each independently include two or more rings, the respective rings may be fused with each other.

The term "monovalent non-aromatic condensed polycyclic group" as used herein may be a monovalent group that has two or more condensed rings and only carbon atoms (e.g., 8 to 60 carbon atoms) as ring forming atoms, wherein the molecular structure when considered as a whole is non-aromatic. Examples of the monovalent non-aromatic condensed polycyclic group may include an indenyl group, a fluorenyl group, a spiro-bifluorenyl group, a benzofluorenyl group, an indenophenanthrenyl group, and an indenoanthracenyl group. The term "divalent non-aromatic condensed polycyclic group" as used herein may be a divalent group having a substantially same structure as the monovalent non-aromatic condensed polycyclic group.

The term "monovalent non-aromatic condensed heteropolycyclic group" as used herein may be a monovalent group that has two or more condensed rings and at least one heteroatom other than carbon atoms (e.g., 1 to 60 carbon atoms), as a ring-forming atom, wherein the molecular structure when considered as a whole is non-aromatic. Examples of the monovalent non-aromatic condensed heteropolycyclic group may include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzooxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group" as used herein may be a divalent group having a substantially same structure as the monovalent non-aromatic condensed heteropolycyclic group.

The term "$C_6$-$C_{60}$ aryloxy group" as used herein may be a group represented by —O($A_{102}$) (where $A_{102}$ is a $C_6$-$C_{60}$ aryl group). The term "$C_6$-$C_{60}$ arylthio group" as used herein may be a group represented by —S($A_{103}$) (where $A_{103}$ is a $C_6$-$C_{60}$ aryl group).

The term "$C_7$-$C_{60}$ aryl alkyl group" as used herein may be a group represented by -($A_{104}$)($A_{105}$) (wherein $A_{104}$ is a $C_1$-$C_{54}$ alkylene group, and $A_{105}$ is a $C_6$-$C_{59}$ aryl group). The term "$C_2$-$C_{60}$ heteroaryl alkyl group" as used herein may be a group represented by -($A_{106}$)($A_{107}$) (wherein $A_{106}$ is a $C_1$-$C_{59}$ alkylene group, and $A_{107}$ is a $C_1$-$C_{59}$ heteroaryl group).

The term "$R_{10a}$" as used herein may be:
deuterium (-D), —F, —Cl, —Br, —I, a hydroxyl group, a cyano group, or a nitro group;
a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;
a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or
—Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

$Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ aryl alkyl group; or a $C_2$-$C_{60}$ heteroaryl alkyl group.

The term "heteroatom" as used herein may be any atom other than a carbon atom or a hydrogen atom. Examples of the heteroatom may include O, S, N, P, Si, B, Ge, Se, or any combination thereof.

The term "third-row transition metal" as used herein may include hafnium (Hf), tantalum (Ta), tungsten (W), rhenium (Re), osmium (Os), iridium (Ir), platinum (Pt), or gold (Au).

The term "Ph" as used herein represents a phenyl group, the term "Me" as used herein represents a methyl group, the term "Et" as used herein represents an ethyl group, the terms "ter-Bu" or "Bu$^t$" as used herein represents a tert-butyl group, and the term "OMe" as used herein represents a methoxy group.

The term "biphenyl group" as used herein may be a phenyl group substituted with a phenyl group. The "biphenyl group" may be a "substituted phenyl group" having a "$C_6$-$C_{60}$ aryl group" as a substituent.

The term "terphenyl group" as used herein may be a phenyl group substituted with a biphenyl group. The "terphenyl group" may be a "substituted phenyl group" having a "$C_6$-$C_{60}$ aryl group substituted with a $C_6$-$C_{60}$ aryl group" as a substituent.

The number of maximum carbon atoms in the definitions should be understood merely as examples. For example, the number of maximum carbon atoms in a $C_1$-$C_{60}$ alkyl group of 60 may be understood as an example, and may also be applied to a $C_1$-$C_{20}$ alkyl group. A similar understanding may also be applied to other cases.

The symbols * and *' as used herein, unless defined otherwise, each refer to a binding site to an adjacent atom in a corresponding formula.

Hereinafter, a light-emitting device and a compound according to embodiments will be described in detail with reference to the Examples.

EXAMPLES

Hansen Parameter Values

Hansen parameter values of Compound 1 as a first solvent, Compounds 21 to 100 each as a second solvent, a mixed solvent of Compound 31 and a third solvent of Compound 31, and a phosphine oxide-based charge transporting organic material are shown in Table 1.

TABLE 1

| Compound | dP(MPa$^{0.5}$) | dH(MPa$^{0.5}$) |
|---|---|---|
| 31 | 16.4 | 10.2 |
| 1 & 21 & 31 (volumetric ratio of 6.4:1.6:2) | 11.2 | 20.1 |
| 1 & 100 & 31 (volumetric ratio of 6.4:1.6:2) | 11.5 | 20.7 |
| 101 | 14.0 | 7.3 |
| 102 | 13.4 | 9.0 |
| 103 | 13.3 | 7.9 |
| 104 | 15.2 | 9.9 |
| 105 | 14.7 | 5.9 |
| 106 | 9.1 | 6.2 |
| 107 | 14.2 | 8.5 |

TABLE 1-continued

| Compound | dP(MPa$^{0.5}$) | dH(MPa$^{0.5}$) |
|---|---|---|

[Compound 1]
HO⁀⁀OH

[Compound 100]
HO⁀⁀O⁀⁀⁀⁀

[Compound 21]
(di-tert-butyl ether structure)

[Compound 31]
$H_3C$—S(=O)—$CH_3$

Physical Properties of Solvents

The viscosity and surface tension of a mixed solvent including the first solvent compound {1}, the second solvent compound {2}, and the third solvent compound {3}, the first solvent compound {1}, and the second solvent compound {2} are shown in Table 2.

TABLE 2

| Mixed solvent | Mixed ratio | Viscosity (cP) (at room temperature) | Surface tension (dyn/cm) |
|---|---|---|---|
| 1 | 1{1}&21{2}&31{3} (volumetric ratio of 6.4:1.6:2) | 6.2 | 32.3 |
| 2 | 1{1}&21{2}&31{3} (volumetric ratio of 7.2:1.8:1) | 10.3 | 31.9 |
| 3 | 1{1}&21{2} (volumetric ratio of 8:2) | 14.5 | 30.2 |
| 4 | 1{1}&100{2}&31{3} (volumetric ratio of 6.4:1.6:2) | 12.7 | 30.1 |

The results shown in Table 2 show that the viscosity of the mixed solvent 1 is lower than the viscosity of the mixed solvent 2 or 3.

Preparation of Ink Composition

Ink Composition for Electron Transport Layer

By using the mixed solvent shown in Table 2, an ink composition for an electron transport layer was prepared according to the composition shown in Table 3.

TABLE 3

| Ink composition | Solute | Mixed solvent | Solid content[1] |
|---|---|---|---|
| ETL-1 | Compound 101 | 1 | 1 wt % |
| ETL-2 | Compound 101 | 2 | 1 wt % |
| ETL-3 | Compound 101 | 3 | 1 wt % |
| ETL-4 | Compound 101 | 4 | 1 wt % |

[1]percent by weight of a solute based on 100 parts of the total ink composition

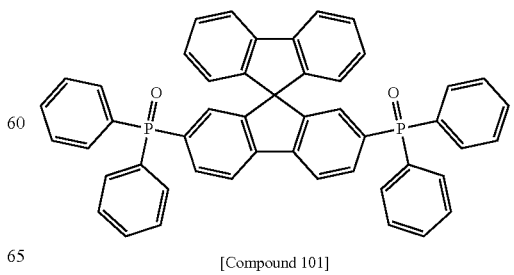

[Compound 101]

[Manufacture of Light-Emitting Device]

Reference

An ITO glass substrate (50 mm×50 mm and 15 Ohms per square centimeter (Ω/cm²)), an OLED glass (available from Samsung-Corning) substrate, was sequentially sonicated using distilled water and isopropyl alcohol, and cleaned by exposure to ultraviolet rays with ozone for 30 minutes.

After the washing, PEDOT:PSS were spin-coated on the transparent electrode line-attached glass substrate to form a film having a thickness of 60 nm, followed by baking at a temperature of 200° C. for 30 minutes, to form a hole injection layer.

TFB was spin-coated on the hole injection layer to form a film having a thickness of 20 nm, followed by baking at a temperature of 240° C. for 10 minutes, to form a hole transport layer.

An emission layer composition was spin-coated on the hole transport layer to form a film having a thickness of 30 nm, followed by baking at a temperature of 140° C. for 10 minutes to form an emission layer [host: Compound 201 dopant: Compound 301 (2 wt % based on the weight of the host].

Compound 101 was deposited on the emission layer to form an electron transport layer having a thickness of 20 nm.

Aluminum (Al) was deposited on the electron transport layer to form a cathode having a thickness of about 100 nm, thereby completing the manufacture of an organic light-emitting device.

Deposition equipment (Sunicel plus 200) manufactured by Sunic System Co., Ltd. was used for the deposition.

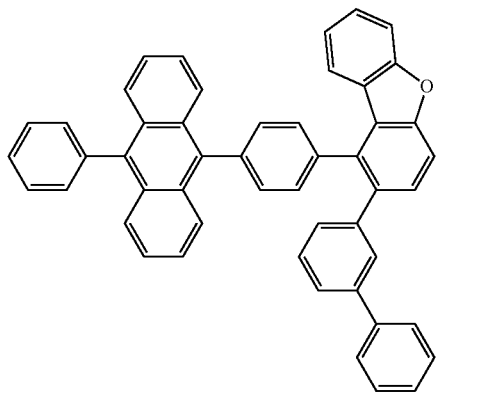

201

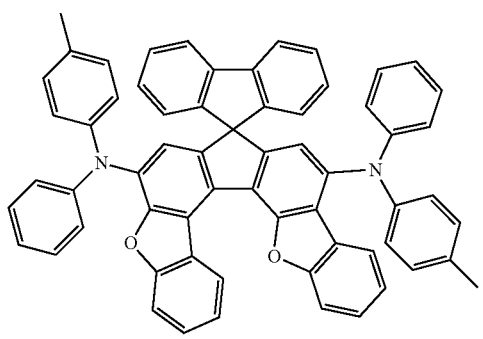

301

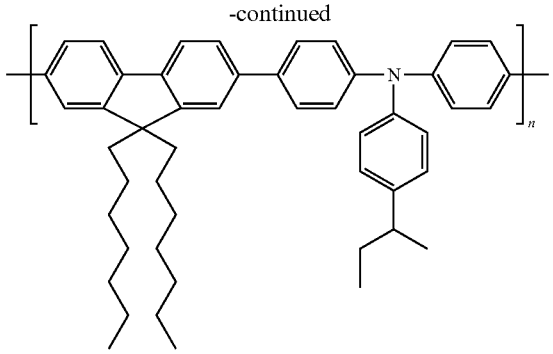

[TFB(n: 100 ~ 100,000)]

Example 1

A light-emitting device was manufactured in the same manner as in the Reference, except that Ink composition ETL-1 in Table 2 was spin-coated on the emission layer to form an electron transport layer having a thickness of 20 nm.

Example 2

A light-emitting device was manufactured in the same manner as in the Reference, except that Ink composition ETL-2 in Table 2 was spin-coated on the emission layer to form an electron transport layer having a thickness of 20 nm.

Comparative Example 1

A light-emitting device was manufactured in the same manner as in the Reference, except that Ink composition ETL-3 in Table 2 was spin-coated on the emission layer to form an electron transport layer having a thickness of 20 nm.

Comparative Example 2

A light-emitting device was manufactured in the same manner as in the Reference, except that Ink composition ETL-4 in Table 2 was spin-coated on the emission layer to form an electron transport layer having a thickness of 20 nm.

The driving voltage, efficiency, and color-coordinate of the organic light-emitting devices manufactured in Examples 1 and 2 and Comparative Examples 1 and 2 were evaluated as follows. The results thereof are shown in Table 4.

The color-coordinate was measured using a luminance meter PR650 powered by a current voltmeter (Keithley SMU 236).

The luminance was measured using a luminance meter PR650 powered by a current voltmeter (Keithley SMU 236).

The efficiency was measured using a luminance meter PR650 powered by a current voltmeter (Keithley SMU 236).

TABLE 4

| | Driving voltage [V] | Efficiency [cd/A] | Color coordinate | |
|---|---|---|---|---|
| | | | CIEx | CIEy |
| Reference | 5.7 | 3.5 | 0.132 | 0.058 |
| Example 1 | 4.8 | 3.3 | 0.139 | 0.044 |

TABLE 4-continued

|  | Driving voltage [V] | Efficiency [cd/A] | Color coordinate | |
| --- | --- | --- | --- | --- |
|  |  |  | CIEx | CIEy |
| Example 2 | 5.0 | 3.6 | 0.139 | 0.046 |
| Comparative Example 1 | 4.9 | 3.5 | 0.139 | 0.045 |
| Comparative Example 2 | 5.2 | 3.8 | 0.139 | 0.045 |

Referring to the results of Table 4, the light-emitting devices of Examples 1 and 2 and Comparative Examples 1 and 2 were found to exhibit similar results as the Reference. Thus, the mixed solvents 1 to 4 were found to have an equal level of solvent resistance as to EML materials.

As apparent from the foregoing description, when the ink composition according to embodiments is used, for example, when the ink composition is used in forming an electron transport layer, the viscosity may be low, and probability of occurrence of troubles during a process may be significantly reduced.

The ink composition for a light-emitting device according to embodiments may have a low viscosity, thus facilitating a solution process. The probability of occurrence of troubles while jetting during an inkjet process may be significantly reduced.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the claims.

What is claimed is:
1. An ink composition for a light-emitting device, comprising:
    a phosphine oxide-based charge transporting organic material;
    a first solvent represented by Formula 1;
    a second solvent represented by Formula 2; and
    a third solvent that is polar aprotic, wherein
    the phosphine oxide-based charge transporting organic material comprises one of Compounds 101 to 107:

[Compound 101]

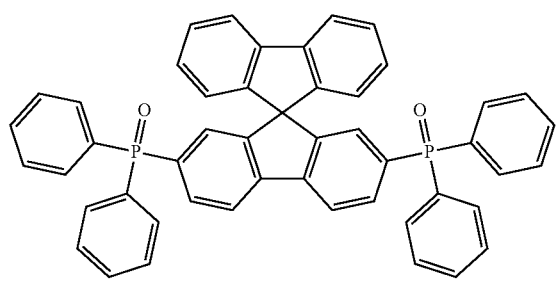

[Compound 102]

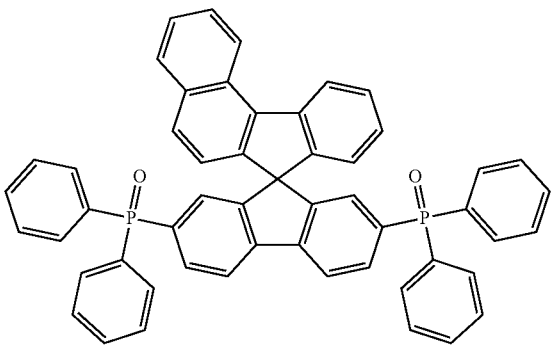

[Compound 103]

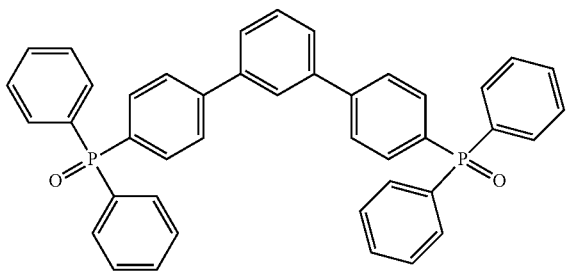

[Compound 104]

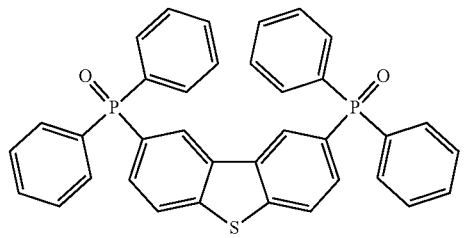

[Compound 105]

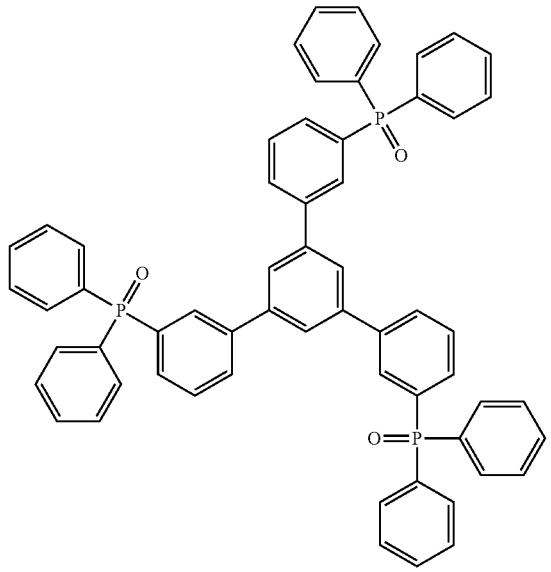

-continued

[Compound 106]

[Compound 107]

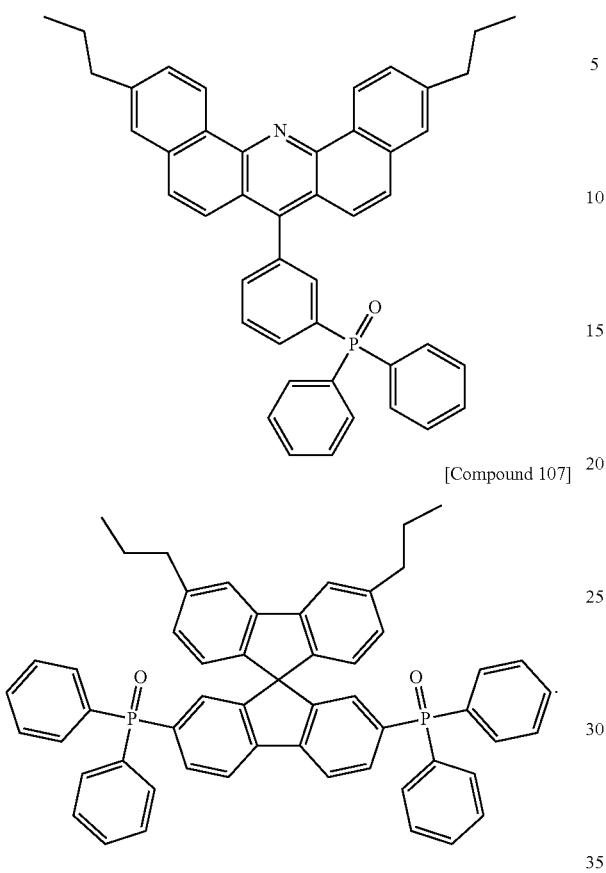

HOR$_1$(O)$_m$R$_2$OH      [Formula 1]

wherein in Formula 1,
R$_1$ and R$_2$ are each independently a C$_1$-C$_{60}$ alkylene group or a C$_3$-C$_{10}$ cycloalkylene group, and
m is 0 or 1, R$_{11}$OR$_{12}$      [Formula 2]

wherein in Formula 2,
R$_{11}$ and R$_{12}$ are each independently a C$_1$-C$_{60}$ alkyl group or a C$_3$-C$_{10}$ cycloalkyl group.

2. The ink composition of claim 1, wherein the phosphine oxide-based charge transporting organic material is an electron transporting organic material.

3. The ink composition of claim 1, wherein the third solvent is a compound comprising a *—SO—*' moiety, a *—SOO—*' moiety, a *—CH=N—*' moiety, a *—COO—*' moiety, or a *—CN moiety, and
\* and *' each indicate a binding site to an adjacent atom.

4. The ink composition of claim 1, wherein
a dP value of a Hansen parameter of a mixed solvent of the first solvent, the second solvent, and the third solvent is equal to or greater than about 9, and
a dH value of a Hansen parameter of the mixed solvent is equal to or greater than about 9.

5. The ink composition of claim 1, wherein a dP value of a Hansen parameter of the third solvent is equal to or greater than about 12.

6. The ink composition of claim 1, wherein a viscosity of a mixed solvent of the first solvent, the second solvent, and the third solvent at room temperature is equal to or less than about 11 centipoise (cP).

7. The ink composition of claim 1, wherein a surface tension of a mixed solvent of the first solvent, the second solvent, and the third solvent is in a range of about 31 dyn/cm to about 38 dyn/cm.

8. The ink composition of claim 1, wherein a dP value of a Hansen parameter of the phosphine oxide-based charge transporting organic material is equal to or greater than about 9.

9. The ink composition of claim 1, wherein a dH value of a Hansen parameter of the phosphine oxide-based charge transporting organic material is equal to or greater than about 5.

10. The ink composition of claim 1, wherein the first solvent represented by Formula 1 comprises one of Compounds 1 to 4:

[Compound 1]

HO⏜OH

[Compound 2]

OH
 |
 ⏜OH

[Compound 3]

HO⏜O⏜OH

[Compound 4]

OH
 |
 ⏜O⏜OH.

11. The ink composition of claim 1, wherein the second solvent represented by Formula 2 comprises one of Compounds 21 to 24:

[Compound 21]

[Compound 22]

[Compound 23]

[Compound 24]

12. The ink composition of claim 1, wherein the third solvent is represented by Formulae 3-1, 3-2, 3-3, or 3-4:

[Formula 3-1]

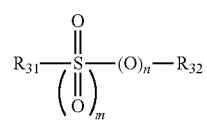

[Formula 3-2]

R$_{33}$—CN

-continued

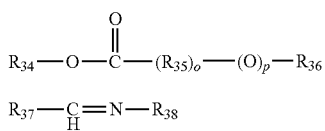
[Formula 3-3]

$R_{37}-\underset{H}{C}=N-R_{38}$ [Formula 3-4]

wherein in Formulae 3-1 to 3-4,
$R_{31}$ to $R_{38}$ are each independently a $C_1$-$C_{60}$ alkyl group, a $C_1$-$C_{60}$ alkylene group, a $C_3$-$C_{10}$ cycloalkyl group, or a $C_3$-$C_{10}$ cycloalkylene group,
m is 0 or 1,
n, o, and p are each independently an integer from 0 to 5,
$R_{31}$ and $R_{32}$ are optionally bound to form a ring,
$R_{34}$ and $R_{36}$ are optionally bound to form a ring, and
$R_{37}$ and $R_{38}$ are optionally bound to form a ring.

13. The ink composition of claim 1, wherein the third solvent comprises:
$CH_3CN$; and
one of Compounds 31 to 36:

[Compound 31]

H₃C—S(=O)—CH₃

[Compound 32]

(cyclic sulfone)

[Compound 33]

(pyridazine)

[Compound 34]

(caprolactone)

[Compound 35]

(propylene carbonate with CH₃)

[Compound 36]

(1,4-dioxan-2-one)

14. A light-emitting device comprising:
a first electrode;
a second electrode facing the first electrode; and
an interlayer between the first electrode and the second electrode, wherein
the interlayer comprises:
an emission layer; and
a layer prepared by a preparation method using an ink composition,
the ink composition comprises:
a phosphine oxide-based charge transporting organic material;
a first solvent represented by Formula 1;
a second solvent represented by Formula 2; and
a third solvent that is polar aprotic, and
the phosphine oxide-based charge transporting organic material comprises one of Compounds 101 to 107:

[Compound 101]
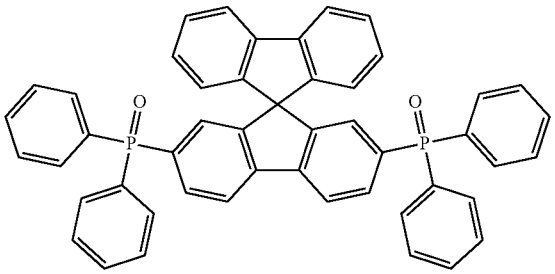

[Compound 102]
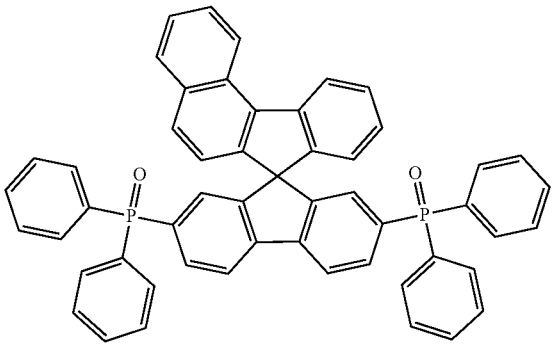

[Compound 103]
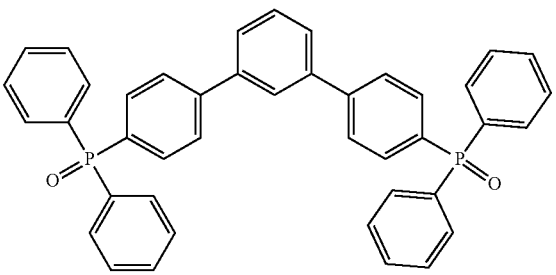

[Compound 104]
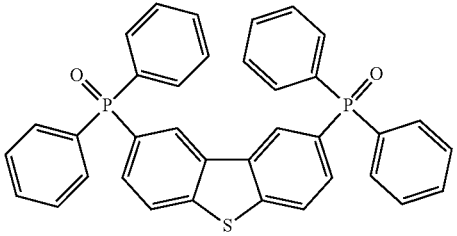

[Compound 105]

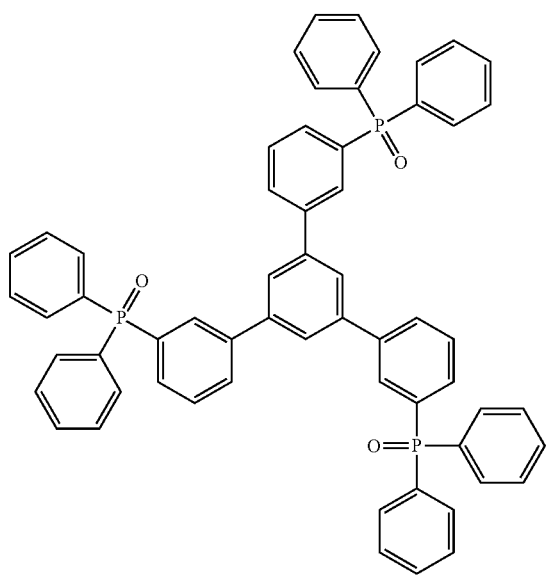

[Compound 106]

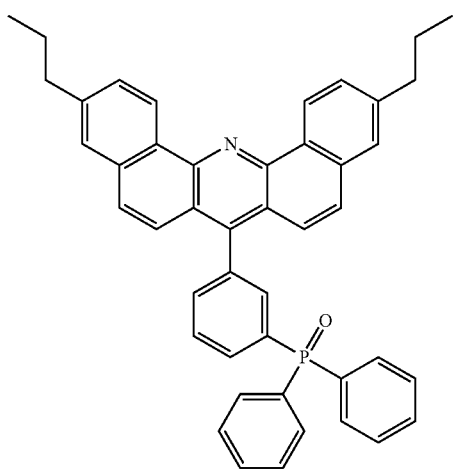

[Compound 107]

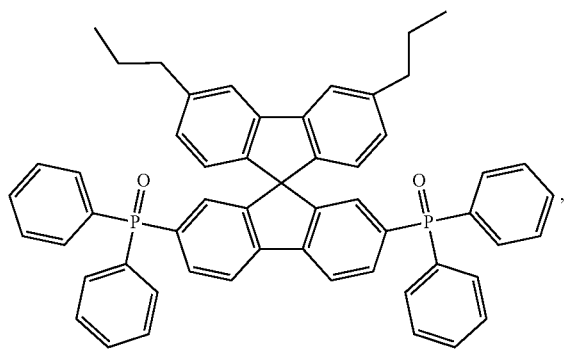

$$HOR_1(O)_mR_2OH \qquad \text{[Formula 1]}$$

wherein in Formula 1, $R_1$ and $R_2$ are each independently a $C_1$-$C_{60}$ alkylene group or a $C_3$-$C_{10}$ cycloalkylene group, and m is 0 or 1, $$R_{11}OR_{12} \qquad \text{[Formula 2]}$$

wherein in Formula 2, $R_{11}$ and $R_{12}$ are each independently a $C_1$-$C_{60}$ alkyl group or a $C_3$-$C_{10}$ cycloalkyl group.

15. The light-emitting device of claim 14, wherein the layer prepared by a preparation method using an ink composition is an electron transport layer.

16. The light-emitting device of claim 14, wherein the preparation method is an inkjet method.

17. The light-emitting device of claim 14, wherein the emission layer and the layer contact each other.

18. An electronic apparatus comprising the light-emitting device of claim 14.

* * * * *